United States Patent
Saito et al.

(10) Patent No.: US 6,908,847 B2
(45) Date of Patent: Jun. 21, 2005

(54) METHOD OF MANUFACTURING A SEMICONDUCTOR DEVICE HAVING AN INTERCONNECT EMBEDDED IN AN INSULATING FILM

(75) Inventors: Tatsuyuki Saito, Ome (JP); Naofumi Ohashi, Tsukuba (JP); Toshinori Imai, Ome (JP); Junji Noguchi, Hamura (JP); Tsuyoshi Tamaru, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/329,831

(22) Filed: Dec. 27, 2002

(65) Prior Publication Data

US 2003/0109129 A1 Jun. 12, 2003

Related U.S. Application Data

(63) Continuation of application No. 10/294,937, filed on Nov. 15, 2002.

(30) Foreign Application Priority Data

Nov. 15, 2001 (JP) ........................................ 2001-349875

(51) Int. Cl.⁷ ......................................... H01L 21/4763
(52) U.S. Cl. ........................ 438/627; 438/622; 438/633; 438/643; 438/653; 438/685; 438/687
(58) Field of Search ........................ 438/618, 622–624, 438/627–629, 637–640, 631, 633, 643–945, 653–654, 685, 688

(56) References Cited

U.S. PATENT DOCUMENTS

| | | | | |
|---|---|---|---|---|
| 5,674,787 A | * | 10/1997 | Zhao et al. | 438/627 |
| 6,114,243 A | * | 9/2000 | Gupta et al. | 438/687 |
| 6,147,402 A | | 11/2000 | Joshi et al. | |
| 6,194,304 B1 | * | 2/2001 | Morozumi et al. | 438/618 |
| 6,380,084 B1 | * | 4/2002 | Lim et al. | 438/687 |
| 6,492,734 B2 | * | 12/2002 | Watanabe | 257/758 |
| 6,531,780 B1 | * | 3/2003 | Woo et al. | 257/758 |

* cited by examiner

Primary Examiner—Thanh Nguyen
(74) Attorney, Agent, or Firm—Antonelli, Terry, Stout & Kraus, LLP

(57) ABSTRACT

A semiconductor device has first interlayer insulating film having a wiring trench; a wiring portion having a first barrier metal layer formed over side walls and bottom surface of the wiring trench, a first conductor layer formed over the first barrier metal layer to embed the wiring trench, and a capping barrier metal film formed over the first conductor layer; second interlayer insulating film formed over the first interlayer insulating film and having a connecting hole; and a connecting portion having a second barrier metal layer formed over side walls and bottom surface of the connecting hole, and a second conductor layer formed over the second barrier metal layer to embed the connecting hole; wherein, at a joint between the connecting portion and wiring portion, at least one of the second barrier metal layer and capping barrier metal film on the bottom surface of the connecting hole is removed.

17 Claims, 33 Drawing Sheets

METHOD OF MANUFACTURING A SEMICONDUCTOR DEVICE HAVING AN INTERCONNECT EMBEDDED IN AN INSULATING FILM

This is a continuation of application Ser. No. 10/294,937, filed Nov. 15, 2002, the entire disclosure of which is hereby incorporated by reference.

BACKGROUND OF THE INVENTION

The present invention relates in general to semiconductor integrated circuit devices; and, more particularly, the invention relates to a technique that is effective when applied to a connecting portion between interconnects in a semiconductor integrated circuit device.

In recent years, in view of the tendency toward miniaturization and multi-layering of the interconnects of semiconductor integrated circuit devices (semiconductor devices), studies have been made of the so-called damascene technique for forming a trench in an insulating film and embedding it with a conductive film, thereby forming an interconnect.

This damascene technology can be roughly divided into the single damascene technique and the dual damascene technique. In the former one, a wiring trench and a trench for connecting interconnects are embedded in different steps, while in the latter one, a wiring trench and a connecting trench are embedded simultaneously.

As a conductive film to be filled in such a trench, a copper film or the like is employed. Inside of this trench, a conductive film having barrier properties is formed in order (1) to prevent diffusion, in an insulating film, of a metal constituting the conductive film to be embedded (the metal is copper when the conductive film is a copper film), or (2) when an insulating film is composed of an oxide, such as silicon oxide film, to prevent oxidation of the conductive film, which will otherwise occur owing to the contact between the silicon oxide film and the conductive film.

Over the conductive film (for example, copper film) to be embedded in the trench, an insulating film having barrier properties, such as a silicon nitride film, is formed to prevent diffusion of the metal into the insulating film to be formed over the conductive film or to prevent oxidation thereof by the insulating film.

SUMMARY OF THE INVENTION

The silicon nitride film however has a high dielectric constant so that the RC time constant of the interconnect becomes large, thereby disturbing the high-speed operation of the device.

Diffusion (transfer) of the metal constituting the conductive film causes electromigration. As a result of an investigation of the diffusibility of copper, the activation energy of diffusion is presumed to be greater (copper diffuses with more difficulty) on a copper-barrier film interface than on a copper-silicon nitride film interface. Accordingly, the electromigration lifetime is limited by the activation energy of the copper diffusion on a copper-silicon nitride film interface.

If voids are caused by electromigration on the bottom surface of a connecting portion between interconnects, a contact area between the connecting portion and the underlying interconnect becomes small, leading to accelerated lowering the interconnect lifetime.

The present inventors have investigated the formation, over the interconnect, of a conductive film, such as a tungsten (W) film having barrier properties.

For example, a technique of forming a cap (WCAP) composed of W over an interconnect made of an Al—Cu alloy (AlnCuy ALLOY) is disclosed in U.S. Pat. No. 6,147,402.

U.S. Pat. No. 6,114,243 discloses a technique of forming, in a so-called damascene structure, a conductive capping layer (26) over a copper layer (24), forming thereover a via or dual damascene opening (35), and then forming a barrier layer (36) and a copper layer (38). The numerals in parentheses identify those elements as described in the patent.

Formation of a conductive film (which will hereinafter be called a "capping barrier metal layer"), such as a tungsten (W) film, having barrier properties over the interconnect, however, leads to a structure in which a metal film constituting the interconnect, a capping barrier metal layer, a barrier metal layer and a metal layer constituting a connecting portion are stacked in this order between the interconnect and the connecting portion. The contact resistance between these films inevitably increases in such a structure.

When transfer of metal atoms due to electromigration occurs in such a structure, the existence of the capping barrier metal layer and barrier metal layer between the connecting portion and the interconnect disturbs the transfer of the metal between the connecting portion and the interconnect.

As a result, the frequency of generation of voids increases and a potential causing disconnection heightens. In addition to disconnection due to electromigration, a similar disconnection presumably occurs due to stress-induced peeling between a barrier metal and copper on the interface or stress-induced void formation, that is, stress migration.

An object of the present invention is to reduce the contact resistance between the interconnect and connecting portion.

Another object of the present invention is to improve the reliability, more specifically, to reduce the frequency of generation of voids or disconnection due to electromigration or to reduce the frequency of generation of disconnection due to stress migration.

A further object of the present invention is to improve the characteristics of a semiconductor device.

The above-described objects and novel features of the present invention will be apparent from the following description herein and the accompanying drawings.

The typical features of the invention, among the aspects of the inventions disclosed by the present application, will be outlined briefly.

(1) A semiconductor device according to the present invention comprises: a first interlayer insulating film formed over a semiconductor substrate and having a wiring trench; a wiring portion which has a first barrier metal layer formed over the side walls and bottom surface of the wiring trench, a first conductor layer formed over the first barrier metal layer so as to embed the wiring trench with the first conductor layer, and a capping barrier metal film formed over the surface of the first conductor layer; a second interlayer insulating film formed over the first interlayer insulating film and having a connecting hole; and a connecting portion which has a second barrier metal layer formed over the side walls and bottom surface of the connecting hole, and a second conductor layer formed over the second barrier metal layer so as to embed the connecting hole with the second conductor layer; wherein at a joint between the connecting portion and the wiring portion, at least either one of the second barrier metal layer or the capping barrier metal film on the bottom surface of the connecting hole is removed.

(2-1) A manufacturing method of a semiconductor device according to the present invention comprises: forming a first interlayer insulating film over a semiconductor substrate; forming a wiring trench in the first interlayer insulating film; forming a first barrier metal layer over the side walls and bottom surface of the wiring trench; forming a first conductor layer over the first barrier metal layer so as to embed the wiring trench with the first conductor layer; forming a capping barrier metal film over the surface of the first conductor layer; forming a second interlayer insulating film over the first interlayer insulating film; forming a connecting hole in the second interlayer insulating film; forming a second barrier metal layer over the side walls and bottom surface of the connecting hole; and forming a second conductor layer over the second barrier metal layer so as to embed the connecting hole with the second conductor layer; wherein the capping barrier metal film is removed only from the overlapping portion of the connecting hole with the wiring trench in the step of forming the connecting hole.

(2-2) The manufacturing method of a semiconductor device as described above in (2-1), wherein at the overlapping portion of the wiring trench and the connecting hole, the wiring trench is formed greater in area than the connecting hole.

(2-3) The manufacturing method of a semiconductor device as described above in (2-1), which further comprises, prior to the formation of the second conductor layer, removing the second barrier metal layer from the bottom surface of the connecting hole.

(2-4) The manufacturing method of a semiconductor device as described above in (2-1), wherein the barrier metal layer is formed from a single layer film of any one of Ta, TaN, TaSiN, W, WN, WSiN, Ti, TiN and TiSiN; or a laminate film obtained by stacking a plurality of any two or greater of Ta, TaN, TaSiN, W, WN, WSiN, Ti, TiN and TiSiN.

(2-5) The manufacturing method of a semiconductor device as described above in (2-1), wherein the capping barrier metal film is formed from a metal layer composed mainly of W, WN, WsiN and W, a metal layer composed mainly of CoWP, CoWB or Co, a single layer film of any one of TiN, TiSiN, Ta, TaN and TaSiN, or a laminate film obtained by stacking any two of the metal layers and single layer films.

(2-6) The manufacturing method of a semiconductor device as described above in (2-1), wherein the conductor layer is formed from any one of Cu, a metal layer composed mainly of Cu, Al, a metal layer composed mainly of Al, Ag and a metal layer composed mainly of Ag.

(3) A semiconductor device according to the present invention comprises a first wiring structure and a second wiring structure, the first wiring structure having a first wiring portion and a first connecting portion formed thereover; the first wiring portion having a first conductor layer, a first barrier metal layer formed over the side walls and bottom surface of the first conductor layer so as to surround the first conductor layer, and a first capping barrier metal film formed over the surface of the first conductor layer; and the first connecting portion being formed over the first wiring portion and having a second conductor layer, and a second barrier metal layer formed over the side surfaces and the bottom surface of the second conductor layer so as to surround the second conductor layer; and the second wiring structure being formed over the first wiring structure and having a second wiring portion and a second connecting portion formed thereover; the second wiring portion having a third conductor layer, a third barrier metal layer formed over the side walls and bottom surface of the third conductor layer so as to surround the third conductor layer, and a second capping barrier metal film formed over the surface of the third conductor layer; and the second connecting portion being formed over the second wiring portion and having a fourth conductor layer and a fourth barrier metal layer formed over the side surfaces and the bottom surface of the fourth conductor layer so as to surround the fourth conductor layer; wherein: the first and second barrier metal layers and the first capping barrier metal film are different in structure from the third and fourth barrier metal layers and the second capping barrier metal film, respectively.

(4) A semiconductor device according to the present invention comprises: a first insulating film formed over a semiconductor substrate; a second insulating film formed over the first insulating film; a wiring trench formed by selectively removing the first insulating film and the second insulating film; a wiring portion having a first barrier metal layer formed over the side walls and bottom surface of the wiring trench, a first conductor layer formed over the first barrier metal layer so as to embed the wiring trench, and a capping barrier metal film formed over the surface of the first conductor layer; a third insulating film formed over the second insulating film and having a connecting hole; and a connecting portion having a second barrier metal layer formed over at least the side walls, of the side walls and the bottom surface, of the connecting hole, and a second conductor layer formed over the second barrier metal layer so as to embed the connecting hole; wherein the second insulating film has a function as a barrier insulating film.

(5-1) A manufacturing method of a semiconductor device according to the present invention comprises: forming a first insulating film over a semiconductor substrate; forming a second insulating film over the first insulating film; forming a wiring trench by selectively removing the first insulating film and the second insulating film; forming a first barrier metal layer over the side walls and bottom surface of the wiring trench; forming a first conductor layer over the first barrier metal layer so as to embed it in the wiring trench; forming a capping barrier metal film over the surface of the first conductor layer; forming a third insulating film over the second insulating film; forming a connecting hole in the third insulating film; forming a second barrier metal layer over at least the side walls, of the side walls and bottom surface, of the connecting hole; and forming a second conductor layer over the second barrier metal layer so as to embed it in the connecting hole; wherein the second insulating film functions as a barrier insulating film.

(5-2) The manufacturing method of a semiconductor device as described above in (5-1), further comprising forming a fourth insulating film having a function as a barrier insulating film over the capping barrier metal film.

(5-3) The manufacturing method of a semiconductor device as described above in (5-1), wherein the second insulating film is a low dielectric constant film formed from a material having a dielectric constant lower than that of a silicon nitride film or having a dielectric constant not greater than 5.5.

(5-4) The manufacturing method of a semiconductor device as described above in (5-3), wherein the low dielectric constant film is a film formed by CVD by using Si and C, Si and N, Si, C and N, Si, O and N, Si, O and C, Si, O, C and N, or TMS and $N_2O$.

(5-5) The manufacturing method of a semiconductor device as descried above in (5-1), wherein the second insulating film has a function as an etching stopper layer upon formation of the connecting hole.

(5-6) The manufacturing method of a semiconductor device as descried above in (5-2), wherein the fourth insulating film has a function as an etching stopper layer upon formation of the connecting hole.

(5-7) The manufacturing method of a semiconductor device as descried above in (5-1), which further comprises, prior to the formation of the second conductor layer, removing the second barrier metal layer from the bottom surface of the connecting hole.

(5-8) The manufacturing method of a semiconductor device as descried above in (5-1), which further comprises: in the connecting hole forming step, removing the capping barrier metal film only from an overlapping portion of the connecting hole and wiring trench; and prior to the second conductor layer forming step, removing the second barrier metal layer from the bottom surface of the connecting hole.

(5-9) The manufacturing method of a semiconductor device as described above in any one of (5-1) to (5-8), wherein: the first and third insulating films include a low-dielectric constant film formed from a material having a dielectric constant lower than that of a silicon oxide film or having a dielectric constant of 3.7 or less.

(5-10) The manufacturing method of a semiconductor device as described above in (5-9), wherein: the low dielectric constant film has Si an C, Si, C and O, Si, O and F, C and H, or Si, O, C and H; or in addition, is porous.

(6-1) A manufacturing method of a semiconductor device, which comprises: (a) forming a first conductor layer in a first insulating film over a semiconductor substrate; (b) forming a capping barrier metal film over the surface of the first conductor layer; (c) forming a second insulating film over the capping barrier metal film and first insulating film and then, forming a third insulating film over the second insulating film; (d) selectively removing the second and third insulating films to form a connecting hole which exists both in the second insulating film and third insulating film and extends from the bottom of the wiring trench toward the capping barrier metal film; (e) forming a barrier metal film over the side walls and bottom of the wiring trench and the side walls and bottom of the connecting hole; (f) removing the barrier metal film from the bottom of the connecting hole; and (g) forming a second conductor layer in the wiring trench and connecting hole.

(6-2) The manufacturing method of a semiconductor device as described above in (6-1), wherein in the barrier metal formation step, the barrier metal film is formed to be thicker at the bottom of the wiring trench than at the bottom of the connecting hole.

(6-3) The manufacturing method of a semiconductor device as described above in (6-2), wherein anisotropic etching is employed for the removal of the barrier metal film from the bottom of the connecting hole in the step (f).

(6-4) The manufacturing method of a semiconductor device as described above in (6-1), which further comprises, between the steps (d) and (e), removing the capping barrier metal film exposed from the bottom of the connecting hole.

DETAILED DESCRIPTION OF THE PREFERRED EMBODIMENTS

Figure 1:
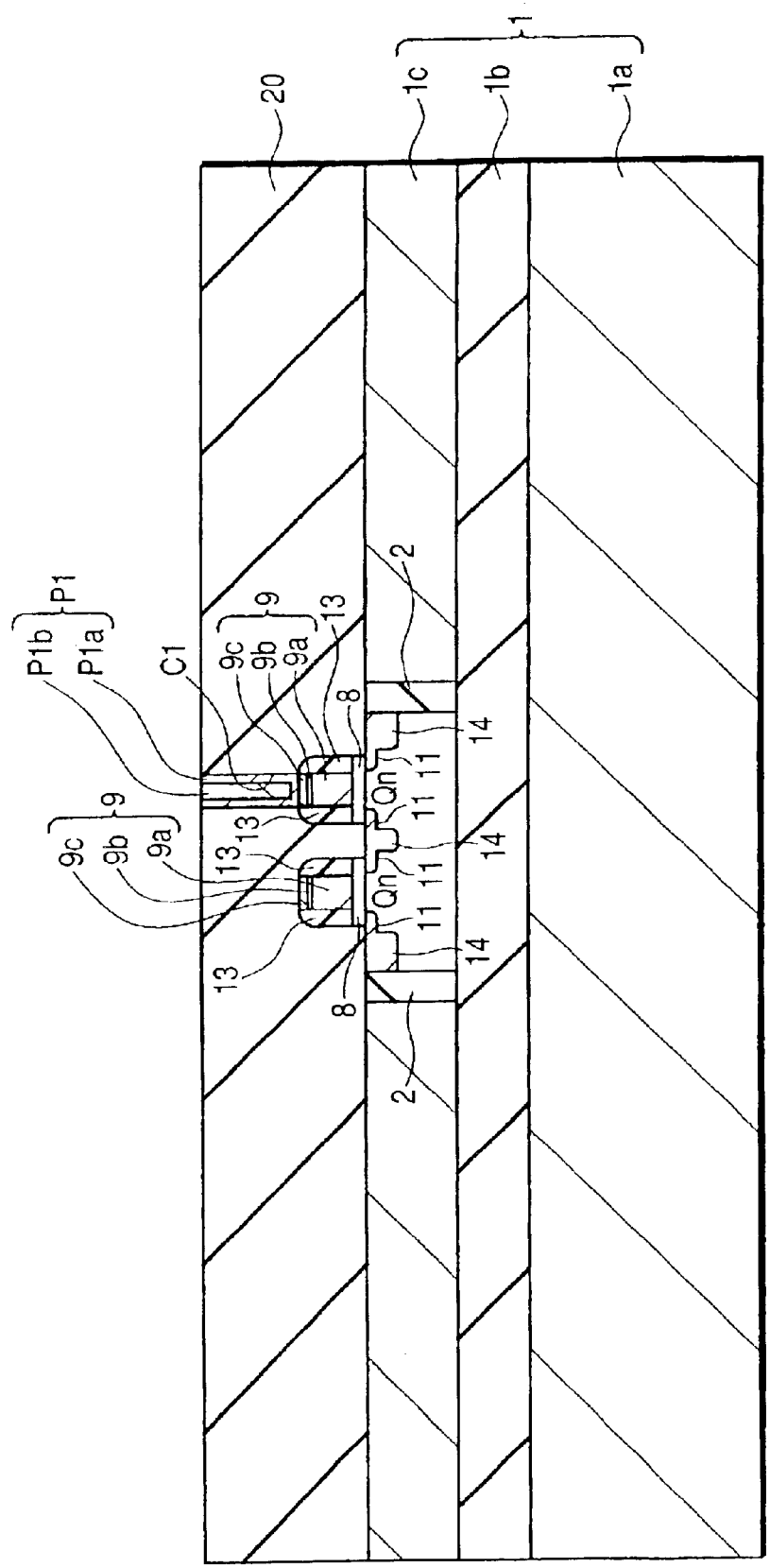
FIG. 1 is a fragmentary cross-sectional view of a substrate illustrating a step in the manufacturing method for production of a semiconductor device according to Embodiment 1 of the present invention.

The embodiments of the present invention will be described in detail based on the accompanying drawings. In all the drawings, members having a like function will be identified by like reference numerals and overlapping descriptions thereof will be omitted.

(Embodiment 1)

A semiconductor device according to the first embodiment of the present invention will be described in the order of its fabrication steps. FIGS. 1 to 23 are fragmentary cross-sectional or fragmentary plane views of a substrate illustrating the manufacturing method for production of a semiconductor device according to Embodiment 1 of the present invention.

As illustrated in FIG. 1, an n channel type MISFET (Metal Insulator Semiconductor Field Effect Transistor) Qn is formed over the main surface of a semiconductor substrate as one example of a semiconductor element.

The following is one example of an MISFET formation process.

First, a semiconductor substrate 1, a so-called SOI (silicon on Insulator) substrate, is prepared, which substrate has an insulating film, for example, a silicon oxide film 1b, formed over a semiconductor region 1a, and, further, a p type semiconductor region 1c is formed over the insulating film. Each element formation region of this semiconductor substrate (semiconductor region 1c) is isolated by element isolations 2. These element isolations 2 can be formed by thermal oxidation of the semiconductor region 1c or by embedding a silicon oxide film in an element isolation trench formed in the semiconductor region 1c. By these regions in which these element isolations 2 have been formed, an active region is defined in which a semiconductor element, such as a MISFET, is to be formed.

By thermal oxidation of the semiconductor substrate (which will hereinafter simply be called a "substrate") 1, a clean gate insulating film 8 is formed on the surface thereof. Over the gate insulating film 8, a low-resistance polycrystalline silicon film 9a, a thin WN (tungsten nitride) film 9b and a W (tungsten) film 9c are successively deposited as a conductive film. The W film 9c, WN film 9b and polycrystalline silicon film 9a are then etched utilizing, for example, a dry etching technique, whereby a gate electrode having the polycrystalline silicon film 9a, WN film 9b and W film 9c is formed.

By ion implantation, as an n type impurity, of phosphorous (P) or arsenic (As) to the substrate 1 on both sides of the gate electrode 9, n⁻ type semiconductor regions 11 are formed. After deposition of a silicon nitride film, as an insulating film, over the substrate 1, anisotropic etching is conducted to form side wall spacers 13 on the side walls of the gate electrode 9.

Then, ion implantation of an n type impurity to the substrate 1 on both sides of the gate electrode 9 is conducted to form n⁺ type semiconductor regions 14 (source, drain) having an impurity concentration higher than that of the n⁻ type semiconductor regions 11.

By the above-described steps, an n channel type MISFETQn is formed, having an LDD (Lightly Doped Drain) structure and equipped with a source and a drain. A p channel type MISFETQp may be formed in a similar manner, except that the impurity employed for the formation has the opposite conductivity.

Interconnects for electrically connecting the n channel type MISFETQn or another unillustrated element are then formed. Steps for forming them will be described next.

After formation of a silicon oxide film 20 as an insulating film over the n channel type MISFETQn by CVD (Chemical Vapor Deposition), as illustrated in FIG. 1, the surface of the silicon oxide film 20 is polished by chemical mechanical polishing (CMP) to planarize the surface.

A photoresist film (not illustrated, which will hereinafter simply be called a "resist film") is formed over the silicon oxide film 20. Using this resist film as a mask, the silicon oxide film 20 is etched to form a contact hole Cl over the gate electrode 9 of the n channel type MISFETQn.

Over the silicon oxide film 20 in the contact hole C1, a titanium nitride (TiN) film P1a to serve as a barrier metal layer is formed to be thin by CVD or sputtering, followed by formation by CVD of a tungsten (W) film P1b to serve as a conductive film. The TiN film P1a and W film P1b outside the contact hole C1 are removed by CMP to form a plug P1. As the barrier metal layer, a laminate of a titanium (Ti) film and a TiN film may be employed.

Figure 2:
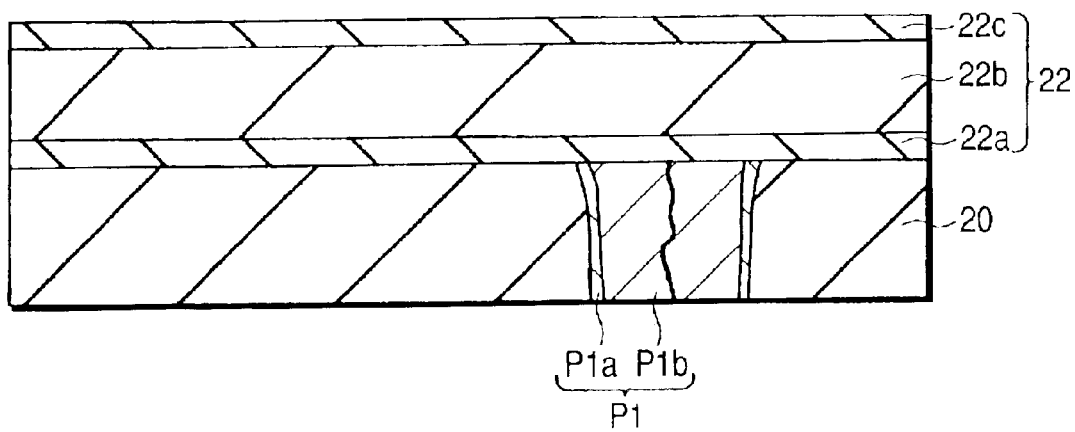
FIG. 2 is a fragmentary cross-sectional view of a substrate illustrating a step in the manufacturing method for production of the semiconductor device according to Embodiment 1 of the present invention.

As illustrated in FIG. 2, a silicon oxide film 22a is formed as an insulating film by CVD over the silicon oxide film 20 and plug P1 by using tetraethoxysilane as a raw material. This silicon oxide film 22a will hereinafter be called "TEOS film 22". FIG. 2 is a partially enlarged view illustrating the vicinity of the plug 1 illustrated in FIG. 1. The line in the plug P1 (P1b) is a seam which appears upon deposition of the tungsten film.

Over the TEOS film 22a, a low dielectric constant insulating film 22b is then formed. This low dielectric constant insulating film can be formed by applying an aromatic polymer material, followed by heat treatment. Alternatively, an organic silica glass may be used for the low dielectric constant insulating film. Also in this case, heat treatment follows application of the material. This organic silica glass is composed mainly of SiOCH or SiOH. Another organic polymer material, or the above-described material having pores introduced therein, may be used.

Application of a film, such as the low dielectric constant insulating film, enables planarization of the unevenness on the substrate surface. The unevenness on the substrate surface derives from the uneven pattern of the underlying layer, or erosion or dishing produced during CMP.

Alternatively, the low dielectric constant insulating film can be formed by CVD. For this process, trimethylsilane or tetramethylsilane is used as a raw material. In this case, the film is composed mainly of SiOC. Examples of the low dielectric constant insulating film usable here include a film composed mainly of SiOF, a film composed mainly of SiC, and an organic polymer film (a film containing C and H) having an aromatic hydrocarbon structure. The dielectric constant can be decreased by introducing pores in (making porous) the above-described films or an $SiO_2$ (silicon oxide) film. These films can be formed by CVD.

Such a low dielectric constant insulating film has a dielectric constant (3.7 or lower) lower than that of a silicon oxide film (for example, TEOS film), so that it is possible to reduce the parasitic capacitance between interconnects (including gate electrodes) and speed up the operation of the semiconductor device.

Instead of the TEOS film 22a, the above-described low dielectric constant insulating film (SiOC, SiOF, SiOC or a porous material of $SiO_2$) formed by CVD may be employed.

Over the low dielectric constant insulating film 22b, a TEOS film 22c is formed. The TEOS film 22c is formed in a similar manner to the TEOS film 22a.

The low dielectric constant insulating film 22b is sandwiched between the TEOS films 22a and 22c in order to maintain the mechanical strength of the laminate. A wiring trench is formed in three layers, that is, TEOS films 22a and 22c, and low dielectric constant insulating film 22b constituting an insulating film (22).

Figure 3:
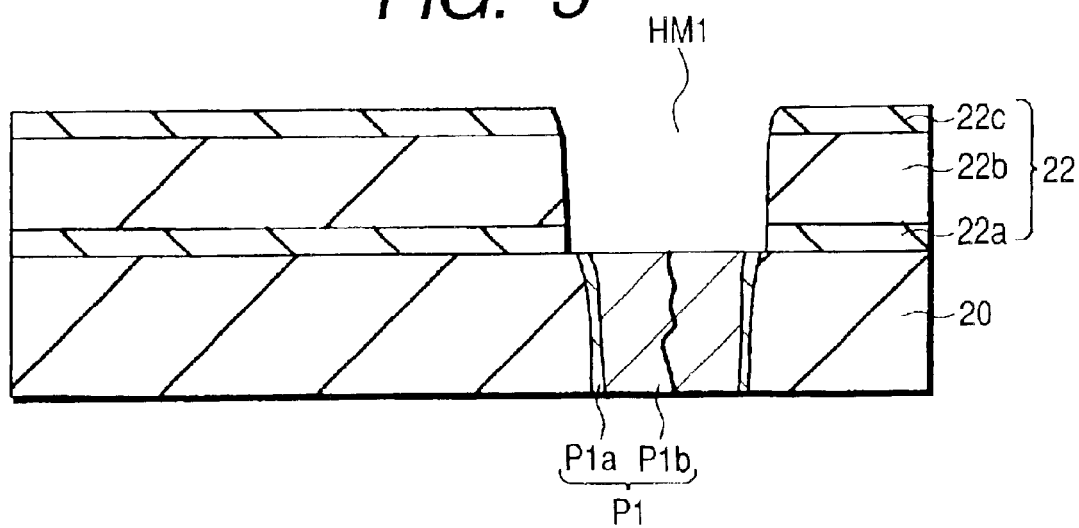
FIG. 3 is a fragmentary cross-sectional view of a substrate illustrating a step in the manufacturing method for production of the semiconductor device according to Embodiment 1 of the present invention.

A wiring trench HM1 is then formed as illustrated in FIG. 3 by removing the insulating film 22 (22a,22b,22c) by photolithography and dry etching from a region in which a first-level interconnect is to be formed. The wiring trench HM1 has, for example, a thickness of 0.25 $\mu$m and a width of 0.18 $\mu$m. This wiring trench HM1 can be formed with good controllability if an etching selectivity between the low dielectric constant insulating film 22b and the TEOS film 22a is utilized for the above-described etching using the TEOS film 22a as an etching stopper film.

Figure 4:
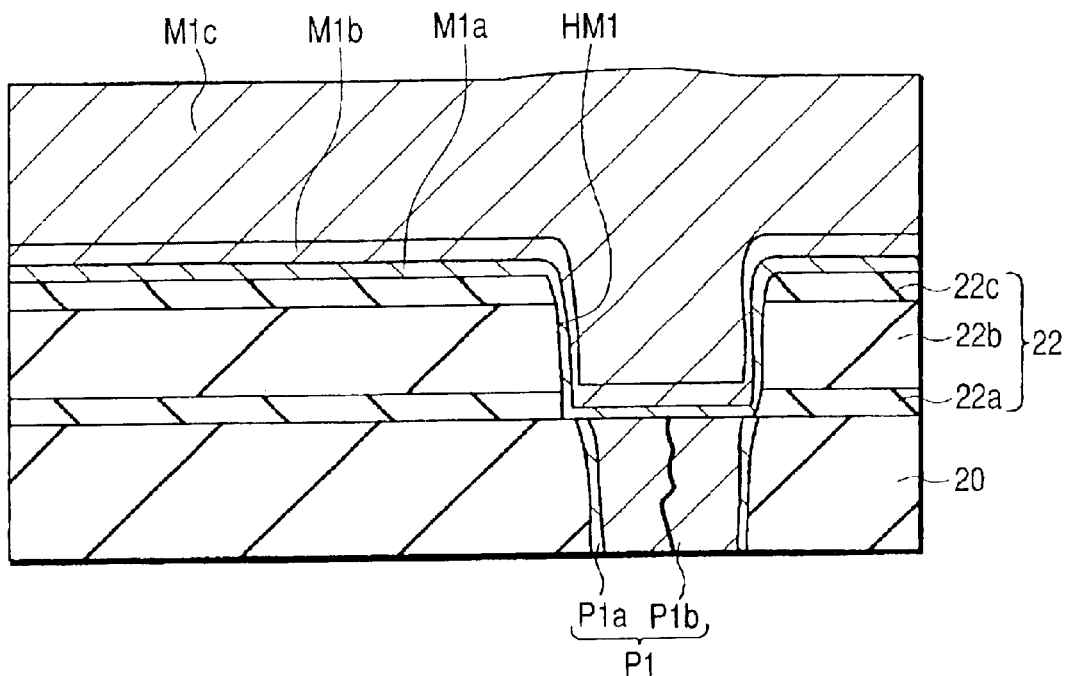
FIG. 4 is a fragmentary cross-sectional view of a substrate illustrating a step in the manufacturing method for production of the semiconductor device according to Embodiment 1 of the present invention.

As illustrated in FIG. 4, a barrier film M1a having a tantalum nitride (TaN) film and a tantalum (Ta) film stacked in this order is formed by deposition over the insulating film 22, including the inside of the wiring trench HM1, by sputtering. This barrier film M1a may be formed by CVD or ionized sputtering which is one form of sputtering. In this ionized sputtering, a metal constituting the barrier film is ionized and the metal ions are imparted with directivity by the biasing of the substrate. This makes it possible to deposit a film with good covering property even inside of a minute trench. The barrier film M1a is formed to have a thickness of about 5 nm on the side walls of the wiring trench HM1 and about 30 nm on its bottom.

The barrier film is not limited to the above-described laminate film of TaN and Ta. Examples of the film usable as the barrier film instead include a single-layer film made of Ta, TaN, TaSiN, W, tungsten nitride (WN), WsiN, Ti, TiN or TiSiN, a three-layer film of Ti, TiN and Ti, a two-layer film of Ti and TiN, a two-layer film of TiSiN and Ta, a three layer film of Ta, TaN and Ta, and a two-layer film of Ta and TaN. A laminate film obtained by stacking any two or more of these single-layer films may be employed.

Over the barrier film M1a, a conductive film, such as a copper film, is formed, for example, by electroplating. First, a thin copper film M1b is formed as a seed film for electroplating, for example, by ionized sputtering. In this ionized sputtering, copper is ionized, and then, the substrate is biased to impart the resulting copper ions with directivity. Upon deposition to form the copper film M1b, the distance between the target and the substrate is kept at about 300 nm and the substrate temperature is adjusted to 25° C. or less. In the initial stage of the film formation, a relatively small DC or RF bias is applied to the substrate. After deposition of a certain thickness of a copper film over the substrate, the bias applied to the substrate is increased relatively. By an increase in the bias, the ions are injected to the substrate surface and the copper film already deposited thereover is sputter etched. At this time, the ions are injected substantially perpendicularly relative to the substrate so that the plane parts (insulating film 22 and the bottom of the wiring trench HM1) are etched preferentially. Copper which has scattered is re-deposited on the side walls of the wiring trench HM1, thereby improving the step coverage of the side walls and bottom of the wiring trench HM1. For the film formation, low-pressure long-distance sputtering is replaces the ionized sputtering.

A copper film M1c is formed over the copper film M1b by electroplating using, for example, a copper-sulfate-containing solution as a plating solution. This copper film M1c is formed so as to embed therewith the wiring trench HM1.

Figure 5:
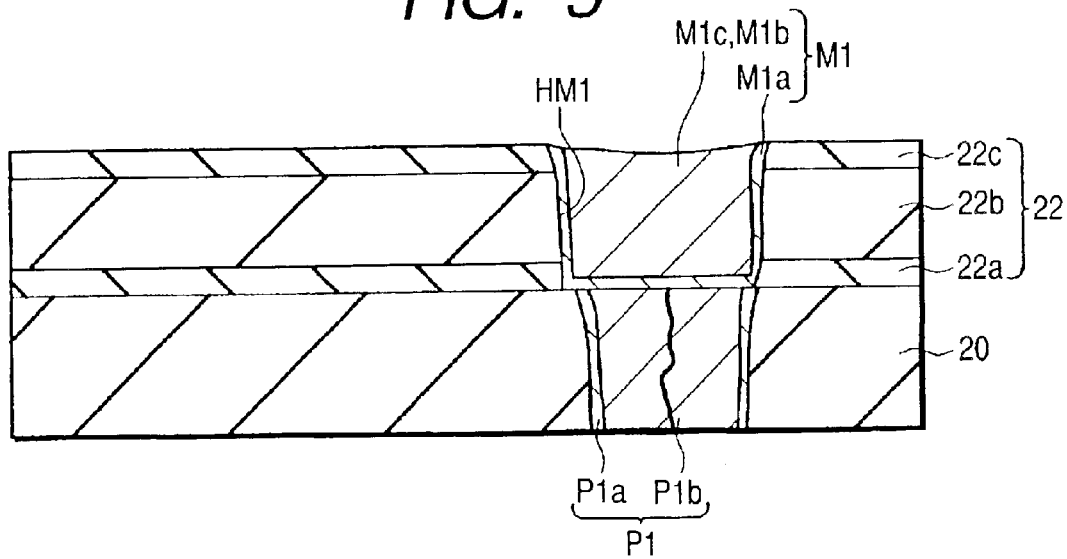
FIG. 5 is a fragmentary cross-sectional view of a substrate illustrating a step in the manufacturing method for production of the semiconductor device according to Embodiment 1 of the present invention.

Under a reducing atmosphere, the substrate 1 is annealed (heat treated). As illustrated in FIG. 5, the copper films M1c and M1b and the barrier film M1b outside the wiring trench HM1 are removed, for example, by CMP or etchback to form a first-level interconnect M1 composed of the copper films M1b and M1c and barrier film M1a. Then, the substrate is annealed (heat treated) further under a reducing atmosphere.

Figure 6:
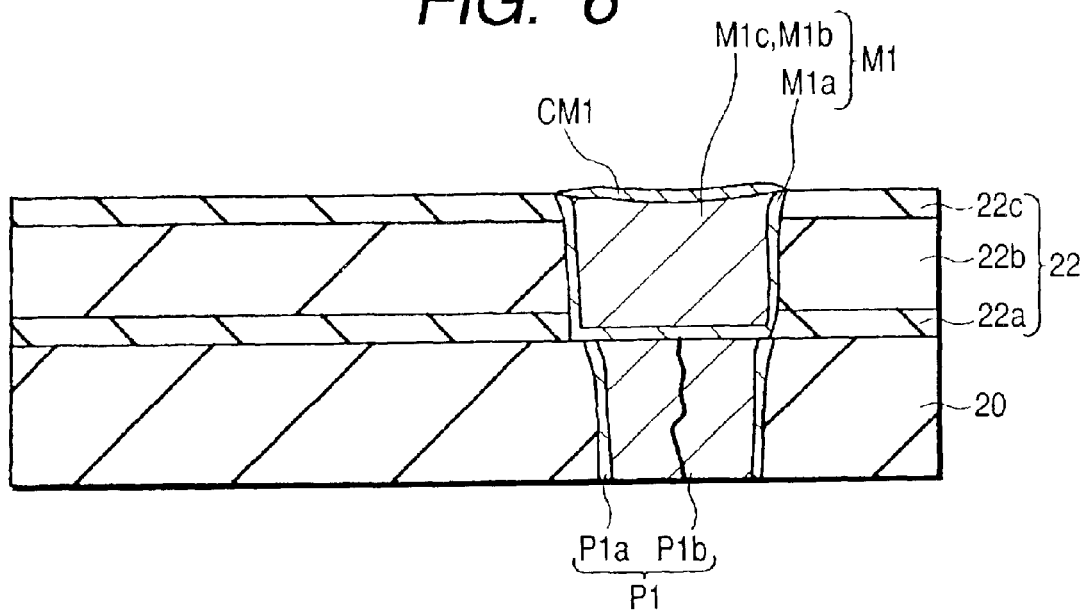
FIG. 6 is a fragmentary cross-sectional view of a substrate illustrating a step in the manufacturing method for production of the semiconductor device according to Embodiment 1 of the present invention.

As illustrated in FIG. 6, a tungsten film CM1 of about 2 to 20 nm thick is formed over the first-level interconnect M1 by causing selective growth or preferential growth of tungsten (W) thereover. The tungsten film CM1 is formed, for example, by treatment for 1.5 minutes under the following conditions: 0.3 Torr ($0.3 \times 1.33322 \times 10^2$ Pa), susceptor temperature set at 460° C. (actual substrate temperature: 430° C.), a flow rate of tungsten hexafluoride ($WF_6$): 5 cc, and a hydrogen ($H_2$) flow rate: 500 scc.

By the above-described treatment, tungsten selectively grows only over the first-level interconnect M1, or grows preferentially over the first-level interconnect M1 to the TEOS film 22. The treatment is conducted at a relatively high temperature while giving priority to the growth rate of tungsten, but the temperature may be set at about 300° C. Thus, a capping conductive film can be formed conveniently by using either one of selective growth or preferential growth. Although 1) a tungsten film, after being formed all over the surface of the substrate, may be patterned by photolithography or dry etching; or 2) a capping conductive film may be formed by over polishing or over etching of the surface of the copper film upon CMP or etch back, thereby concaving the surface of the copper film, and embedding a tungsten film in this concave (which means, the tungsten film outside the concave is removed by CMP or the like after formation of the tungsten film all over the surface), such a method makes the fabrication step complicated. In addition, misalignment upon photolithography or dishing or erosion upon CMP must be controlled, making it difficult to form the capping conductive film with precision. If selective growth or preferential growth is adopted, on the other hand, the fabrication step does not become complicated and the capping conductive film can be formed with good precision. It is needless to say that the method of forming the capping conductive film is not limited to selective growth or preferential growth; and, for the formation of the capping conductive film, not only CVD, but also plating, can be employed.

As the capping conductive film over the first-level interconnect M1, a metal layer composed mainly of W, or a single-layer film of WN, WSiN, TiN, TiSiN, Ta, TaN, or TaSiN (tantalum silicide nitride), a metal layer composed mainly of Co, CoWP (cobalt tungsten phosphorous), CoWB (cobalt tungsten boron), or a laminate (two-layer film or three-layer film) obtained by stacking any plural films of them may be used as well as tungsten film. Tungsten has a resistance of 5 to 20 $\mu\Omega$, while TiN has a resistance of 80 to 150 $\mu\Omega$. Ta or TaN is also higher in resistance than tungsten. Use of tungsten as the capping conductive film can therefore reduce the resistance of an interconnect compared with the use of another film. It is to be noted that copper has a resistance of 1.7 to 2.2 $\mu\Omega$.

Annealing just before the formation of the tungsten film CM1 and formation of the tungsten film CM1 may be conducted in the same apparatus (in situ). When film formation and annealing are conducted in a multi-chamber having therein both a film forming apparatus and an annealing apparatus without taking the substrate out of the chamber, the surface of the substrate (copper film M1c) can be prevented from contamination, leading to improvements in the film forming property and film quality of the tungsten film.

Prior to the formation of the tungsten film CM1, contamination of copper on the substrate surface after CMP may be removed by washing with a cleaning solution, such as hydrogen fluoride (HF). Such washing improves the selectivity of the tungsten film. Here, washing with hydrogen fluoride is given as an example, but the cleaning solution is not limited to hydrogen fluoride insofar as it has a sufficient etching capacity for the surface of the insulating film exposed from the substrate surface or a sufficient capacity to remove copper contamination that has adhered to the surface. Similar effects to the above-described washing are available when the substrate 1 is exposed to the atmosphere of hydrogen ($H_2$) flow rate of 500 $cm^3$/min (sccm) (for example, 50 to 3000 sccm) under pressure of, for example, 3000 Pa (for example, 150 to 10000 Pa) for three minutes prior to the formation of the tungsten film CM1. By eliminating the copper contamination or reducing the oxide on the copper surface to copper by hydrogen treatment, the tungsten film is able to have improved selectivity, a short circuit between interconnects due to loss of selectivity can be prevented, and uniformity of the thickness of the tungsten film formed over an interconnect (copper film) can be improved. Since the oxide of copper will serve as a supply source of copper ions upon electrodiffusion, removal of such an oxide makes it possible to reduce the injection amount of copper ions into the insulating film and improve the reliability of the semiconductor device.

When the tungsten film inevitably grows on the TEOS film 22, the tungsten film on the insulating film can be removed by the lift-off effect brought about by the above-described washing-off of copper. The composition of the cleaning solution is not limited insofar as it has a sufficient capacity to effect etching of the surface of the insulating film exposed from the substrate surface or a sufficient capacity to remove tungsten that has adhered to the surface. It is also possible to remove the unnecessary tungsten film on the insulating film by light CMP or post-washing of the substrate surface after formation of the tungsten film. Removal of a conductive substance on the TEOS film 22c can prevent a short circuit between interconnects.

Figure 7:
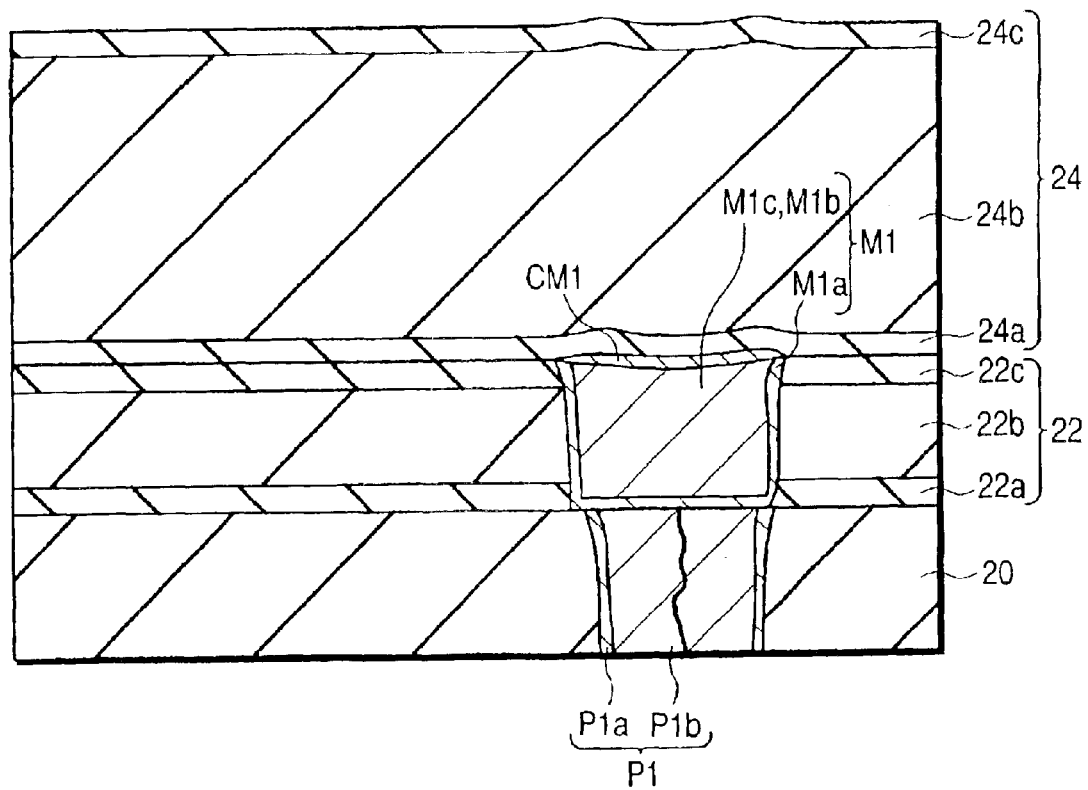
FIG. 7 is a fragmentary cross-sectional view of a substrate illustrating a step in the manufacturing method for production of the semiconductor device according to Embodiment 1 of the present invention.

As illustrated in FIG. 7, then, a TEOS film 24a, an SiOC film 24b and a TEOS film 24c are successively deposited as an insulating film by CVD over the TEOS film 22c and tungsten film CM1. These films have unevenness on their surfaces corresponding to the unevenness of the tungsten film CM1. By means of the TEOS film 24a and SiOC film 24b of this laminate film (24), the first-level interconnect M1 is insulated from the second-level interconnect M2. In these films, a contact hole C2 for forming a plug (connecting portion) P2 is formed, which connects the first-level interconnect M1 and the second-level interconnect M2. Instead of the TEOS films 24a and 24c, a TMS film, SiC film or SiCN film, which is a barrier insulating film having a low dielectric constant relative to the SiN film (silicon nitride film), may be used. Such a low dielectric constant insulating film can be formed, for example, in the following way. A TMS film can be formed using trimethoxysilane and dinitrogen monoxide ($N_2O$) by CVD. It is composed mainly of SiON (a film composed mainly of SiON is called "TMS film"). An SiC film can be formed using trimethylsilane, while an SiCN film can be formed using trimethylsilane and ammonia. Another low dielectric constant film may be employed instead of the TEOS film 24a or 24c. Instead of the SiOC film 24b, an SiOF film may be employed.

Figure 8:
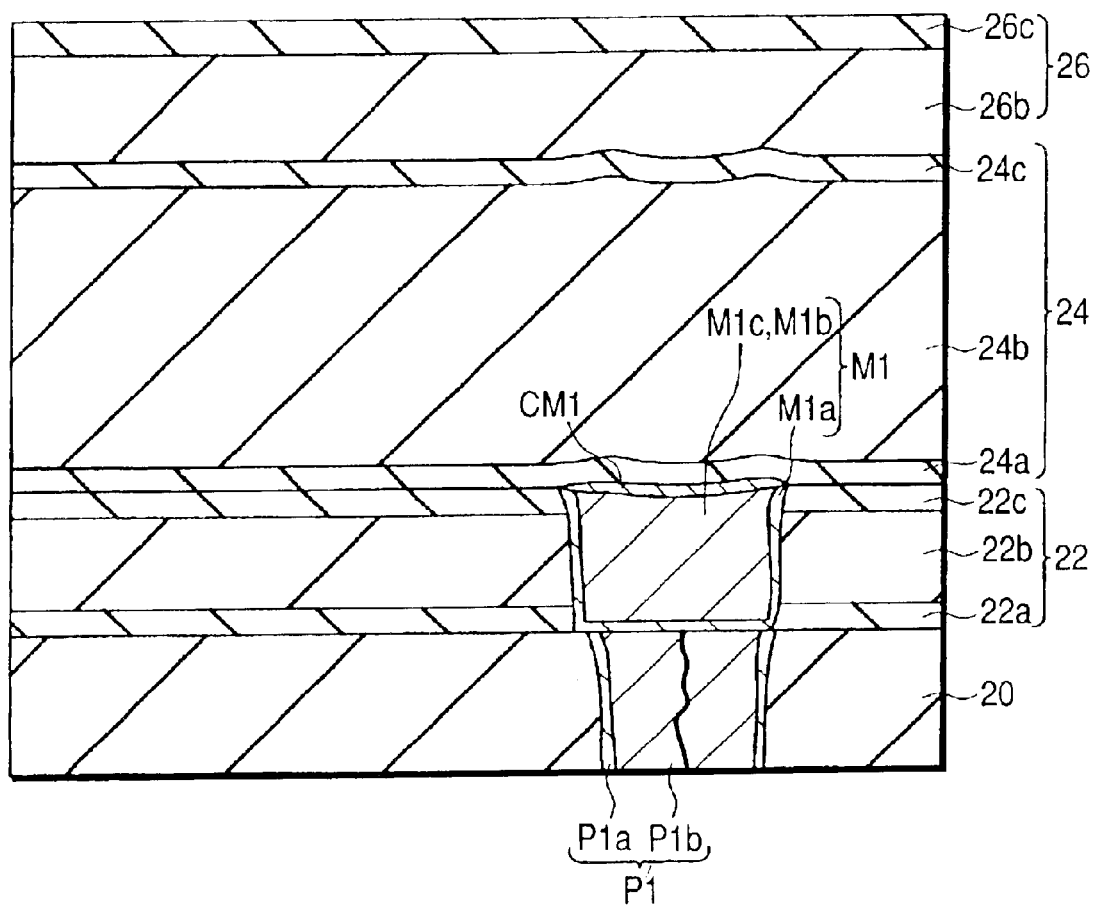
FIG. 8 is a fragmentary cross-sectional view of a substrate illustrating a step in the manufacturing method for production of the semiconductor device according to Embodiment 1 of the present invention.

As illustrated in FIG. 8, a low dielectric constant insulating film 26b using a coating material such as aromatic polymer material and a TEOS film 26c are then successively formed as an insulating film over the TEOS film 24. These films (26b, 26c) are formed in a similar manner to that employed for the formation of the low dielectric constant insulating film 22b and TEOS film 22c. The unevenness of the substrate surface can be planarized because a coated film is used as the low dielectric constant insulating film. In addition, the low dielectric constant insulating film 26b is sandwiched between the TEOS films 26c and 24c so that the mechanical strength of the laminate film (26) formed of these films can be maintained. In the insulating film (26) and the above-described TEOS film 24c, a wiring trench HM2 to be embedded with the second-level interconnect M2 is formed.

Figure 9:
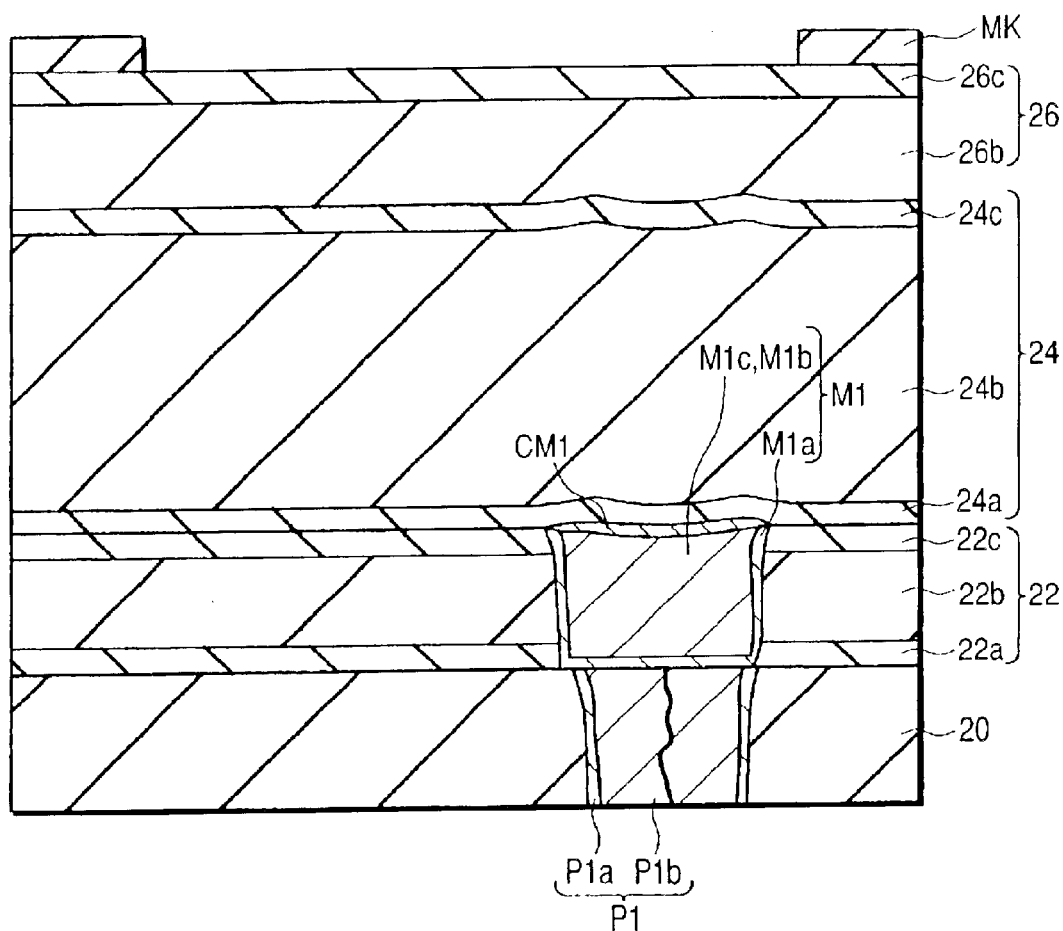
FIG. 9 is a fragmentary cross-sectional view of a substrate illustrating a step in the manufacturing method for production of the semiconductor device according to Embodiment 1 of the present invention.

As illustrated in FIG. 9, a hard mask MK is deposited over the TEOS film 26c, followed by removal of the hard mask MK from a second-level interconnect formation region by photolithography and dry etching. As the hard mask MK, a silicon nitride film or the like can be employed.

Figure 10:
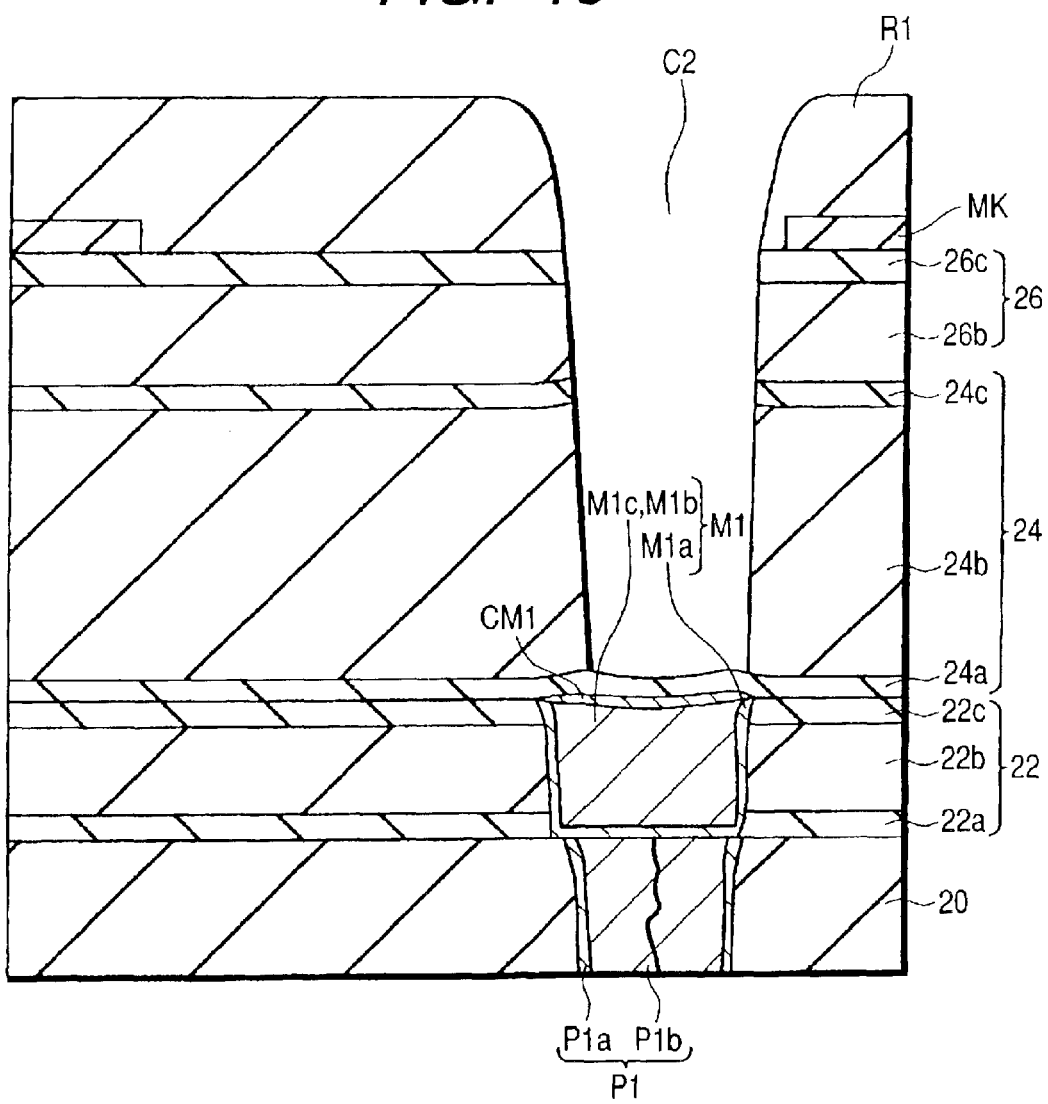
FIG. 10 is a fragmentary cross-sectional view of a substrate illustrating a step in the manufacturing method for production of the semiconductor device according to Embodiment 1 of the present invention.

As illustrated in FIG. 10, a resist film R1 is formed over the hard mask MK. The resist film R1 is then removed by photolithography from a connecting region of the first-level interconnect and the second-level interconnect.

Using this resist film R1 as a mask, the TEOS film 24c and SiOC film 24b, among the insulating film 26 (26b and 26c) and the insulating film 24, are removed, for example, by dry etching to form the contact hole C2. The TEOS film 24a is thus left on the first-level interconnect M1 in order to prevent oxidation of exposed copper, which will otherwise occur upon ashing for the removal of the resist to be conducted later, and to prevent scattering of copper upon dry etching. However, it is not essentially necessary to leave the TEOS film 24 over the first-level interconnect M1, because the copper film M1C is covered with the tungsten film CM1 serving as a capping conductive film.

Figure 11:
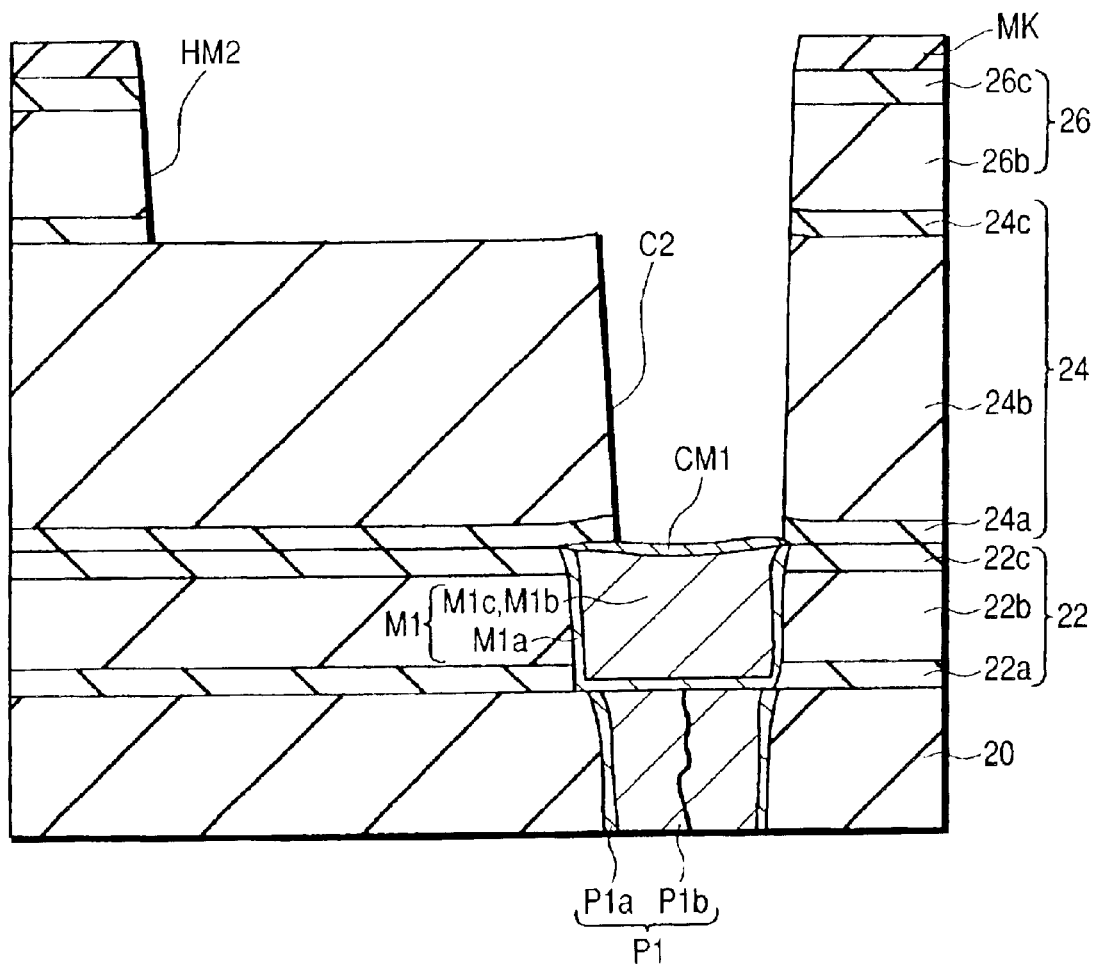
FIG. 11 is a fragmentary cross-sectional view of a substrate illustrating a step in the manufacturing method for production of the semiconductor device according to Embodiment 1 of the present invention.

As illustrated in FIG. 11, after removal of the resist film R1, a wiring trench HM2 is formed by removing the insulating film 26 (26b and 26c) and the TEOS film 24c, for example, by dry etching using the hard mask MK as a mask. At this time, the TEOS film 24a remaining on the bottom of the contact hole C2 is also removed.

This wiring trench HM2 has a thickness of about 0.25 $\mu$m and a width of about 0.18 $\mu$m. The contact hole C2 has a depth of about 0.35 $\mu$m from the bottom of the wiring trench HM2 and its diameter is about 0.18 $\mu$m.

Here, the wiring trench HM2 is formed after formation of the contact hole C2. Alternatively, the contact hole C2 may be formed after the formation of the wiring trench HM2 and then embedding a resist film or the like in this trench to planarize the substrate surface.

Figure 12:
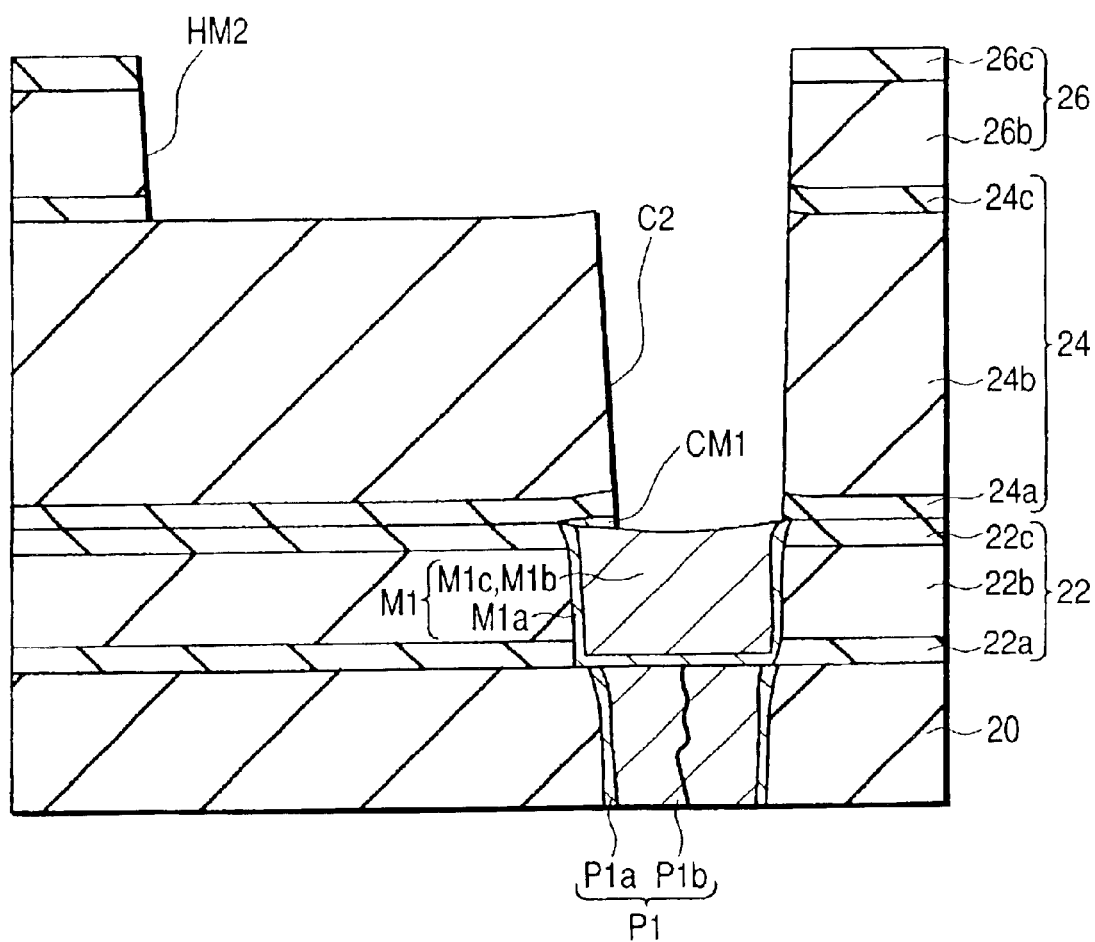
FIG. 12 is a fragmentary cross-sectional view of a substrate illustrating a step in the manufacturing method for production of the semiconductor device according to Embodiment 1 of the present invention.

As illustrated in FIG. 12, the tungsten film CM1, that is exposed from the bottom of the contact hole C2, is removed, for example, by dry etching to expose the copper film M1c. Although no particular limitation is imposed, the formation of the wiring trench HM2 and dry etching for the removal of the tungsten film CM1 can be conducted successively by changing the kind of etching gas being used therefor.

Since the tungsten film CM1 exposed from the bottom of the contact hole C2 can be removed utilizing the steps of forming the contact hole C2 and wiring trench HM2, it can be removed selectively without adding a step for the formation of another mask. The hard mask MK is then removed.

Figure 13:
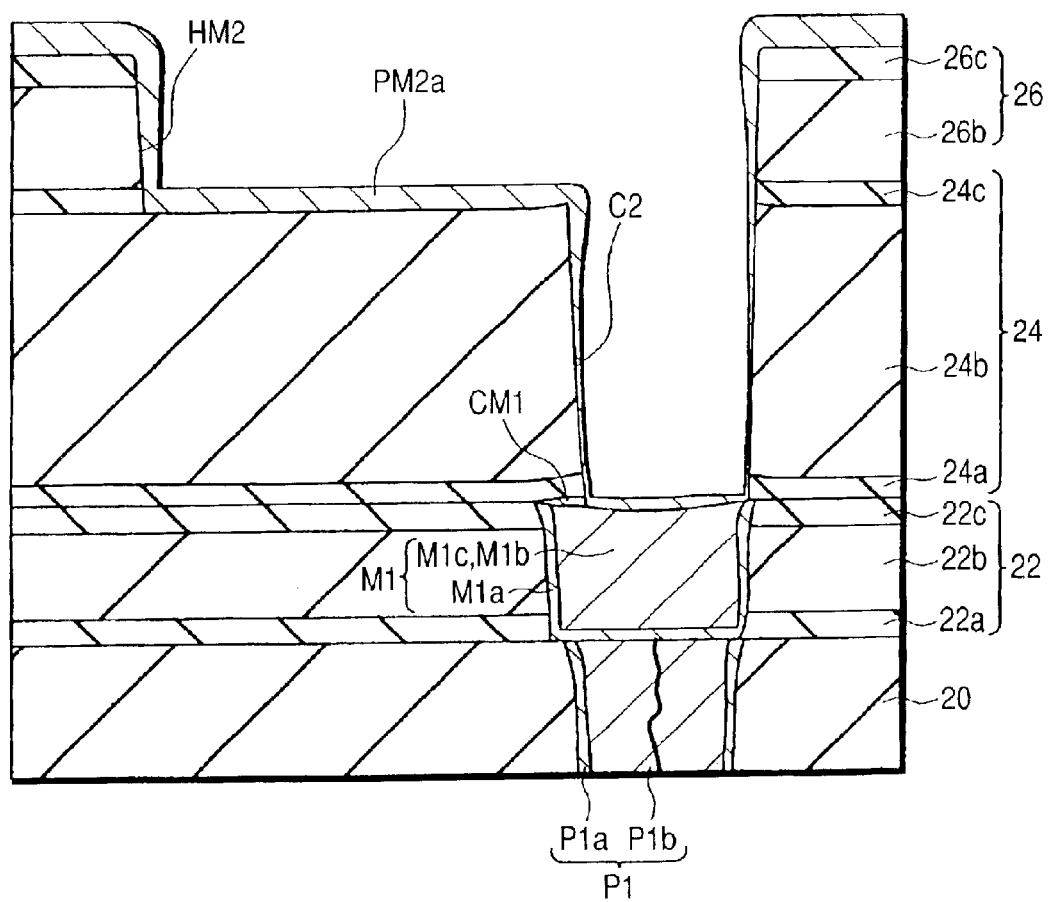
FIG. 13 is a fragmentary cross-sectional view of a substrate illustrating a step in the manufacturing method for production of the semiconductor device according to Embodiment 1 of the present invention.

The oxide on the copper film M1c, that is exposed from the bottom of the contact hole, is then removed by using the following treatments singly or in combination: heat treatment in an atmosphere containing hydrogen or ammonia, exposure of the substrate surface to plasma generated in an atmosphere containing hydrogen, ammonia or a mixture of either one of hydrogen or ammonia and a rare gas, such as Ar, and sputter etching of the substrate surface with a rare gas, such as Ar. Then, as illustrated in FIG. 13, a barrier film PM2a having, for example, a tantalum nitride (TaN) film and a tantalum (Ta) film stacked in the order of mention is deposited over the TEOS film 26 including the insides of the wiring trench HM2 and contact hole C2, for example, by low-pressure long-distance sputtering. The barrier film PM2a may be formed by CVD, or by ionized sputtering, which was described specifically in the formation of the copper film M1b. As described above, the ionized sputtering can impart deposited metal ions with directivity. In the latter stage of film formation, when a metal deposited on the wiring trench or bottom of the contact hole is sputter-etched under a large bias, the metal thus scattered can be re-deposited over the side walls thereof, whereby step coverage of the side walls and bottom can be improved.

Here, the thickness of the barrier film PM2a is adjusted to about 5 nm on the side walls of the wiring trench HM2, about 30 nm on the bottom of the wiring trench HM2, about 3 nm on the side walls of the contact hole C2 and about 20 nm on the bottom of the contact hole C2. By controlling the film thickness of the barrier film PM2a on the bottom of the wiring trench HM2 to be greater than that on the bottom of the contact hole C2, the barrier film PM2a can be left on the bottom of the wiring trench HM2 even if the barrier film PM2a is removed later from the bottom of the contact hole C2 by sputter etching. Moreover, by forming the barrier film PM2a while setting the initial film forming conditions to permit high anisotropy (directivity), it is possible to prevent excessive thickening of the barrier film PM2a on the bottom or side walls of the wiring trench HM2 or on the side walls of the contact hole C2.

Figure 14:
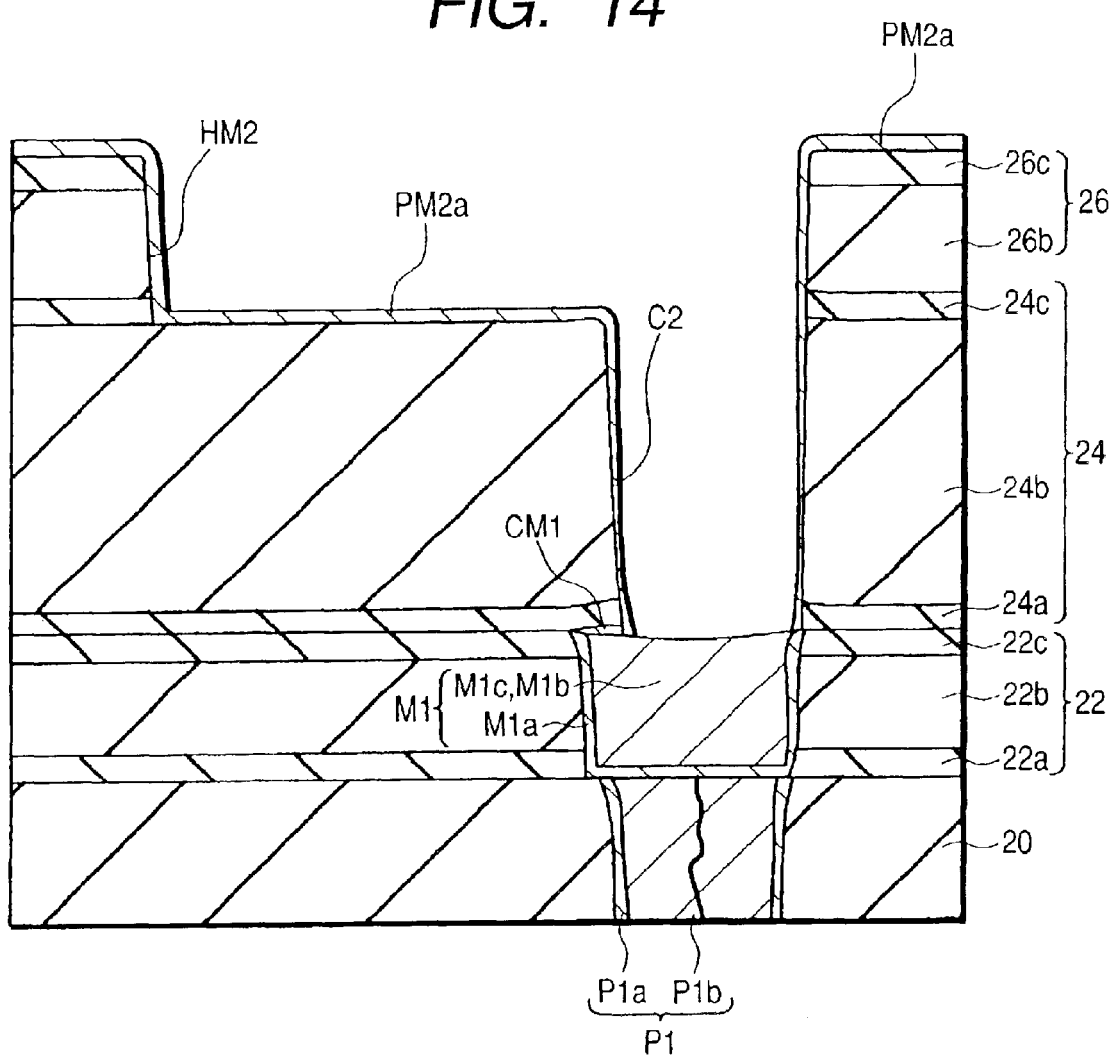
FIG. 14 is a fragmentary cross-sectional view of a substrate illustrating a step in the manufacturing method for production of the semiconductor device according to Embodiment 1 of the present invention.

As illustrated in FIG. 14, the barrier film PM2a is removed from the bottom of the contact hole C2, followed by formation of a copper film PM2b over the barrier film PM2a and exposed copper film M1c. The removal of the barrier film PM2a and formation of the copper film PM2b can be conducted, for example, by the above-described ionized sputtering.

While the distance between the target and substrate is set at about 300 mm and the substrate temperature is adjusted to 25° C. or less, the barrier film PM2a on the bottom of the contact hole C2 is sputter etched by applying a large DC or RF bias to the substrate at an initial stage, thereby injecting copper ions and argon (Ar) ions, contained in the atmosphere, to the substrate surface. At this time, these ions are incident to the substrate substantially perpendicularly so that the plane portion (the bottom of the wiring trench HM2 and the bottom of the contact hole C2) is etched preferentially. As described above, the barrier film PM2a on the bottom of the wiring trench HM2 is made thicker than that on the bottom of the contact hole C2 so that it is possible to leave the barrier film PM2a on the bottom of the wiring trench HM2 while removing the barrier film PM2a on the bottom of the contact hole C2.

By selecting the etching conditions properly, thereby re-depositing the scattered barrier film PM2a on the side walls and bottom of the wiring trench HM1 or contact hole C2, the step coverage of these side walls or bottom can be improved. It is also possible to even out the thickness of the barrier film PM2a on the side walls of the wiring trench HM2 or contact hole C2 by re-depositing the barrier film PM2a which has deposited thick on the upper portion (corner) of the side walls of the wiring trench HM2 or the contact hole C2.

Figure 15:
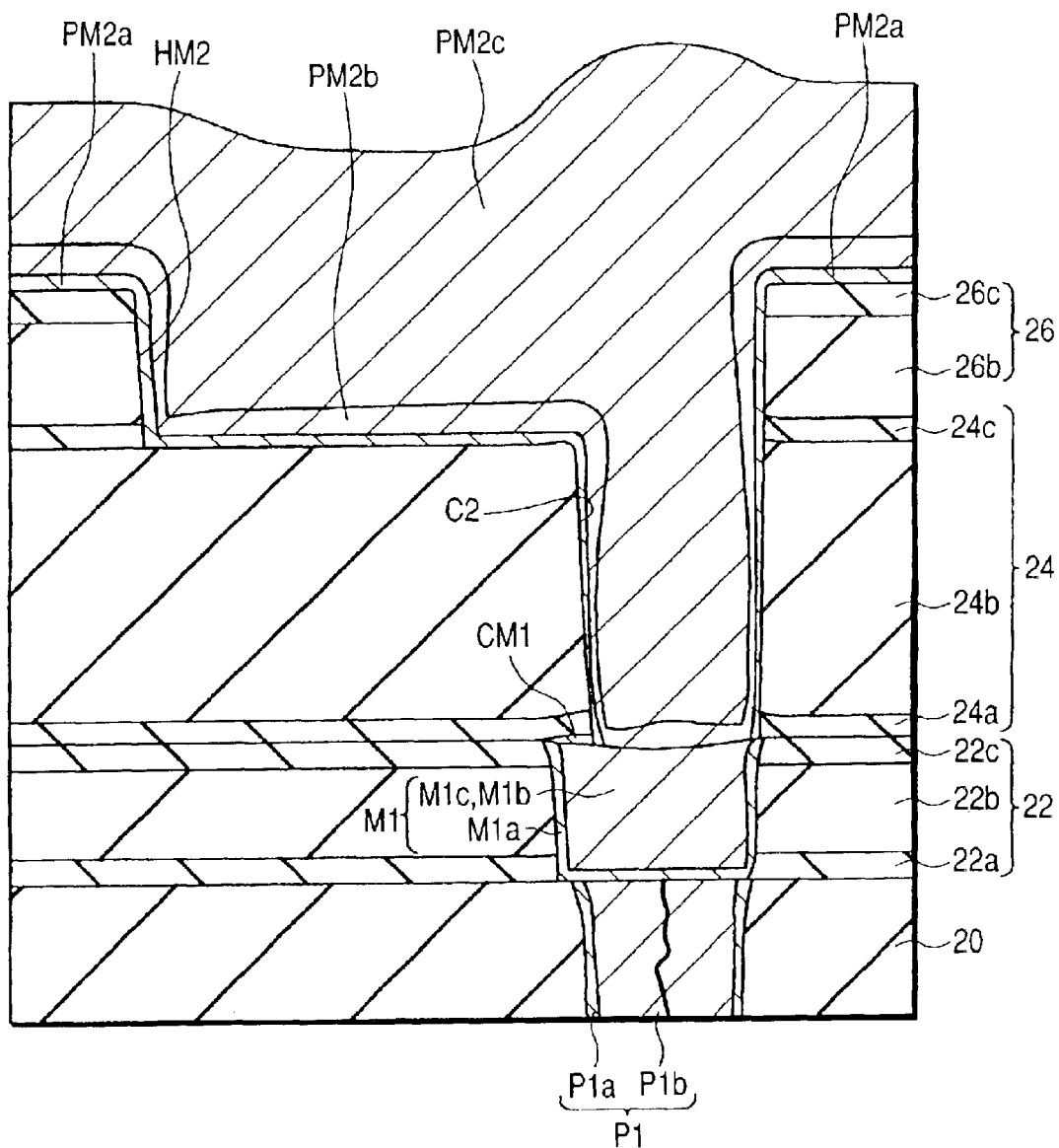
FIG. 15 is a fragmentary cross-sectional view of a substrate illustrating a step in the manufacturing method for production of the semiconductor device according to Embodiment 1 of the present invention.

A thin copper film PM2b is deposited, as a seed film for electroplating, in the wiring trench HM2 and contact hole C2, as illustrated in FIG. 15, by reducing the bias or terminating application of the bias. At this time, as described above, it is possible to improve the step coverage of the copper film PM2b on the side walls and bottom of the wiring trench HM2 or contact hole C2 by increasing the bias to a relatively high level after deposition of a certain thickness of the copper film over the substrate.

As a result, the copper film PM2b is formed via the barrier film PM2a over the side walls and bottom of the wiring trench HM2 and the side walls of the contact hole C2, while over the copper film M1c exposed from the bottom of the contact hole C2, the copper film PM2b is formed directly without insertion of the barrier film PM2a therebetween. The barrier film PM2a has a thickness of about 5 nm on the side walls and bottom of the wiring trench HM2, and about 3 nm on the side walls of the contact hole C2, while the copper film PM2b has a thickness of about 10 nm.

If removal of the barrier film PM2a from the bottom of the contact hole C2 and formation of the copper film PM2b inside of the wiring trench HM2 and contact hole C2 are carried out in one apparatus, oxidation of the barrier film PM2a or adhesion of foreign matter thereto can be prevented, and the quality of each of the barrier film PM2a and copper film PM2b can be improved. It is also possible to form the copper film PM2b on another site (inside of the wiring trench HM2 or over the side walls of the contact hole C2) while removing the barrier film PM2a from the bottom of the contact hole C2 under certain conditions, such as the bias being changed as needed.

The removal of the barrier film PM2a from the bottom of the contact hole C2 and formation of the copper film PM2b inside of the wiring trench HM2 and contact hole C2 may be conducted in respective apparatuses. For example, after removal of the barrier film PM2a from the bottom of the contact hole C2 by anisotropic etching, the copper film PM2b may be formed inside of the wiring trench HM2 and contact hole C2 by sputtering. In this case, heat treatment or plasma treatment in a reducing atmosphere containing hydrogen or ammonia, or washing with a cleaning solution, such as hydrogen fluoride (HF), may be conducted in order to remove the oxide or foreign matter on the surfaces of the barrier film PM2a and the copper film M1c exposed by anisotropic etching.

A copper film PM2c is then formed over the copper film PM2b by electroplating using, as a plating solution, a copper-sulfate-containing solution. This copper film PM2c is formed so as to embed therewith the wiring trench HM2 and contact hole C2.

Figure 16:
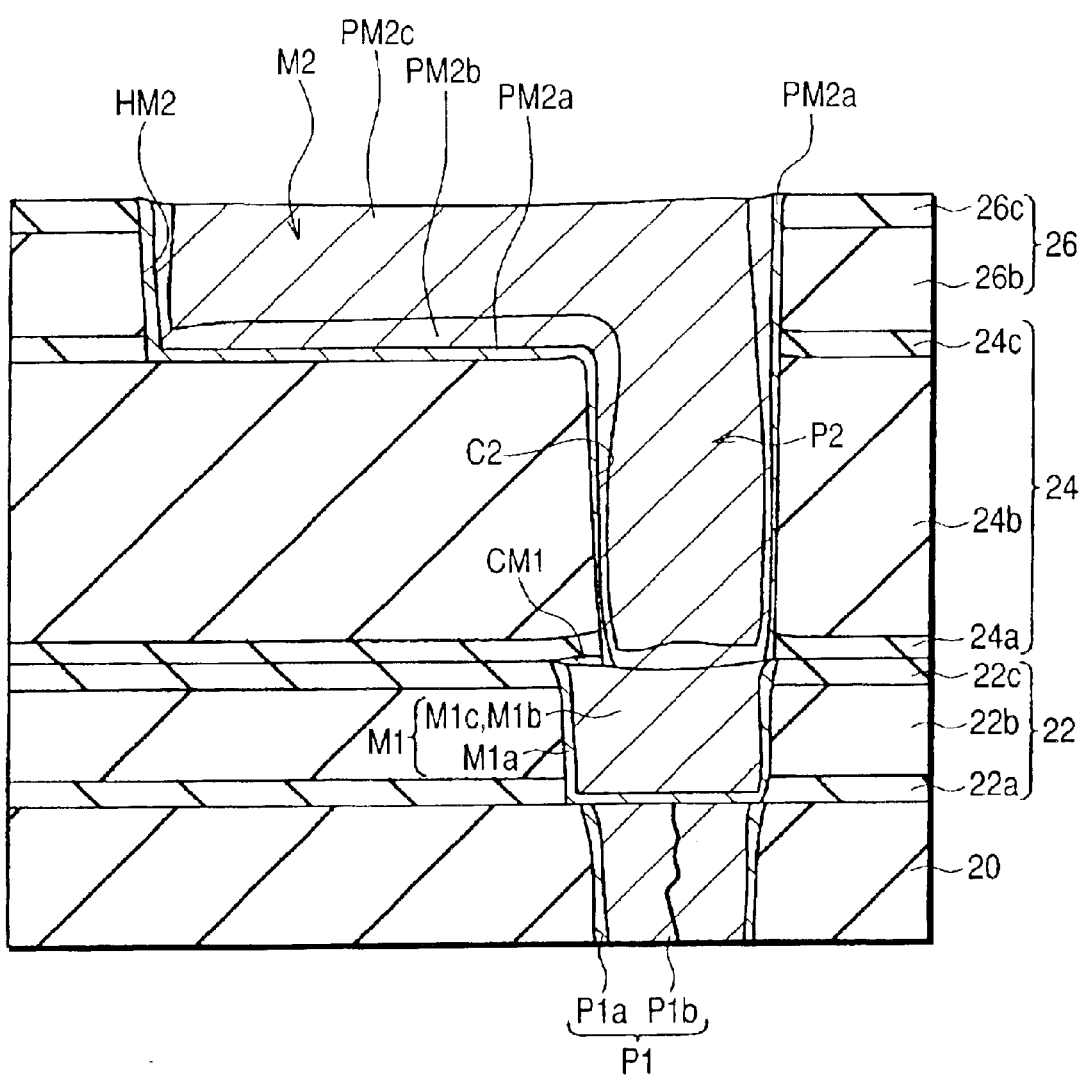
FIG. 16 is a fragmentary cross-sectional view of a substrate illustrating a step in the manufacturing method for production of the semiconductor device according to Embodiment 1 of the present invention.

After annealing (heat treating) of the substrate 1 in a reducing atmosphere, the copper films PM2c and PM2b, and the barrier film PM2a outside the wiring trench HM2 and contact hole C2 are removed by CMP or etchback, whereby a second-level interconnect M2 and a plug (connecting portion) P2 for connecting the first-level interconnect M1 with the second-level interconnect, each made of the copper films PM2b and PM2c and barrier film PM2a, are formed as illustrated in FIG. 16. Here, the second-level interconnect M2 means the copper films PM2b and PM2c and barrier film PM2a embedded inside of the wiring trench HM2, while the plug P2 means the copper films PM2b and PM2c and barrier film PM2a embedded inside of the contact hole C2 extending from the bottom of the wiring trench HM2.

In a reducing atmosphere, the substrate 1 is annealed (heat treated) further.

As described above, this embodiment actualizes a reduction in resistance, because the tungsten film CM1 and barrier film PM2a between the first-level interconnect M1 and plug P2 are removed and the first-level interconnect M1 is in direct contact with copper, which is a main metal constituting the plug P2. Moreover, this embodiment enables movement of copper atoms between the first-level interconnect M1 and the plug P2, which makes it possible to diminish the frequency of generation of voids at the interface between the first-level interconnect M1 and plug P2, thereby improving electromigration resistance.

More specifically, neither the barrier film PM2a nor tungsten film CM1 is formed on the bottom of the contact hole C2, that is, at a joint between the first-level interconnect M1 and plug (connecting portion) P2. Since both the barrier film PM2a and tungsten film CM1 are removed from the bottom of the contact hole C2, the first-level interconnect M1 is in direct contact with copper, which is a main metal constituting the plug P2. No interface exists between the barrier metal and copper, so that disconnection in the vicinity of the plug due to stress migration can be prevented.

Since the tungsten film CM1 and barrier film PM2a are integrated (these films cover the copper film without interruption), the whole surface of the copper film inside thereof is covered with the barrier metal film. An interface between copper having a relatively low adhesion property and an insulating film can be eliminated from the structure, which brings about an improvement in the adhesion on the surface of the copper. As a result, generation of voids can be suppressed and the electromigration resistance can be improved.

Although neither the tungsten film CM1 nor the barrier film PM2a exist between the tungsten film CM1 and barrier film PM2a, another portion of the first-level interconnect M1 and plug P2 is covered with the tungsten film CM1 or barrier film PM2a. This structure makes it possible 1) to prevent diffusion, into the insulating film, of a metal (copper in the case of a copper film) constituting the conductive film to be embedded, and 2) to prevent oxidation of the conductive film owing to the contact of the silicon oxide film with the conductive film.

The use of a tungsten film as the capping conductive film makes it possible to improve the electromigration resistance, compared with the use of an insulating film, such as silicon nitride film, as the capping film, because copper does not diffuse easily on the copper-barrier film interface compared to the copper-silicon nitride film interface.

In addition, an effective dielectric constant of the insulating film existing between interconnects can be reduced because an insulating film, such as a silicon nitride film, is not used as the capping conductive film. As a result, the transmission speed of signals via interconnects can be improved and high-speed operation of a semiconductor device can be actualized. The dielectric constant of the silicon nitride film is approximately 6 to 8, while that of the TEOS film is 4.

The first-level interconnect M1 and plug P2 are covered with the hard tungsten film CM1 or barrier film PM2a, and so breakage of the interconnect due to stress migration can be prevented. Such a stress occurs, for example, owing to heat stress applied upon heat treatment. Particularly in this Embodiment, since a low dielectric constant insulating film, which has low hardness, is employed, protection of the first-level interconnect M1 and plug P2 is effective.

Since a tungsten film is used as the capping conductive film, it can be embedded in a defect, if any, appearing on the surface of the underlying copper film, leading to an improvement in the reliability of the interconnect and also in the yield of the product. The defect on the surface of the copper film is caused by breakage, shrinkage or scratches. For example, breakage or scratches occur upon polishing of the copper film by CMP. They also occur due to heat treatment or insufficient embedding of the copper film.

If such a defect causes a clearance in the copper film or at the interface between the copper film and the barrier film, the interconnect resistance increases. Such a clearance becomes a starting point of electromigration, thereby lowering the electromigration resistance. A plug formed over such a clearance inevitably heightens the connection resistance.

Use of a tungsten film as the capping conductive film, on the other hand, can repair the clearance by embedding therein the tungsten film, thereby improving the electromigration resistance, the reliability of the resulting semiconductor device, and, moreover, the yield of the product.

Figure 17:
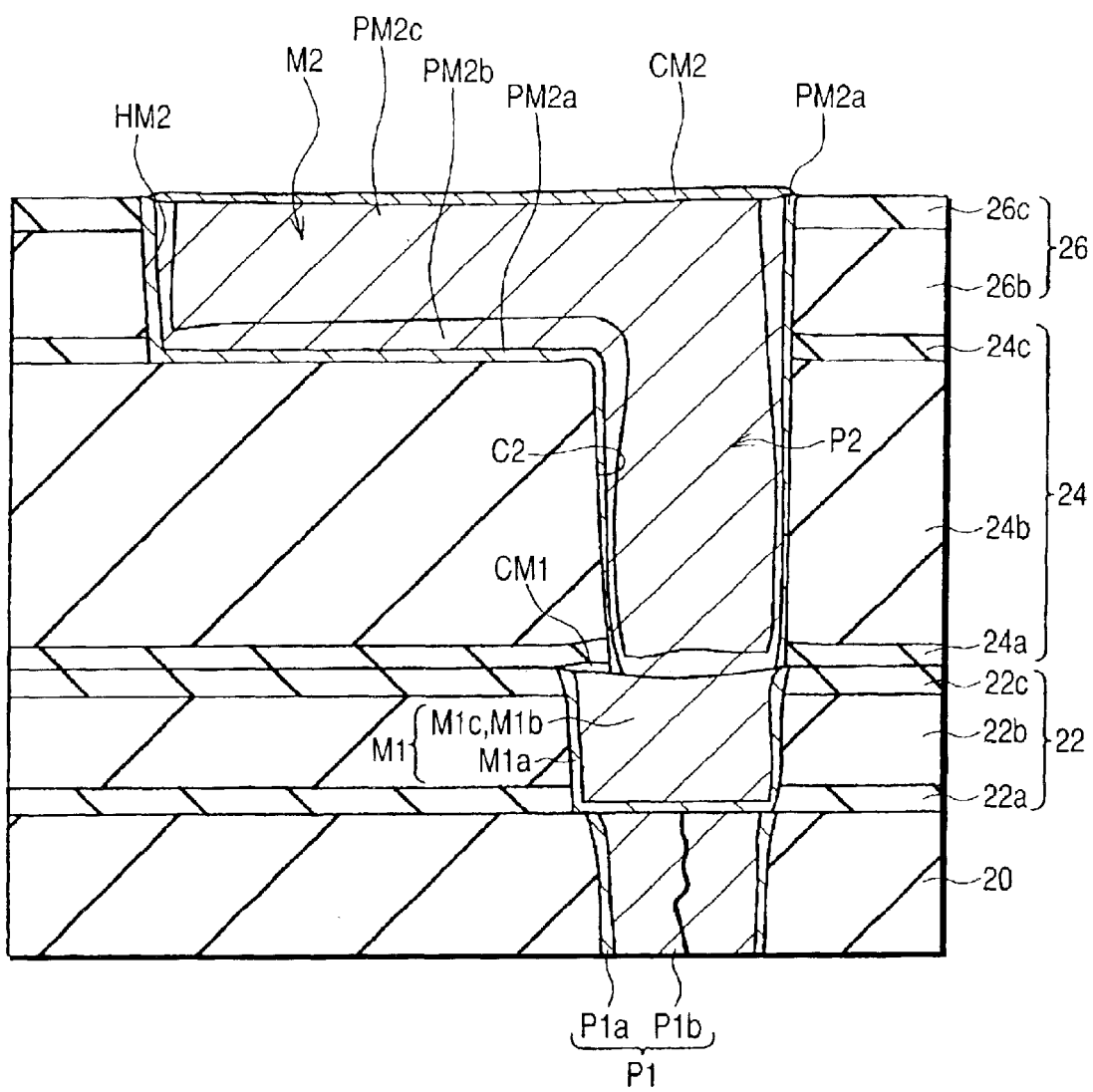
FIG. 17 is a fragmentary cross-sectional view of a substrate illustrating a step in the manufacturing method for production of the semiconductor device according to Embodiment 1 of the present invention.

As illustrated in FIG. 17, a tungsten film CM2 of about 2 to 20 nm thick is then formed over the second-level interconnect M2 (PM2c) by selective growth or preferential growth of tungsten (W) over the second-level interconnect M2. This tungsten film CM2 is formed, for example, by treatment for 1.5 minutes under the following conditions: 0.3 Torr (0.3×1.33322×10$^2$ Pa), susceptor preset temperature of 460° C. (actual substrate temperature: 430° C.), flow rate of tungsten hexafluoride (WF$_6$) of 5 sccm, and flow rate of hydrogen (H$_2$) of 500 sccm.

The above-described treatment causes selective growth of tungsten only over the second-level interconnect M2, or preferential growth of tungsten over the second-level interconnect M2, compared to the growth over the TEOS film 26c. The above treatment is conducted at a relatively high temperature while giving priority to the growth rate of tungsten, but the temperature may be set at about 300° C.

As the capping conductive film, not only tungsten but also a single layer film of WN, WSiN, CoWP, CoWB, TiN, TiSiN, Ta, TaN or TaSiN or a laminate film (two-layer film, three-layer film, etc.) obtained by stacking any two or more of these films may be used.

As described above, annealing just before the formation of the tungsten film CM2 and formation of the tungsten film CM2 may be conducted in one apparatus (in situ).

Prior to the formation of the tungsten film CM2, contamination of copper on the substrate surface after CMP may be removed, for example, by washing with a cleaning solution, such as hydrogen fluoride (HF), or treatment for 3 minutes in an atmosphere of hydrogen (H$_2$) flow rate of 500 cm$^3$/min (sccm) under pressure of 3000 Pa.

The tungsten film which has grown on the TEOS film 26c can be removed by the lift-off effect brought by the above-described washing of copper. It is also possible to remove the tungsten film on the TEOS film 26c by light CMP of the substrate surface after formation of the tungsten film. Removal of a conductive substance on the TEOS film 26c in such a manner can prevent a short circuit between interconnects.

Figure 18:
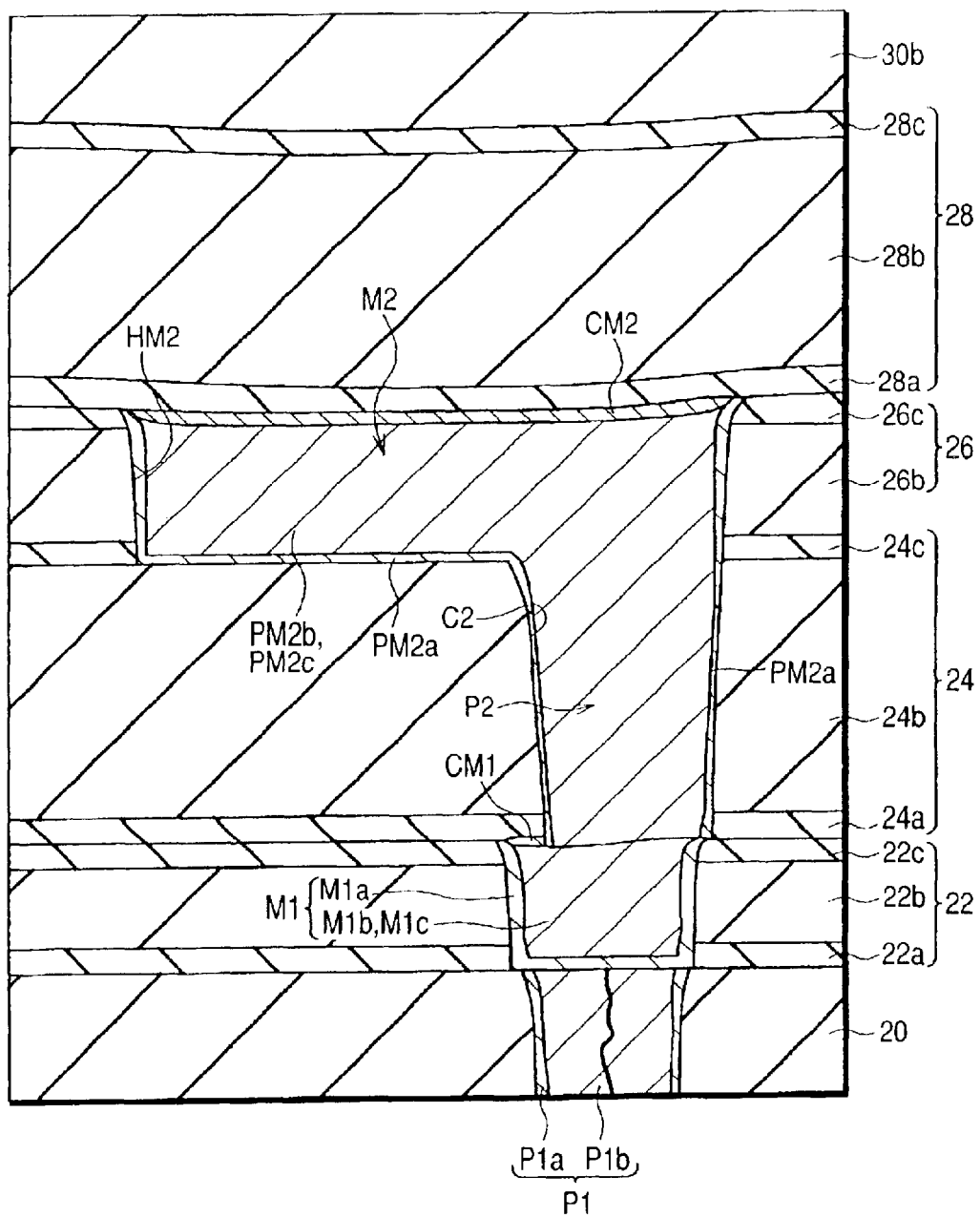
FIG. 18 is a fragmentary cross-sectional view of a substrate illustrating a step in the manufacturing method for production of the semiconductor device according to Embodiment 1 of the present invention.

As illustrated in FIG. 18, a TEOS film 28a, an SiOC film 28b and another TEOS film 28c are deposited successively by CVD over the TEOS film 26c and tungsten film CM2. These films are formed in a similar manner to that employed for the formation of the TEOS films 24a and 24c, and SiOC film 24b. Over the TEOS film 28c, a low dielectric constant insulating film 30b using an aromatic polymer material and a TEOS film (not illustrated) are formed successively as an insulating film. These films are formed in a similar manner to that employed for the formation of the low dielectric constant insulating film 22b and TEOS film 22c.

In the resulting 5-layer insulating film, a wiring trench and contact hole are formed in a similar manner to that employed for the wiring trench HM2 and contact hole C2. The formation of them is not illustrated.

Formation of an insulating film, wiring trench, contact hole, barrier film, copper film and tungsten film in such a manner is repeated, whereby a semiconductor device having a multilayer interconnect is formed.

Figure 19:
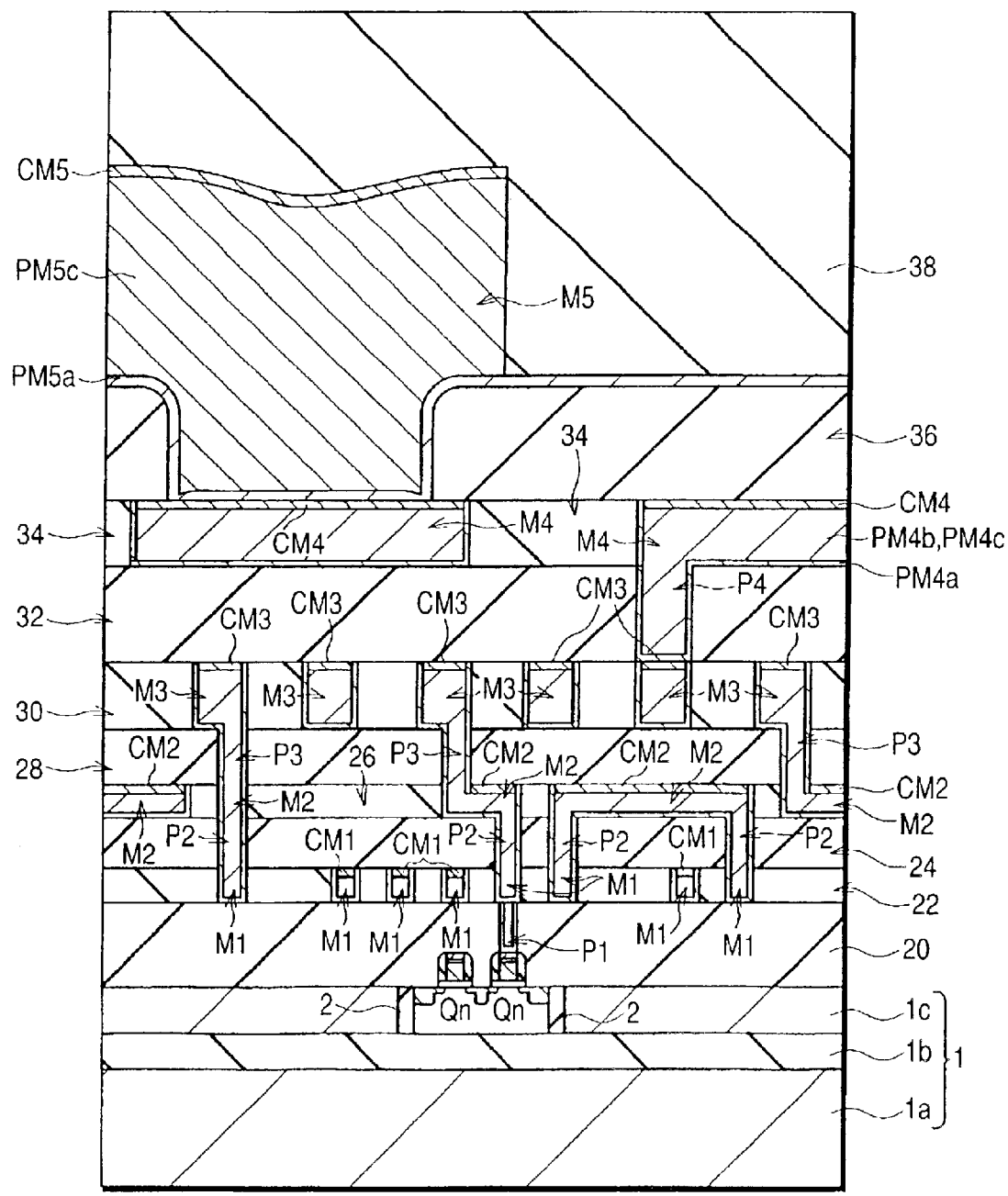
FIG. 19 is a fragmentary cross-sectional view of a substrate illustrating a step in the manufacturing method for production of the semiconductor device according to Embodiment 1 of the present invention.
Figure 20:
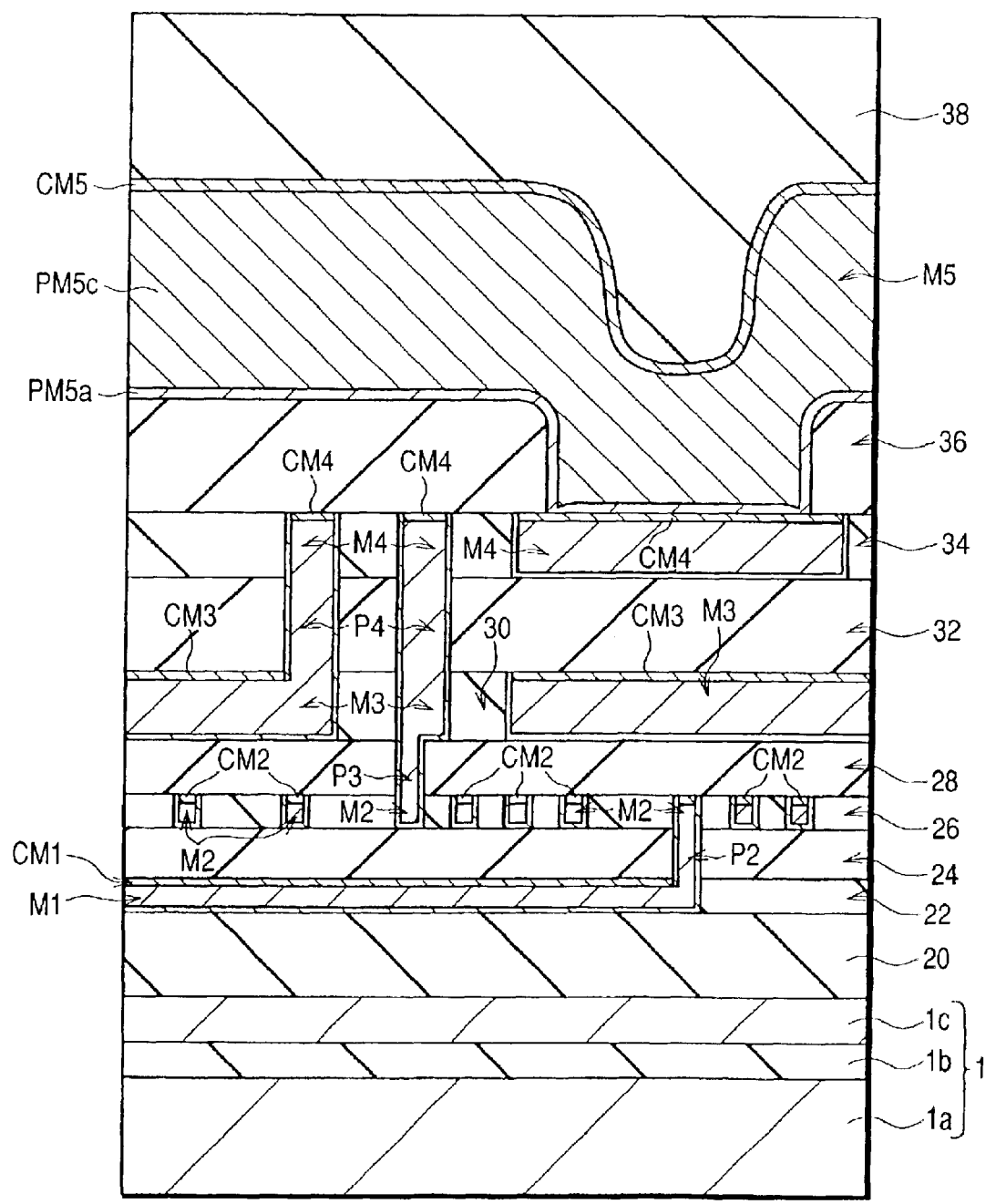
FIG. 20 is a fragmentary cross-sectional view of a substrate illustrating a step in the manufacturing method for production of the semiconductor device according to Embodiment 1 of the present invention.
Figure 21:
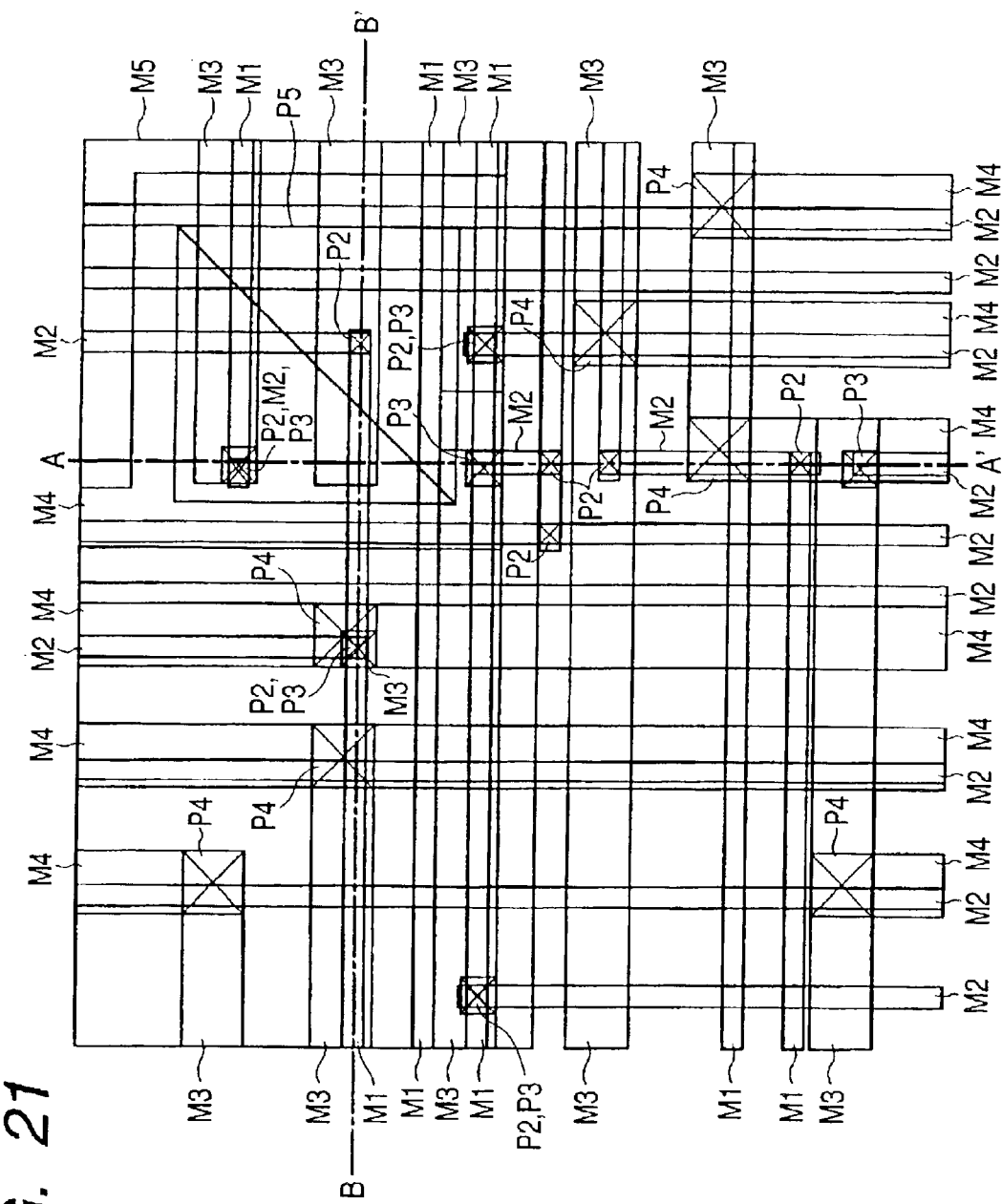
FIG. 21 is a fragmentary plane view of a substrate illustrating a step in the manufacturing method for production of the semiconductor device according to Embodiment 1 of the present invention.
Figure 22:
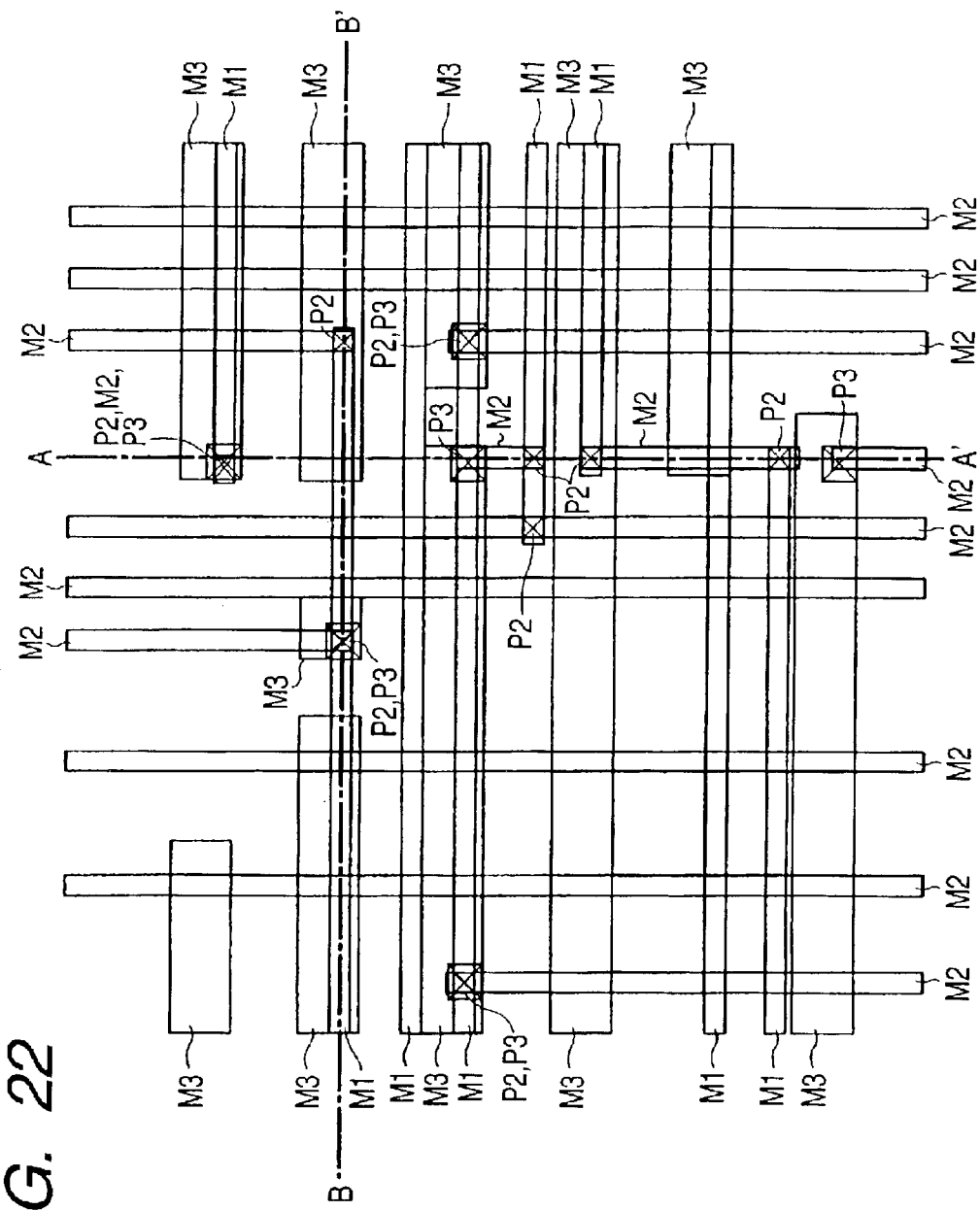
FIG. 22 is a fragmentary plane view of a substrate illustrating a step in the manufacturing method for production of the semiconductor device according to Embodiment 1 of the present invention.
Figure 23:
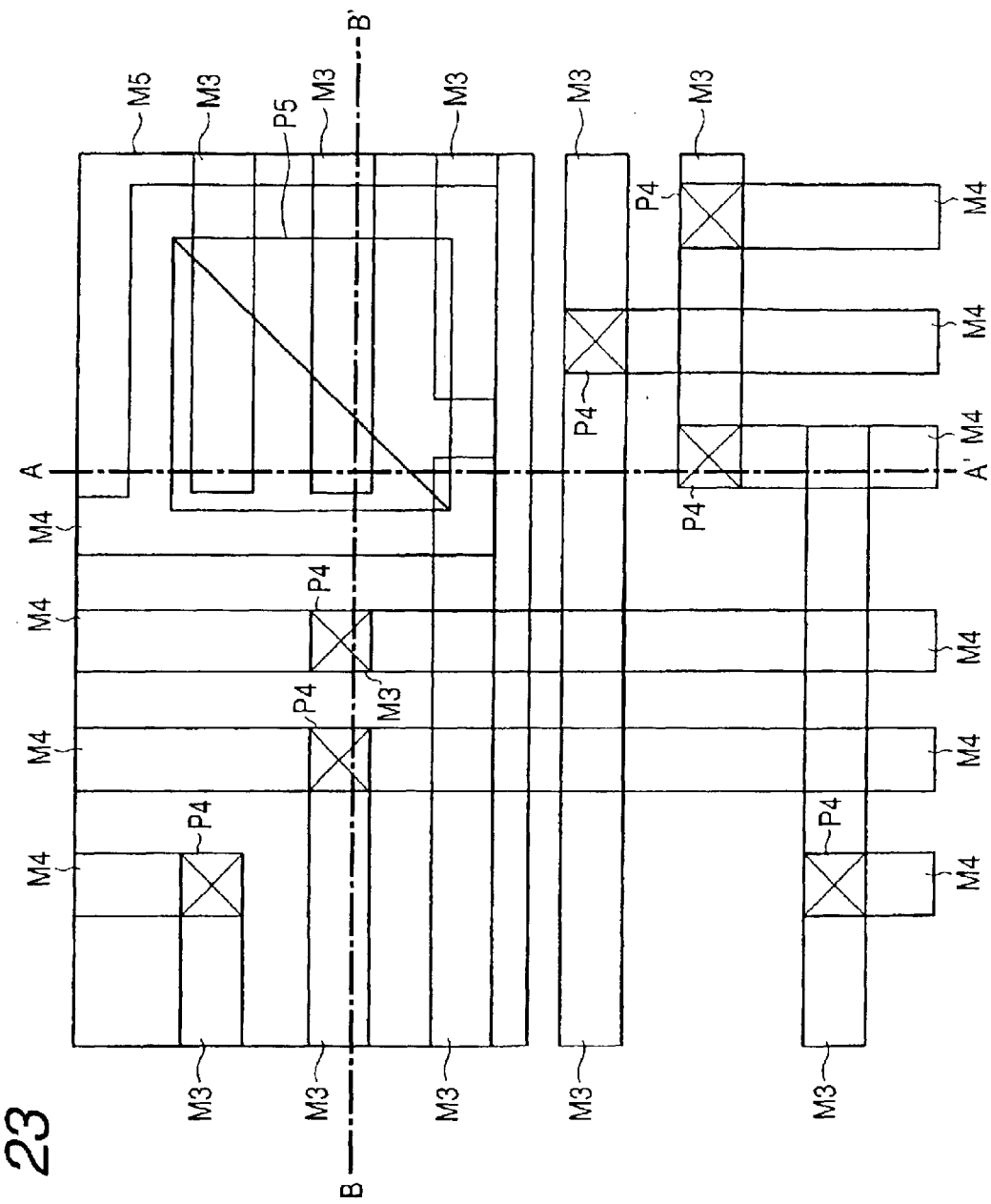
FIG. 23 is a fragmentary plane view of a substrate illustrating a step in the manufacturing method for production of the semiconductor device according to Embodiment 1 of the present invention.

FIGS. 19 and 20 illustrate one example of a 5-layer interconnect (M1 to M5). FIGS. 21 to 23 are fragmentary plane views of the semiconductor device shown in FIGS. 19 and 20, in which FIG. 19 corresponds to the A—A' cross-section, while FIG. 20 corresponds to the B—B' cross-section. FIG. 21 is a plane view clearly showing the disposition of the first-level interconnect M1 to fifth-level interconnect M5. In order to facilitate an understanding of it, FIG. 22 illustrates the disposition of the first-level interconnect M1 to third-level interconnect M3, while FIG. 23 illustrates the disposition of the third-level interconnect M3 to fifth-level interconnect M5.

As illustrated in FIGS. 19 to 23, the third-level interconnect M3 and a plug P3 which lies thereunder can be formed in a similar manner to that employed for the second-level interconnect M2 and the plug 2 which lies thereunder.

More specifically, after formation of a wiring trench (HM3) and contact hole (C3) in insulating films (28 and 30), a barrier film (PM3a) and copper film (PM3b and PM3c) are successively formed over the insulating films including the insides of the wiring trench (HM3) and contact hole (C3). In the contact hole C3, a plug P3 is formed.

Upon formation of the contact hole (C3), the tungsten film (CM2) formed over the surface of the interconnect which lies under the contact hole is removed in advance. Prior to the formation of the copper film (PM3b), the barrier film (PM3a) is removed from the bottom of the contact hole (C3). It is also possible to remove the barrier film (PM3a) from the bottom of the contact hole (C3) while forming the copper film (PM3b).

As a result, the effects as described above, such as reduction in contact resistance between the interconnect (M3) and plug (P3) and improvement in electromigration resistance, are available.

As illustrated in FIGS. 19 and 20, the third-level interconnect M3 is connected to the fourth-level interconnect M4 via a barrier film PM4a and a tungsten film CM3, while the fourth-level interconnect M4 is connected to the fifth-level interconnect M5 via a barrier film PM5a and a tungsten film CM4. As illustrated in FIGS. 21 and 23, the width of each of the third-level interconnect M3 to the fifth-level interconnect M5 is wide, so that a large connecting region (diameter of the plug 4 or 5) can be secured. Even when the barrier films (PM4a,PM5a) and tungsten films (CM3,CM4) exist, the contact resistance can be suppressed to a relatively small level. By the omission of the step of removing these films from the connection region, the simplification of the steps can be attained. With regard to the barrier film, PM5a constituting the fifth-level interconnect M5, is, for example, a TiN film, a two-layer film of Ti and TiN, or three-layer film of Ti, TiN and Ti; PM5b is an aluminum (Al) or Al alloy film; and PM5c thereover is a TiN film or a two-layer film of Ti and TiN. Over the fifth-level interconnect M5, a laminate film 38 formed of a silicon oxide film and a silicon nitride film is formed as a protective film.

As illustrated in FIGS. 19 and 20, the tungsten film CM5 over the fifth-level interconnect M5 may be formed to be thinner than the tungsten film CM4 over the fourth-level interconnect M4. By adjusting the tungsten film (second capping barrier metal film) over the fifth-level interconnect to be thinner than the tungsten film (first capping barrier metal film) over the fourth-level interconnect, the connection resistance with the upper-layer interconnect can be reduced. By forming the lower tungsten film to be thicker than the upper one, a good margin of reliability can be maintained.

On the contrary, with regards to the tungsten films CM4, CM5 over the fourth-level interconnect M4 and fifth-level interconnect M5, the tungsten film CM4 may be formed thinner than the tungsten film CM5. A contact hole formed over the upper-layer interconnect usually has a large diameter so that an increase in the thickness of the tungsten film (second capping barrier metal film) over the upper-layer interconnect has no influence on the connection resistance. By thickening the tungsten film over the upper-layer interconnect within an extent not affecting the connection resistance, the margin of reliability can be maintained. Since the layout rule of the upper-layer interconnect is not so severe, the possibility of a short-circuit, which may occur by thickening of the tungsten film, can be reduced. Thinning of the tungsten film (first capping barrier metal film) over the lower-layer interconnect makes it possible to reduce the unevenness on the surface of the interconnect and reduce the possibility of a short circuit between interconnects. Such unevenness becomes prominent as the number of layers to be stacked increases. If the surface of the interconnect becomes markedly irregular, it can be flattened using a coated film as the insulating film over the interconnect. The tungsten films CM4,CM5 over the fourth-level interconnect M4 and fifth-level interconnect M5 were so far described, which description equally applies to the tungsten films CM3,CM4 over the third-level interconnect M3 and fourth-level interconnect M4, or the tungsten films CM2,CM3 over the second-level interconnect M2 and the third level-interconnect M3.

After formation of the laminate film 38, the substrate surface is subjected to $NH_3$ plasma treatment. This treatment causes 1) reduction of the surface of a copper film constituting the interconnects (M1 to M4) formed over the substrate, 2) nitriding of the surface of the copper film, 3) cleaning of the surface of the insulating film, such as TEOS film, formed over the substrate, 4) recovery from the damage of the surface of the insulating film, or 5) nitriding of the surface of the insulating film. As a result, ionization of copper constituting the interconnect can be suppressed. In addition, diffusion of copper ions in the insulating film can be prevented, whereby characteristics of the insulating film can be improved.

(Embodiment 2)

In this Embodiment, an example of the laminated structure of an insulating film, in which a wiring trench and a contact hole are to be formed, will be described.

Figure 24:
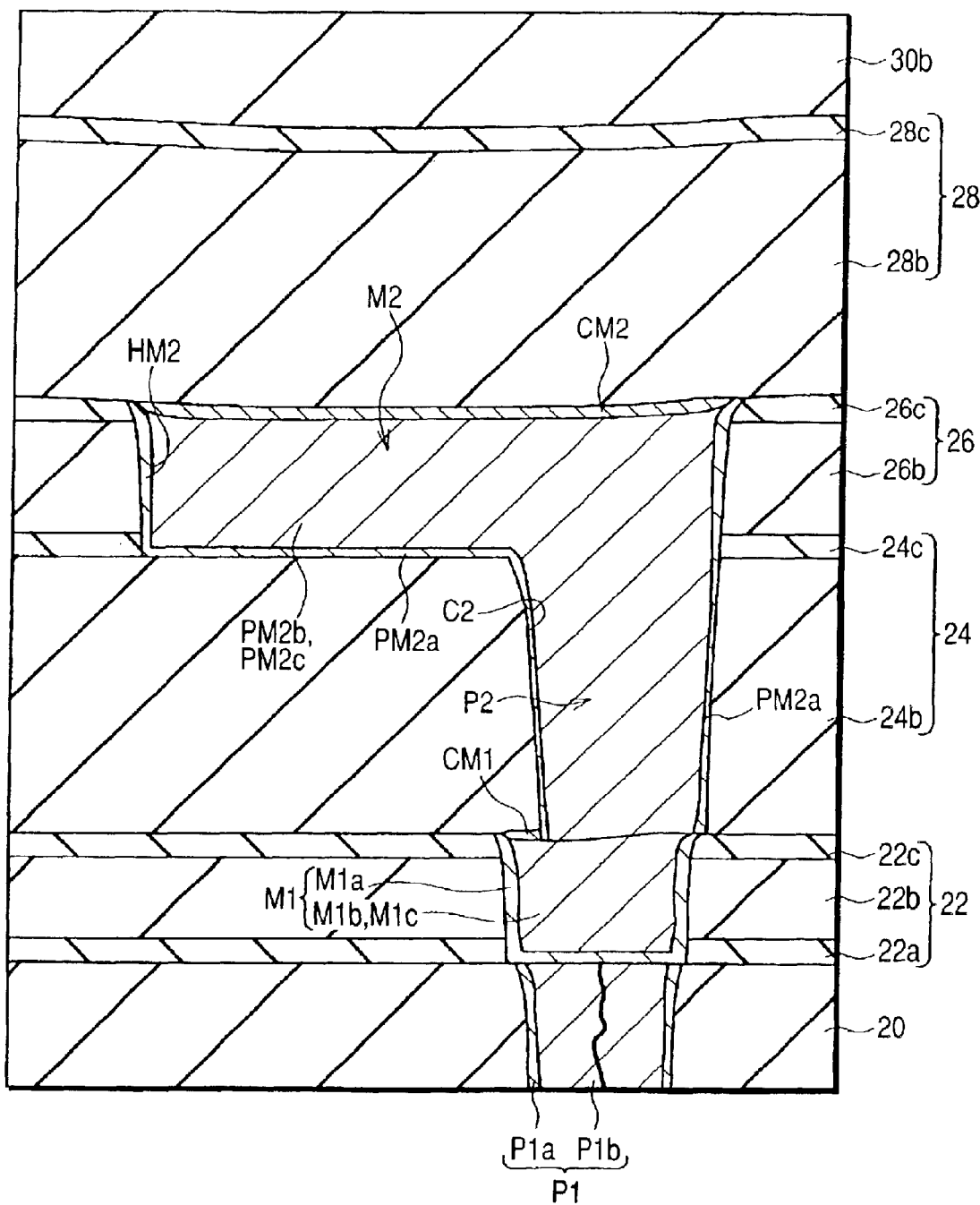
FIG. 24 is a fragmentary cross-sectional view of a substrate illustrating a step in the manufacturing method for production of a semiconductor device according to Embodiment 2 of the present invention.

(1) In Embodiment 1, the wiring trench HM2 and contact hole C2 were formed in a five-layer insulating film (24a, 24b, 24c, 26b, 26c) (refer to FIG. 12), but of these films, film 24a may be omitted. FIG. 24 is a fragmentary cross-sectional view of a substrate illustrating the manufacturing method for fabrication of a semiconductor device according to Embodiment 2 of the present invention.

The semiconductor device of this Embodiment of the present invention will be described in accordance with its manufacturing method. The steps up to the formation of the first-level interconnect M1 and the tungsten film CM1 thereover are similar to those of Embodiment 1, which steps were described with reference to FIGS. 1 to 6, so that the description of them will be omitted.

Then, as illustrated in FIG. 24, an SiOC film 24b and a TEOS film 24c are deposited as an insulating film successively over the TEOS film 22c and tungsten film CM1 by CVD. Over the TEOS film 24c, a low dielectric constant insulating film 26b, using a coating material, such as aromatic polymer material, and a TEOS film 26c are successively formed as an insulating film. The properties and shape of these four films (24b, 24c, 26b, 26c) were as described in detail in Embodiment 1.

In the SiOC film 24b of these four films (24b, 24c, 26b, 26c), a contact hole C2 for the formation of a plug (connecting portion) P2 for connecting the first-level interconnect M1 and the second-level interconnect M2 is formed; while, in the TEOS film 24c, low dielectric constant insulating film 26b and TEOS film 26c, a wiring trench HM2 is formed.

As in Embodiment 1, a hard mask (not illustrated) having an opening in a second-level interconnect formation region is formed over the TEOS film 26, followed by the formation of a resist film (not illustrated) having an opening in a connecting region of the first-level interconnect with the second-level interconnect.

Using the resist film as a mask, the insulating films 26 and 24 are removed to form the contact hole C2. After removal of the resist film, the insulating film 26 and TEOS film 24 are removed using the hard mask as a mask to form the wiring trench HM2. The contact hole C2 may be formed after the formation of the wiring trench HM2.

The tungsten film CM1 exposed from the bottom of the contact hole C2 is removed, for example, by dry etching to expose a copper film M1c.

Steps on and after the formation of the second-level interconnect M2 and plug (connecting portion) P2 are similar to those used in Embodiment 1, so that only their outline will be described.

As in Embodiment 1, a barrier film PM2a is formed over the TEOS film 26 including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 and the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed.

As illustrated in FIG. 24, an SiOC film 28b and a TEOS film 28c are then deposited successively, as an insulating film by CVD over the TEOS film 26c and tungsten film CM2. These films are similarly formed to the SiOC film 24b and TEOS film 24c. Over the TEOS film 28c, a low dielectric constant insulating film 30b, using a coating material such as aromatic polymer material, and a TEOS film (not illustrated) are successively formed as an insulating film. These films are formed similarly to the low dielectric constant insulating film 22b and TEOS film 22c.

In the above-described four-layer insulating film, a wiring trench and a contact hole are formed in a similar manner to that employed for the formation of the wiring trench HM2 and contact hole C2, but illustration of this step is omitted.

According to this Embodiment, the wiring trench HM2 and contact hole C2 are formed in the four-layer insulating film (24b, 24c, 26b, 26c) so that their formation can be simplified compared with that in Embodiment 1.

Since the tungsten film CM1 and the barrier film PM2a between the first-level interconnect M1 and plug P2 are removed, the contact resistance between the first-level interconnect M1 and the plug P2 can be reduced, and the electromigration resistance can be improved. Thus, effects as described in Embodiment 1 are available.

Figure 25:
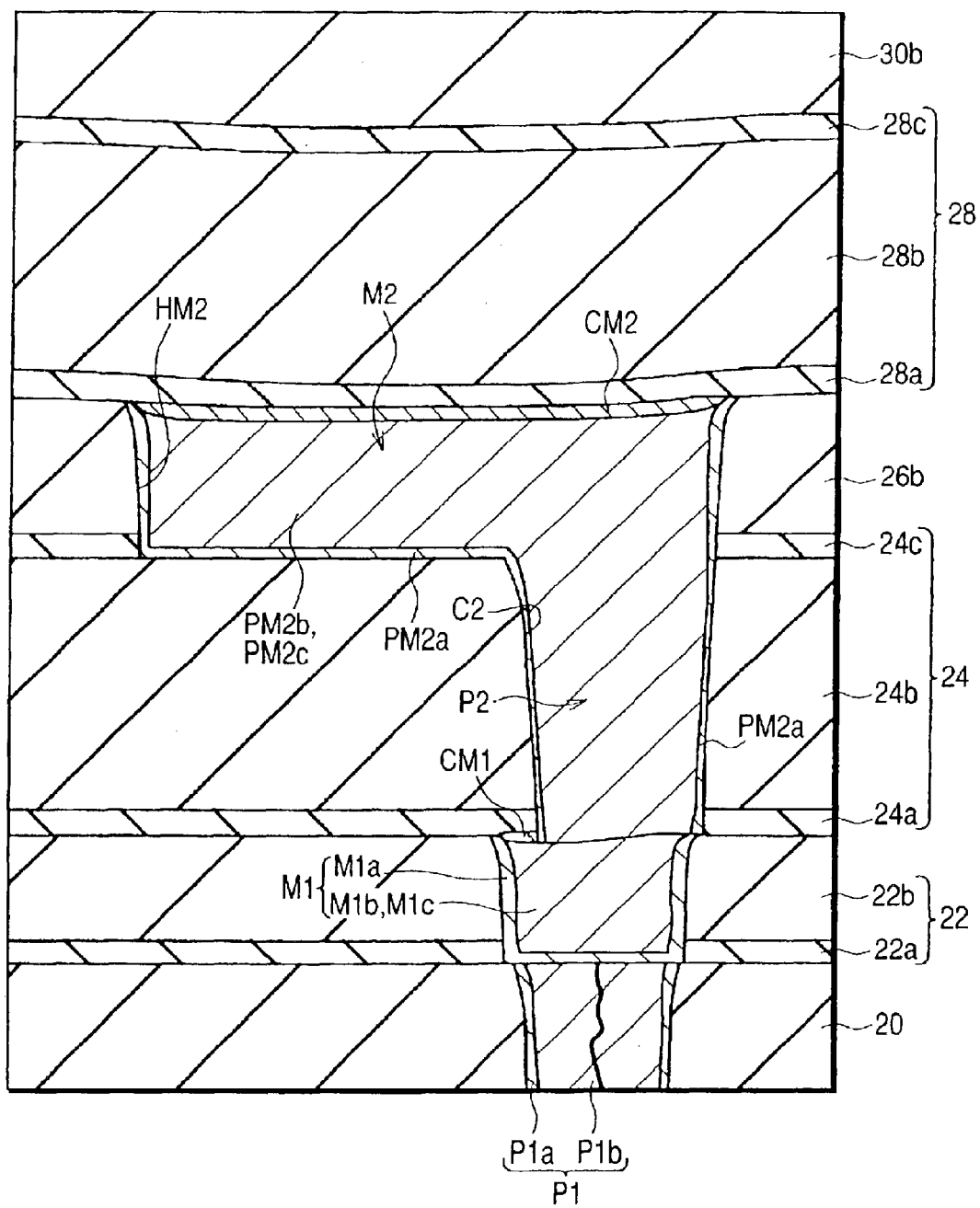
FIG. 25 is a fragmentary cross-sectional view of a substrate illustrating a step in the manufacturing method for production of the semiconductor device according to Embodiment 2 of the present invention.

(2) In Embodiment 1, the wiring trench HM2 and contact hole C2 were formed in the five-layer insulating film (24a, 24b, 24c, 26b, 26c), however, the insulating film 26c may be omitted from these five insulating films. FIG. 25 is a fragmentary cross-sectional view of a substrate illustrating the manufacturing method for production of a semiconductor device according to Embodiment 2 of the present invention.

The semiconductor device of this embodiment of the present invention will be described in accordance with its manufacturing method. Steps up to the formation of the first-level interconnect M1 and the tungsten film CM1 thereover are similar to those described above in Embodiment 1 with reference to FIGS. 1 to 6, so that their description is omitted.

As illustrated in FIG. 25, a TEOS film 24a, an SiOC film 24b and another TEOS film 24c are successively deposited by CVD as an insulating film over the substrate 1 (first-level interconnect M1). Then, over the TEOS film 24c, a low dielectric constant insulating film 26b is formed as an insulating film using a coating material such as aromatic polymer material. The properties or shape of these four films (24a, 24b, 24c, 26b) are as described in detail in Embodiment 1.

In the SiOC film 24b and TEOS film 24a of these four films (24a, 24b, 24c, 26b), a contact hole C2 for the formation of a plug (connecting portion) P2 for connecting the first-level interconnect M1 with the second-level interconnect M2 is formed; while, in the TEOS film 24c and the low dielectric constant insulating film 26b, a trench HM2 is formed.

As in Embodiment 1, a hard mask (not illustrated) having an opening in a second-level interconnect formation region is formed over the low dielectric constant insulating film 26b, followed by the formation of a resist film (not illustrated) having an opening in a connecting region of the first-level interconnect with the second-level interconnect.

Using the resist film as a mask, the low dielectric constant insulating film 26b, TEOS film 24c and SiOC film 24b are removed to form the contact hole C2, followed by the removal of the resist film. Using the hard mask as a mask, the low dielectric constant insulating film 26b and TEOS film 24c are removed to form the wiring trench HM2, and the TEOS film 24a is removed from the bottom of the contact hole C2. The contact hole C2 may be formed after the formation of the wiring trench HM2.

The tungsten film CM1 exposed from the bottom of the contact hole C2 is removed, for example, by dry etching to expose a copper film M1c (first-level interconnect M1).

Steps on and after the formation of the second-level interconnect M2 and plug (connecting portion) P2 are similar to those of Embodiment 1, so that only their outline will be described.

As in Embodiment 1, a barrier film PM2a is formed over the low dielectric constant insulating film 26b including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby the second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed.

As illustrated in FIG. 25, a TEOS film 28a, an SiOC film 28b and another TEOS film 28c are then deposited successively as an insulating film by CVD over the low dielectric constant insulating film 26b and tungsten film CM2. These films are similarly formed to the TEOS films 24a and 24c, and the SiOC film 24b. Over the TEOS film 28c, a low dielectric constant insulating film 30b is formed as an insulating film using a coating material, such as an aromatic polymer material. This film is similarly formed to the low dielectric constant insulating film 22b.

In the above-described four-layer insulating film, a wiring trench and a contact hole are formed in a similar manner to that employed for the formation of the wiring trench HM2 and contact hole C2, but illustration of this step is omitted.

According to this Embodiment, the wiring trench HM2 and contact hole C2 are formed in the four-layer insulating film (24a, 24b, 24c, 26b) so that their formation can be simplified compared with that in Embodiment 1. The insulating film in which the first-level interconnect is to be formed may be constituted of the TEOS film 22a and low dielectric constant insulating film 22b, and the TEOS film 22c as shown in Embodiment 1 may be omitted. FIG. 25 illustrates the case in which film 22c is omitted.

Since the tungsten film CM1 and the barrier film PM2a between the first-level interconnect M1 and plug P2 are removed, the contact resistance between the first-level interconnect M1 and the plug P2 can be reduced, and the electromigration resistance can be improved. Thus, similar effects as described in Embodiment 1 are available.
(Embodiment 3)

Figure 26:
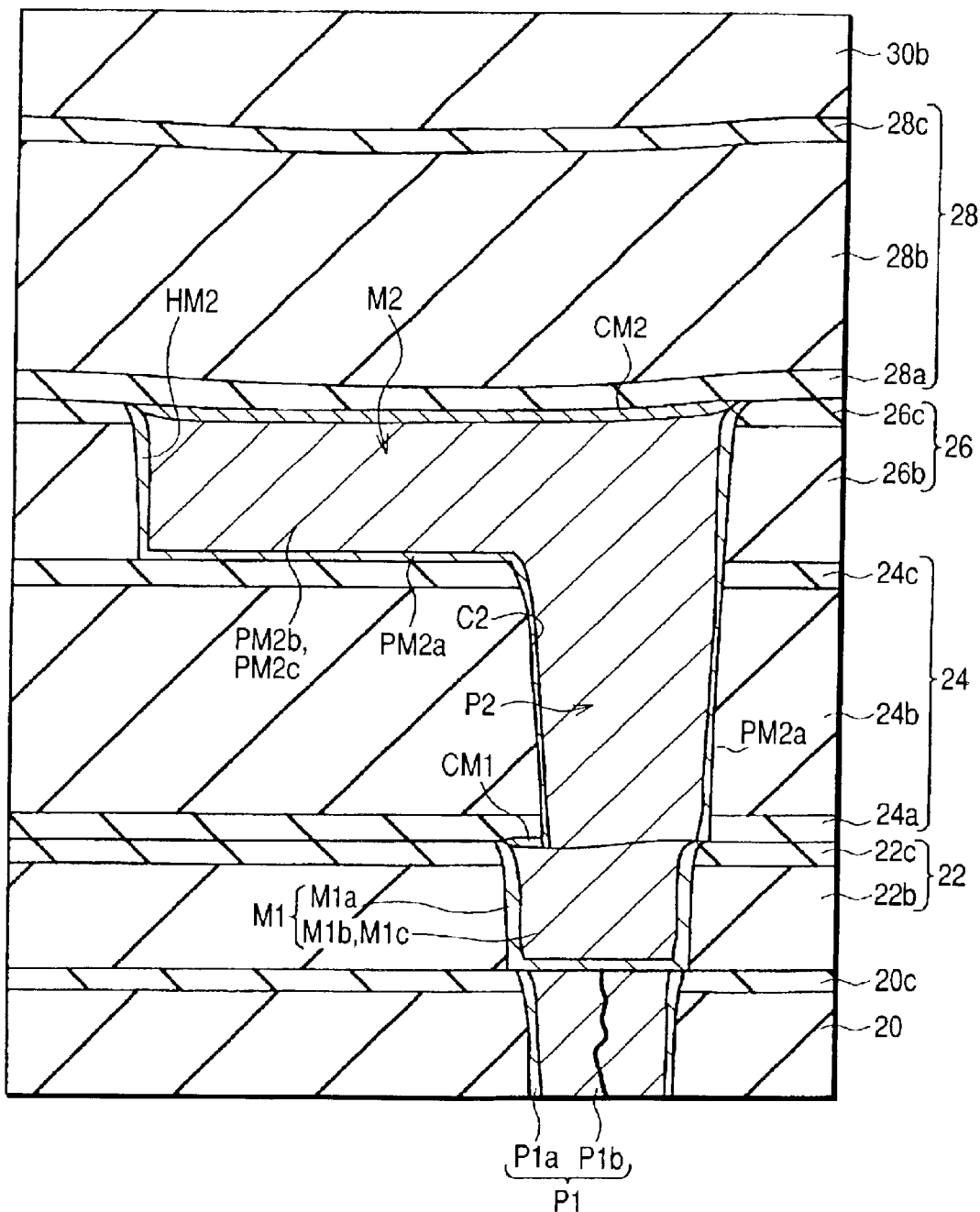
FIG. 26 is a fragmentary cross-sectional view of a substrate illustrating a step in the manufacturing method for production of a semiconductor device according to Embodiment 3 of the present invention.

In Embodiment 1, the wiring trench HM2 to embed the second-level interconnect M2 therein was formed in the insulating film 26 and TEOS film 24c. This wiring trench HM2 may be formed in the insulating film 26. FIG. 26 is a fragmentary cross-sectional view of a substrate illustrating the manufacturing method for production of a semiconductor device according to Embodiment 3 of the present invention.

The semiconductor device of this embodiment of the present invention will be described in accordance with its manufacturing method. Steps up to the formation of the first-level interconnect M1 and the tungsten film CM1 thereover are similar to those described above for Embodiment 1 with reference to FIGS. 1 to 6, so that their description is omitted.

As illustrated in FIG. 26, a TEOS film 24a, an SiOC film 24b and another TEOS film 24c are successively deposited by CVD as an insulating film over the TEOS film 22c and tungsten film CM1. Then, over the TEOS film 24c, a low dielectric constant insulating film 26b, using an aromatic polymer material, and a TEOS film 26c are successively formed as an insulating film. The properties or shape of these five films (24a, 24b, 24c, 26b, 26c) are as described in detail in Embodiment 1.

In the TEOS films 24a and 24c, and SiOC film 24b of these five films (24a, 24b, 24c, 26b, 26c), a contact hole C2 for the formation of a plug (connecting portion) P2 for connecting the first-level interconnect M1 and the second-level interconnect M2 is formed, while in the low dielectric constant insulating film 26b and TEOS film 26c, a wiring trench HM2 is formed.

As in Embodiment 1, a hard mask (not illustrated) having an opening in a second-level interconnect formation region is formed over the TEOS film 26c, followed by the formation, over the hard mask, of a resist film (not illustrated) having an opening in a connecting region of the first-level interconnect and the second-level interconnect.

Using the resist film as a mask, the insulating film 26 (26b, 26c), TEOS film 24c and SiOC film 24b are removed to form the contact hole C2, followed by the removal of the resist film. Using the hard mask as a mask, the insulating film 26 (26b, 26c) is removed to form the wiring trench HM2, and the TEOS film 24a is removed from the bottom of the contact hole C2. The contact hole C2 may be formed after the formation of the wiring trench HM2.

The tungsten film CM1 exposed from the bottom of the contact hole C2 is removed, for example, by dry etching to expose the copper film M1c.

Steps on and after the formation of the second-level interconnect M2 and plug (connecting portion) P2 are similar to those of Embodiment 1, so that only their outline will be described.

As in Embodiment 1, a barrier film PM2a is formed over the TEOS film 26c including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed.

As illustrated in FIG. 26, a TEOS film 28a, an SIOC film 28b and another TEOS film 28c are then deposited successively as an insulating film by CVD over the TEOS film 26c and tungsten film CM2. These films are similarly formed to the SiOC film 24b, and the TEOS films 24a and 24c. Over the TEOS film 28c, a low dielectric constant insulating film 30b, using an aromatic polymer material, and a TEOS film (not illustrated) are formed successively as an insulating film. These films are similarly formed to the low dielectric constant insulating film 22b and the TEOS film 22c.

In the above-described five-layer insulating film, a wiring trench and a contact hole are formed in a similar manner to that employed for the formation of the wiring trench HM2 and contact hole C2, but illustration of this step is omitted.

The wiring trench HM2 can thus be formed in the insulating film (26).

Also in this Embodiment, since the tungsten film CM1 and the barrier film PM2a between the first-level interconnect M1 and plug P2 are removed, the contact resistance between the first-level interconnect M1 and the plug P2 can be reduced, and the electromigration resistance can be improved. Thus, similar effects as described in Embodiment 1 are available.
(Embodiment 4)

Figure 27:
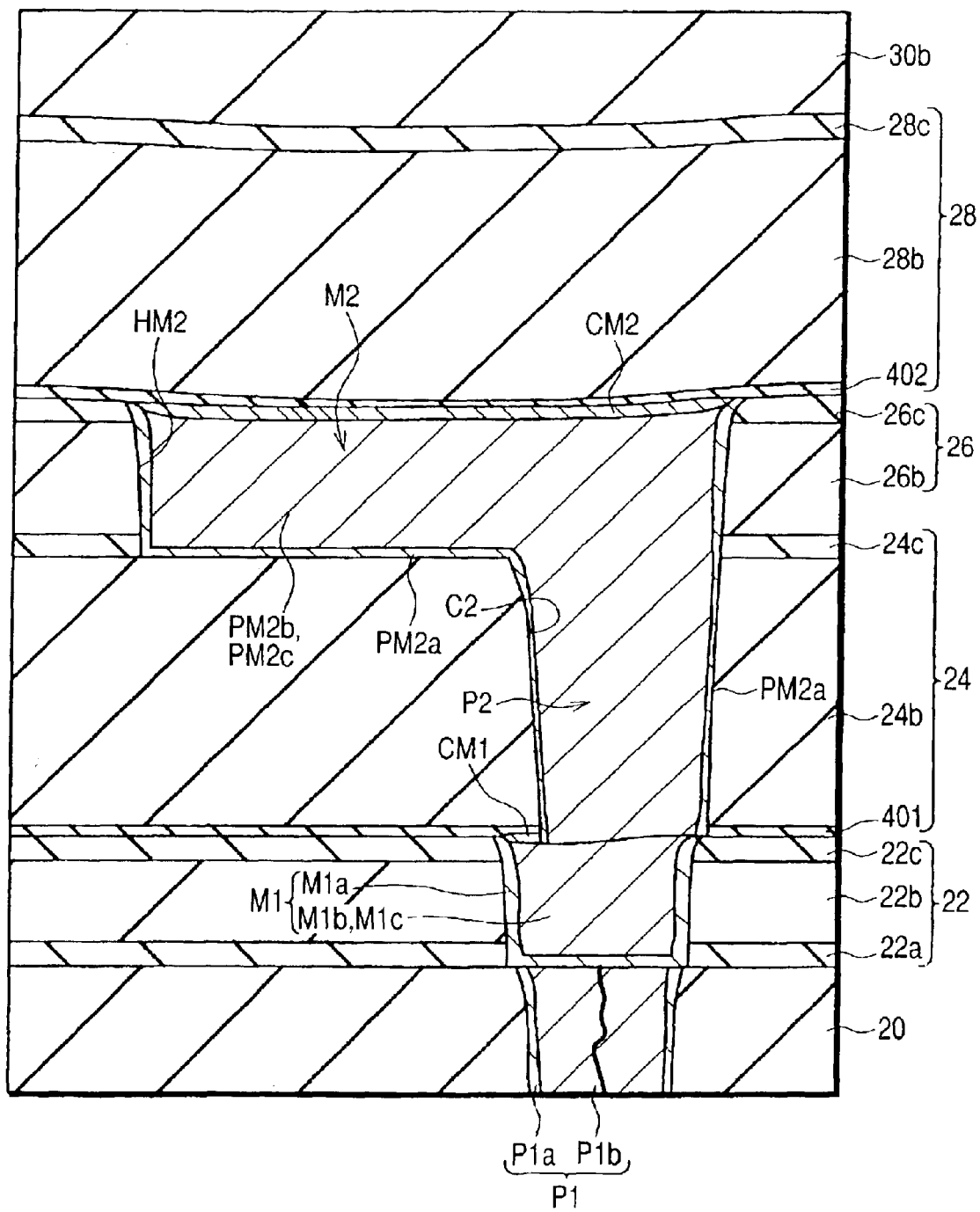
FIG. 27 is a fragmentary cross-sectional view of a substrate illustrating a step in the manufacturing method for production of a semiconductor device according to Embodiment 4 of the present invention.

In Embodiment 2, diffusion of copper, which constitutes an interconnect, into an insulating film and formation of an oxide due to the contact between a silicon oxide film and a copper film were prevented by forming tungsten films CM1,CM2 over interconnects M1,M2. The prevention of copper diffusion or oxidation may be reinforced by forming a thin silicon nitride film over these tungsten films. FIG. 27 is a fragmentary cross-sectional view of a substrate illustrating the manufacturing method for production of a semiconductor device according to Embodiment 4 of the present invention.

The semiconductor device of this embodiment of the present invention will be described in accordance with its manufacturing method. Steps up to the formation of the first-level interconnect M1 and the tungsten film CM1 thereover are similar to those described above in Embodiment 1 with reference to FIGS. 1 to 6, so that their description is omitted.

As illustrated in FIG. 27, a silicon nitride film 401 is deposited by CVD to serve as a copper diffusion preventive film or an antioxidant film. This silicon nitride film is formed to have a thickness of 20 nm or less, because, as described specifically in Embodiment 1, an effective dielectric constant of an insulating film existing between interconnects is reduced by thinning, as much as possible, the silicon nitride film having a large dielectric constant.

Then, over the silicon nitride film 401, an SiOC film 24b and a TEOS film 24c are successively deposited as an insulating film by CVD. Over the TEOS film 24c, a low dielectric constant insulating film 26b, using an aromatic polymer material, and another TEOS film 26c are successively formed as an insulating film. The properties or shape of these four films (24b, 24c, 26b, 26c) are as described in detail in Embodiment 1.

In the SiOC film 24b of these four films (24b, 24c, 26b, 26c) and the silicon nitride film 401, a contact hole C2 for the formation of a plug (connecting portion) P2 for connecting the first-level interconnect M1 and the second-level interconnect M2 is formed; while, in the TEOS film 24c, the low dielectric constant insulating film 26b, and the TEOS film 26c, a wiring trench HM2 is formed.

As in Embodiment 1, a hard mask (not illustrated) having an opening in a second-level interconnect formation region is formed over the TEOS 26c, followed by the formation of a resist film (not illustrated) having an opening in a connecting region of the first-level interconnect and the second-level interconnect.

Using the resist film as a mask, the TEOS film 24c and SiOC film 24b, among the insulating film 26 and insulating film 24, are removed to form the contact hole C2. After removal of the resist film, the insulating film 26 (26b, 26c) and TEOS film 24c are removed using the hard mask as a mask to form the wiring trench HM2. The contact hole C2 may be formed after the formation of the wiring trench HM2.

The silicon nitride film 401 exposed from the bottom of the contact hole C2 and the underlying tungsten film CM1 are removed, for example, by dry etching to expose a copper film M1c.

Steps on and after the formation of the second-level interconnect M2 and plug (connecting portion) P2 are similar to those of Embodiment 1, so that only their outline will be described.

As in Embodiment 1, a barrier film PM2a is formed over the TEOS film 26c including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed. Over the tungsten film CM2, then, a silicon nitride film 402 is deposited by CVD as a copper diffusion preventive film or an antioxidant film. This silicon nitride film is formed to have a thickness of 20 nm or less.

As illustrated in FIG. 27, an SiOC film 28b and a TEOS film 28c are then deposited successively as an insulating film by CVD over the silicon nitride film 402. These films are similarly formed to the SiOC film 24b and TEOS film 24c. Over the TEOS film 28c, a low dielectric constant insulating film 30b, using an aromatic polymer material, and a TEOS film (not illustrated) are formed successively as an insulating film. These films are similarly formed to the low dielectric constant insulating film 22b and TEOS film 22c.

In these insulating films, a wiring trench and a contact hole are formed in a similar manner to that employed for the formation of the wiring trench HM2 and contact hole C2, but illustration of this step is omitted.

According to this Embodiment, prevention of copper diffusion or oxidation can be reinforced, because thin silicon nitride films 401,402 are formed over the tungsten films CM1,CM2. By adjusting the thickness of these silicon nitride films 401,402 to 20 nm or less, the effective dielectric constant of the insulating film existing between interconnects can be reduced.

Since the tungsten film CM1 and the barrier film PM2a between the first-level interconnect M1 and plug P2 are removed, the contact resistance between the first-level interconnect M1 and the plug P2 can be reduced, and the electromigration resistance can be improved. Thus, similar effects as described in Embodiment 1 are available.

(Embodiment 5)

In Embodiment 1, the uppermost insulating film filled with the interconnects M1,M2 were TEOS films 22c,26c, which may be replaced by a silicon nitride film. Alternatively, a TMS film, SiC film or SiCN film, which is a barrier insulating film having a lower dielectric constant than that of a silicon nitride film, may be employed. Such a low dielectric constant insulating film can be formed by CVD, for example, by using trimethoxysilane and dinitrogen monoxide ($N_2O$). This film is composed mainly of SiON (this film will hereinafter be called a "TMS film"). Alternatively, an SiC film may be formed using trimethylsilane, or an SiCN film may be formed using trimethylsilane and ammonia.

In short, the TEOS films 22c,26c in Embodiment 1 are replaced in Embodiment 5 with barrier insulating films 501,502, such as a silicon nitride film, SiO film, TMS film, SiC film or SiCN film.

Figure 28:
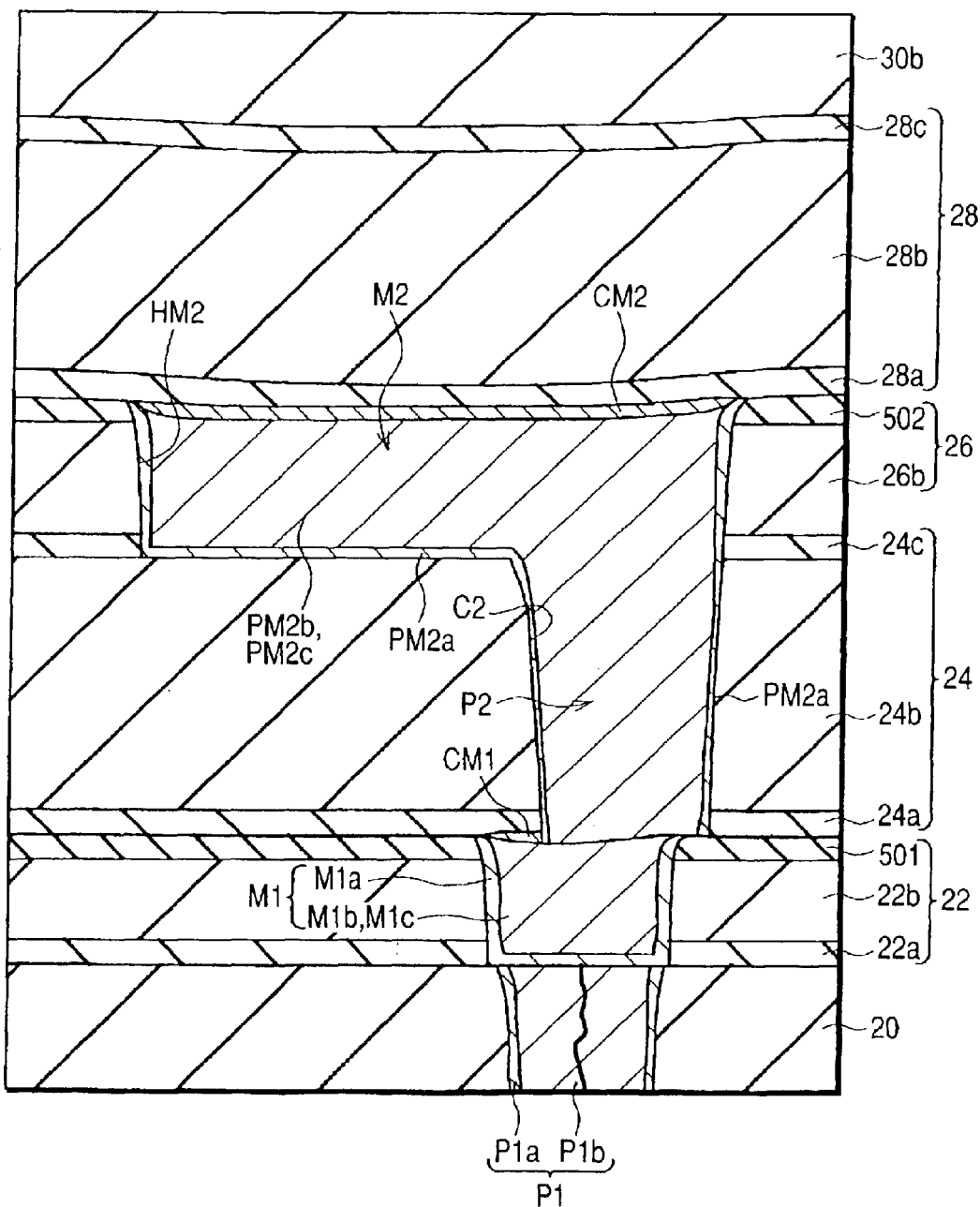
FIG. 28 is a fragmentary cross-sectional view of a substrate illustrating a step in the manufacturing method for production of a semiconductor device according to Embodiment 5 of the present invention.

FIG. 28 is a fragmentary cross-sectional view of a substrate for illustrating the manufacturing method for production of a semiconductor device according to Embodiment 5 of the present invention.

The semiconductor device of this embodiment of the present invention will be described in accordance with its manufacturing method. Steps up to the formation of a silicon oxide film 20 and a plug P1 embedded in this film are similar to those described above for Embodiment 1 with reference to FIG. 1, so that their description is omitted.

As illustrated in FIG. 28, a TEOS film 22a is formed as an insulating film over the silicon oxide film 20 and plug 1 as in Embodiment 1. Then, a low dielectric constant insulating film 22b is formed by application to the TEOS film 22a, followed by heat treatment. This low dielectric constant insulating film may be formed by CVD, instead.

Over the low dielectric constant insulating film 22b, a barrier insulating film 501, such as silicon nitride film, SiON film, TMS film, SiC film or SiCN film, is formed as a copper diffusion preventive film or an antioxidant film.

The low dielectric constant insulating film 22b is sandwiched by the films (22a, 501) formed by CVD in order to maintain the mechanical strength of the laminate film formed of them. In the three-layer insulating film (22) composed of TEOS film 22a, low dielectric constant insulating film 22b and barrier insulating film 501, such as a silicon nitride film, a wiring trench HM1 is formed.

The insulating film 22 (22a, 22b, 501) in which a first-level interconnect is to be formed is removed by photolithography and dry etching, whereby a wiring trench HM1 is formed. This wiring trench HM1 has a thickness of about 0.25 µm and a width of 0.18 µm.

Over the insulating film 22, including the inside of the wiring trench HM1, a barrier film M1a is deposited, for example, by sputtering, as in Embodiment 1, followed by the formation of a thin copper film M1b, to serve as a seed film for electroplating, over the barrier film M1a by ionized sputtering. A copper film M1c is then formed over the copper M1b, for example, by electroplating. This copper film M1c is formed so to embed in the wiring trench HM1.

In a reducing atmosphere, the substrate 1 is annealed (heat treated), followed by removal of the copper films M1c and M1b and barrier film M1a outside the wiring trench HM1 by CMP or etchback, whereby a first-level interconnect M1 composed of the copper films M1c, M1b and barrier film M1a is formed. At this time, in a region outside a first-level interconnect M1 formation region, the barrier film 501, such as silicon nitride film, SiON film, TMS film, SiC film, SiOC film, SiOCN film, or SiCN film, is exposed. Then, in a reducing atmosphere, the substrate 1 is annealed (heat treated).

As in Embodiment 1, selective growth or preferential growth of tungsten (W) as a capping conductive film is effected over the first-level interconnect M1, whereby a tungsten film CM1 of about 2 to 20 nm is formed over the first-level interconnect M1. Prior to the formation of the tungsten film CM1, washing or hydrogen treatment may be conducted. Alternatively, washing may be conducted after the formation of the tungsten film CM1.

Over the barrier insulating film 501, such as silicon nitride film, SiON film, TMS film, SiC film, SiOC film, SiOCN film, or SiCN film, and the tungsten film CM1, a TEOS film 24a, an SiOC film 24b and another TEOS film 24c are successively deposited by CVD to serve as an insulating film. Then, a low dielectric constant insulating film 26b using an aromatic polymer material is formed as an insulating film over the TEOS film 24c, followed by the formation of a barrier insulating film 502, such as a silicon nitride film, SiON film, TMS film, SiC film, SiOC film, SiOCN film, or SiCN film, in a similar manner to that employed for the formation of the barrier insulating film 501, such as a silicon nitride film, SiON film, TMS film, SiC film, SiOC film, SiOCN film, or SiCN film. The properties and shapes of these films 24a, 24b, 24c and 26b are as described in detail for Embodiment 1.

In the TEOS film 24a and SiOC film 24b of these five films (24a, 24b, 24c, 26b, 502), a contact hole C2 for the formation of a plug (connecting portion) P2 for connecting the first-level interconnect M1 with the second-level interconnect M2 is formed; while, in the TEOS film 24c, low dielectric constant insulating film 26b and silicon nitride film 502, a wiring trench HM2 is formed.

As in Embodiment 1, a hard mask (not illustrated) having an opening in a second-level interconnect formation region is formed over the barrier insulating film 502, followed by the formation of a resist film (not illustrated) having an opening in a connecting region of the first-level interconnect with the second-level interconnect.

Using the resist film as a mask, the insulating film 26 (502, 26b), TEOS film 24c and SiOC film 24b are removed to form the contact hole C2, followed by the removal of the resist film. Using the hard mask as a mask, the insulating film 26 (502 and 26b) and TEOS film 24c are removed to form the wiring trench HM2, and the TEOS film 24a is removed from the bottom of the contact hole C2. The contact hole C2 may be formed after the formation of the wiring trench HM2.

The tungsten film CM1 exposed from the bottom of the contact hole C2 is then removed, for example, by dry etching to expose a copper film M1c.

Steps on and after the formation of the second-level interconnect M2 and plug (connecting portion) P2 are similar to those in Embodiment 1, so that only their outline will be described.

As in Embodiment 1, a barrier film PM2a is formed over the barrier film 502, such as silicon nitride film, SiON film, TMS film, SiC film, SiOC film, SiOCN film, or SiCN film, including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b to serve as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed.

As illustrated in FIG. 28, a TEOS film 28a, an SiOC film 28b and a TEOS film 28c are then deposited successively as an insulating film by CVD over the barrier insulating film 502 and tungsten film CM2. These films are formed similarly to the SiOC film 24b and TEOS films 24a,24c. Over the TEOS film 28c, a low dielectric constant insulating film 30b, using an aromatic polymer material, and a silicon nitride film, SiON film, TMS film, SiC film, SiOC film, SiOCN film, or SiCN film (not illustrated), are successively formed as an insulating film. These films are similarly formed to the low dielectric constant insulating film 22b or the barrier insulating film 502, such as silicon nitride film, SiON film, TMS film, SiC film, SiOC film, SiOCN film or SiCN film.

In the above-described five-layer insulating film, a wiring trench and a contact hole are formed in a similar manner to that employed for the formation of the wiring trench HM2 and contact hole C2, but illustration of this step is omitted.

In this Embodiment, the barrier insulating films 501,502, such as the silicon nitride film, SiON film, TMS film, SiC film, SiOC film, SiOCN film and SiCN film, are employed as the uppermost insulating film in which the interconnects M1,M2 are to be embedded. So, even if mask misalignment occurs upon formation of the contact hole C2 and the pattern of the contact hole C2 (plug P2) invades the first-level interconnect M1 and reaches even to the silicon nitride film 501, this barrier insulating film 501 prevents diffusion of copper from the copper film constituting the plug P2; and, moreover, oxidation of the copper film due to the contact between the copper film and silicon oxide film (low dielectric constant insulating film 22b) can be prevented. A barrier insulating film having a thickness as thin as possible is preferred in order to reduce the effective dielectric constant of the insulating film existing between the interconnects.

When the interconnect width of the first-level interconnect M1 and the diameter of the contact hole C2 are designed to be equal for the purpose of increasing the density and degree of integration of interconnects, as illustrated in FIG. 28, misalignment of a mask due to margin latitude occurs between the first-level interconnect M1 and contact hole C2. Even if such a misalignment occurs, the barrier insulating film 501 formed on the bottom of the contact hole C2 can prevent diffusion of copper from the copper film constituting the plug P2 toward the insulating film 22b via the bottom of the contact hole C2.

Even if misalignment occurs as described above, the barrier properties against copper diffusion can thus be maintained on the bottom of the contact hole C2 so that the interconnect width of the first-level interconnect M1 and the diameter of the contact hole C2 can be designed to be equal, and the density and degree of integration of the interconnects can be increased without losing the reliability of the interconnect.

Since the tungsten film CM1 and the barrier film PM2a between the first-level interconnect M1 and the plug P2 are removed, the effects as described for Embodiment 1, such as a reduction in the contact resistance between the first-level interconnect M1 and plug P2 and the improvement in electromigration resistance, are available.

(Embodiment 6)

Figure 29:
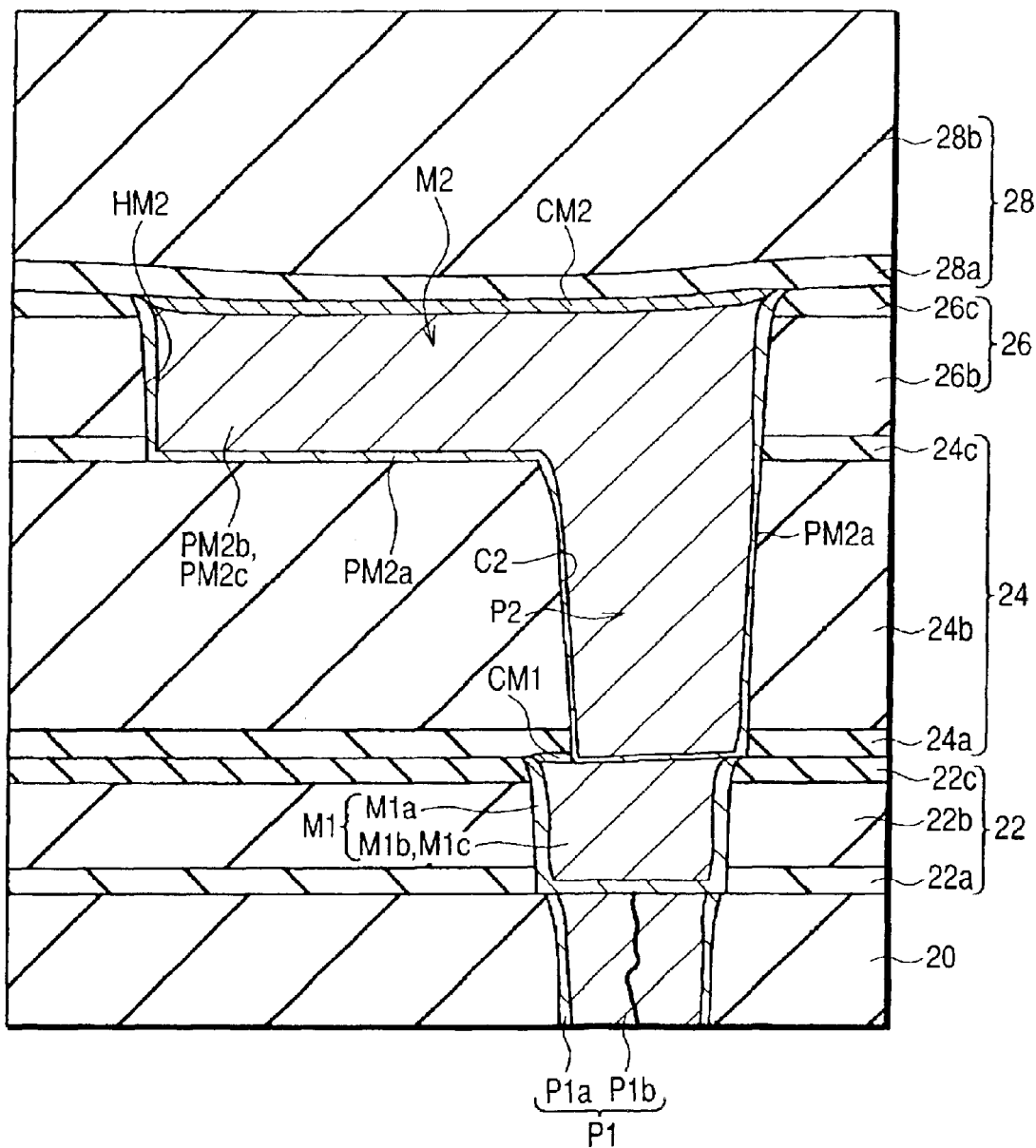
FIG. 29 is a fragmentary cross-sectional view of a substrate illustrating a step in the manufacturing method for production of a semiconductor device according to Embodiment 6 of the present invention.
Figure 30:
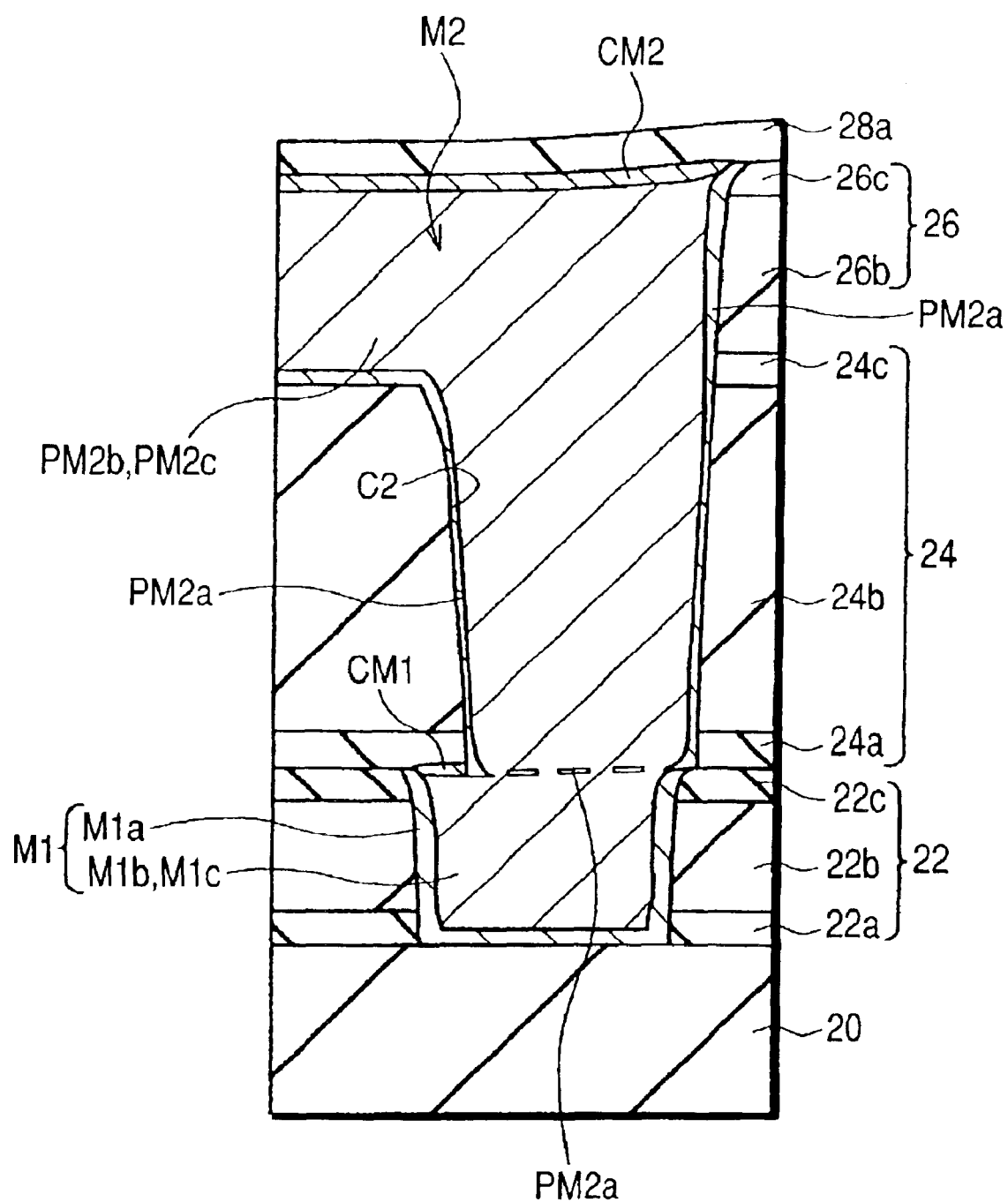
FIG. 30 is a fragmentary cross-sectional view of a substrate illustrating a step in the manufacturing method for production of a semiconductor device according to Embodiment 6 of the present invention.

In Embodiment 1, after removal of the barrier film PM2a from the bottom of the contact hole C2, copper films PM2b,PM2c were formed. The barrier film PM2a may be left between the second-level interconnect M2 and plug P2 without removing it from the bottom of the contact hole C2. FIGS. 29 and 30 are fragmentary cross-sectional views of a substrate for illustrating the manufacturing method for production of a semiconductor device according to Embodiment 6 of the present invention.

The semiconductor device of this embodiment of the present invention will be described in accordance with its manufacturing method. Steps up to the formation of the first-level interconnect M1 and the tungsten film CM1 thereover are similar to those described above for Embodiment 1 with reference to FIGS. 1 to 6, so that their description is omitted. In FIG. 29, the plug P1 in the silicon oxide film 20 is omitted (which will equally apply to FIGS. 30 to 32).

As illustrated in FIG. 29, a TEOS film 24a, an SiOC film 24b and another TEOS film 24c are successively deposited by CVD to serve as an insulating film over the substrate 1 (tungsten film CM1). Then, over the TEOS film 24c, a low dielectric constant insulating film 26b using an aromatic polymer material and a TEOS film 26c are successively formed as an insulating film. The properties or shape of these five films (24a, 24b, 24c, 26b, 26c) are as described in detail for Embodiment 1.

In the SiOC film 24b and TEOS film 24a of these five films (24a, 24b, 24c, 26b, 26c), a contact hole C2 for the formation of a plug (connecting portion) P2 for connecting the first-level interconnect M1 with the second-level interconnect M2 is formed; while, in the TEOS films 24c and 26c, and the low dielectric constant insulating film 26b, a trench HM2 is formed.

As in Embodiment 1, a hard mask (similar to that illustrated in FIG. 9) having an opening in a second-level interconnect formation region is formed over the TEOS film 26c, followed by the formation, over the hard mask, of a resist film (similar to that in FIG. 10) having an opening in a connecting region of the first-level interconnect and the second-level interconnect.

Using the resist film as a mask, the TEOS films 24c and 24a, and SiOC film 24b, among the TEOS film 26c, low dielectric constant insulating film 26b and insulating film 24, are removed to form the contact hole C2 (similar to that in FIG. 10). After removal of the resist film, the TEOS films 26c and 24c and low dielectric constant insulating film 26b are removed using the hard mask as a mask to form the wiring trench HM2 (similar to that in FIG. 11). The contact hole C2 may be formed after the formation of the wiring trench HM2.

The tungsten film CM1 exposed from the bottom of the contact hole C2 is removed, for example, by dry etching to expose a copper film M1c (similar to that in FIG. 12). The tungsten film CM1 may be removed completely, or a discontinuous tungsten film may be left on the bottom of the contact hole.

As in Embodiment 1, a barrier film PM2a is formed over the TEOS film 26c including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, after deposition of a thin copper film PM2b over the barrier film PM2a to serve as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed.

As illustrated in FIG. 29, an insulating film, such as TEOS film 28a, is then deposited over the TEOS film 26c and tungsten film CM2.

On the bottom of the contact hole C2, which is a joint portion of the first-level interconnect M1 and plug (connecting portion) P2, the barrier film PM2a is not removed from the bottom of the contact hole C2. This means that the number of the fabrication steps can be reduced compared with those of Embodiment 1, because only the tungsten film CM1 must be removed from the bottom of the contact hole C2, and the step of removing the barrier film PM2a from the bottom of the contact hole C2 can be omitted.

In this Embodiment, the tungsten film CM1 between the first-level interconnect M1 and the plug P2 is removed so that the contact resistance therebetween can be reduced. The reducing effect may be a little small because the barrier film PM2a exists between the first-level interconnect M1 and plug P2, but effects as described for Embodiment 1, such as improvement in electromigration resistance, are available. The copper film PM2b may be deposited after the barrier film PM2a is thinned by etching of the surface thereof.

Figure 37:
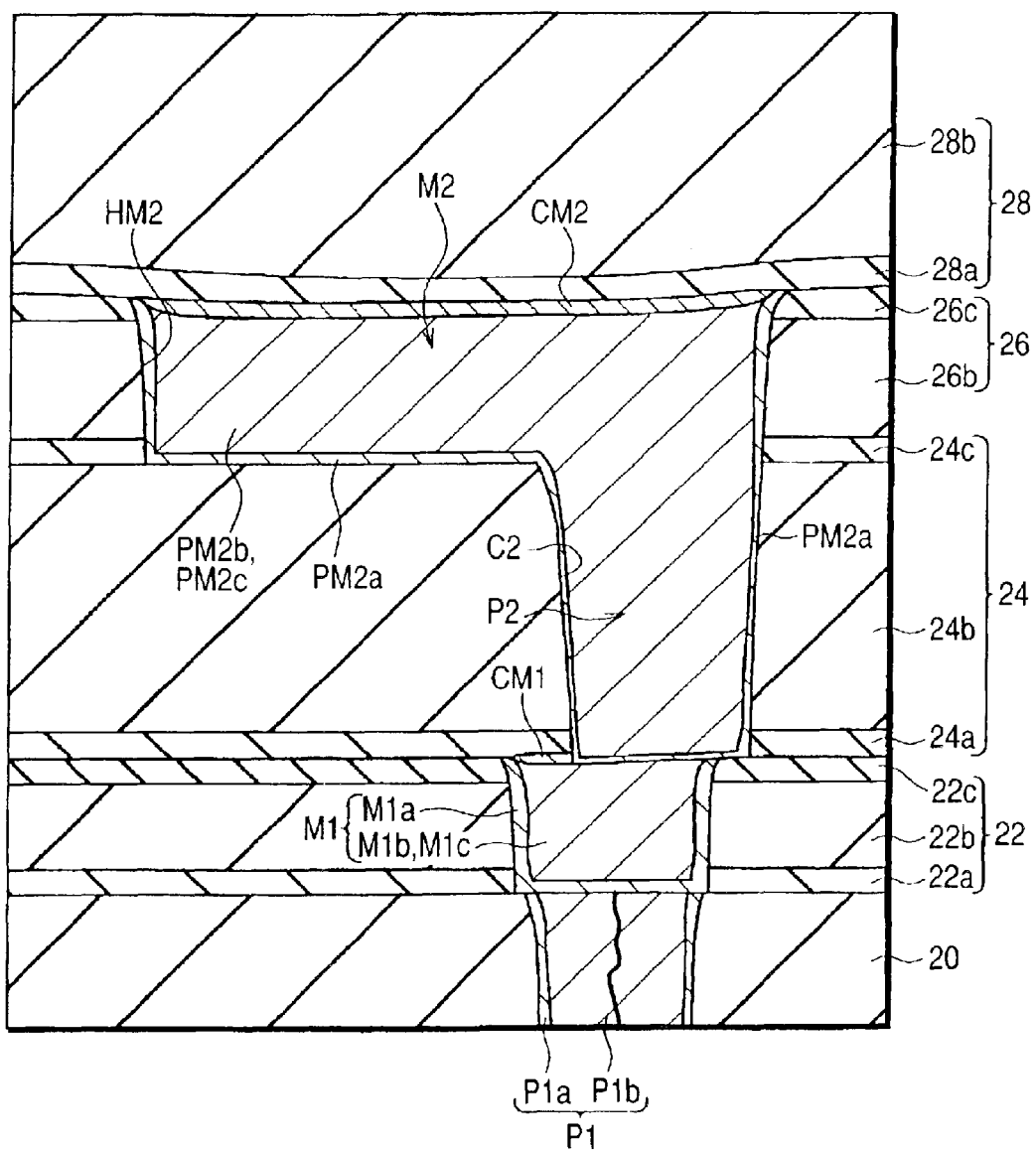
FIG. 37 is a fragmentary cross-sectional view of a substrate illustrating a step in the manufacturing method for production of a semiconductor device according to Embodiment 6 of the present invention.

FIG. 37 is directed to an example of the application of this Embodiment 6 to a case in which the interconnect width of the first-level interconnect M1 and the diameter of the contact hole C2 are designed to be equal for the purpose of increasing the density and the degree of integration of the interconnects. As illustrated in FIG. 37, when the interconnect width of the first-level interconnect M1 and the diameter of the contact hole C2 are designed to be equal, a mask misalignment occurs upon formation of the contact hole C2, and the pattern of the contact hole C2 is formed so as to invade the first-level interconnect M1 and to extend even to the low dielectric constant insulating film 22c. Even in such a case, diffusion of copper from the copper film constituting the plug P2 toward the insulating film 22c can be prevented on the bottom of the contact hole C2, because the barrier film PM2a is formed on the side walls and bottom of the contact hole C2. Moreover, oxidation of the copper film due to the contact between the copper film and silicon oxide film (TEOS film 22c) can be prevented.

Even if misalignment occurs, the barrier properties against copper diffusion can thus be maintained on the bottom of the contact hole C2, so that the interconnect width of the first-level interconnect M1 and the diameter of the contact hole C2 can be designed to be equal, and the density and the degree of integration of the interconnects can be increased without losing the reliability of the interconnect. In addition, a step of removing the barrier film PM2a from the bottom of the contact hole C2 can be omitted so that the number of fabrication steps can be reduced compared with that of Embodiment 1.

As illustrated in FIG. 30, the barrier film PM2a between the first-level interconnect M1 and plug P2 may be formed as a discontinuous film.

In such a case, the barrier film PM2a is not formed uniformly all over the bottom of the contact hole C2, but is partially formed. It is a discontinuous film which permits direct contact of the copper films M1c, M1b with the copper films PM2b, PM2c at portions in which the barrier film PM2a is not formed.

On the bottom of the contact hole C2, which is a joint between the first-level interconnect M1 and plug (connecting portion) P2, a barrier material for preventing copper diffusion is formed as a discontinuous film.

Such a discontinuous film can be formed, for example, by forming the barrier film PM2a over the TEOS film 26c, including the insides of the wiring trench HM2 and contact hole C2, while controlling the film forming conditions so as to make the barrier film markedly thin on the bottom of the contact hole C2.

Alternatively, such a discontinuous film can be formed in the following manner. After deposition, over the TEOS film 26c, including the insides of the wiring trench HM2 and contact hole C2, of the barrier film PM2a to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2, the barrier film PM2a is removed from the bottom of the contact hole C2. Upon removal, the etching conditions are controlled so as not to completely remove the barrier film.

As described above, if the barrier film PM2a existing between the first-level interconnect M1 and plug P2 is formed as a discontinuous film, the contact resistance therebetween can be reduced. In addition, it enables transfer of copper via the discontinuous portion of the barrier film PM2a, whereby effects such as improvement in the electromigration resistance, as described for Embodiment 1, are available.

(Embodiment 7)

Figure 31:
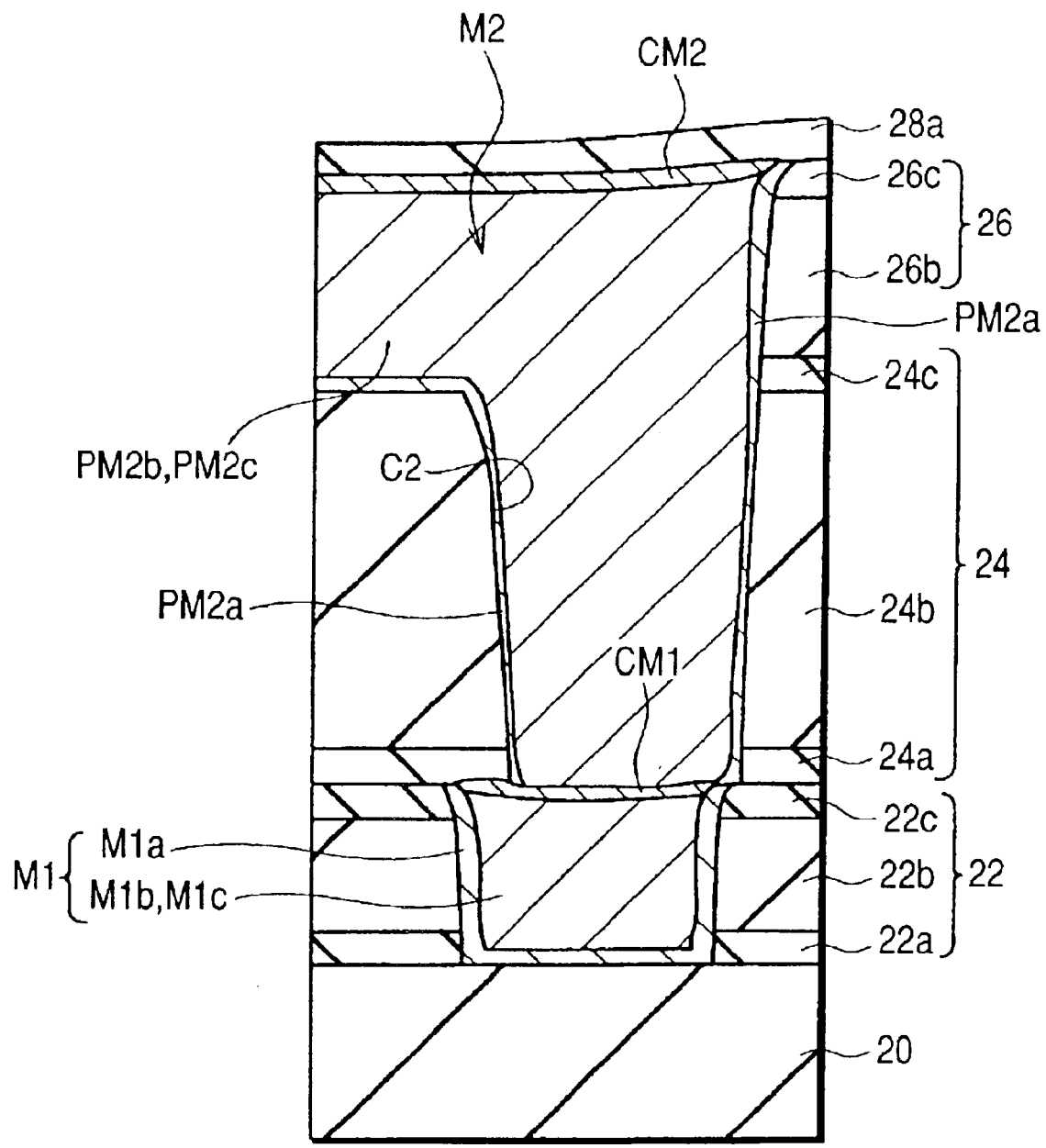
FIG. 31 is a fragmentary cross-sectional view of a substrate illustrating a step in the manufacturing method for production of a semiconductor device according to Embodiment 7 of the present invention.

In Embodiment 1, the copper films PM2b, PM2c were formed after removal of the tungsten film CM1 from the bottom of the contact hole C2. Alternatively, the tungsten film CM1 may be left between the second-level interconnect M2 and plug P2 without removing it from the bottom of the contact hole C2. FIG. 31 is a fragmentary cross-sectional view of a substrate for illustrating the manufacturing method for production of a semiconductor device according to Embodiment 7 of the present invention.

The semiconductor device of this Embodiment of the present invention will be described in accordance with its manufacturing method. The steps up to the formation of the first-level interconnect M1 and the tungsten film CM1 thereover are similar to those of Embodiment 1, as described with reference to FIGS. 1 to 6, so that the description of them are omitted.

As illustrated in FIG. 31, insulating films such as a TEOS film 24a, an SiOC film 24b and another TEOS film 24c are deposited successively over the substrate 1 (tungsten film CM1) by CVD. Over the TEOS film 24c, a low dielectric constant insulating film 26b using an aromatic polymer material and a TEOS film 26c are successively formed as an insulating film. The properties and shape of these five films (24a, 24b, 24c, 26b, 26c) are as described in detail for Embodiment 1.

In the SiOC film 24b and TEOS film 24a, of these five films (24a, 24b, 24c, 26b, 26c), a contact hole C2 for the formation of a plug (connecting portion) P2 for connecting the first-level interconnect M1 with the second-level interconnect M2 is formed, while in the TEOS films 24c and 26c, and in low dielectric constant insulating film 26b, a wiring trench HM2 is formed.

As in Embodiment 1, a hard mask (similar to that of FIG. 9) having an opening in a second-level interconnect formation region is formed over the TEOS film 26c, followed by the formation of a resist film (similar to that of FIG. 10) having an opening in a connecting region of the first-level interconnect and the second-level interconnect.

Using the resist film as a mask, the TEOS film 26c, low dielectric constant insulating film 26b, TEOS films 24c and 24a, and SiOC film 24b are removed to form the contact hole C2 (similar to that of FIG. 10). After removal of the resist film, the TEOS films 26c and 24c, and low dielectric constant insulating film 26b are removed using the hard mask as a mask to form the wiring trench HM2. The contact hole C2 may be formed after the formation of the wiring trench HM2 (similar to that of FIG. 11). The hard mask MK is then removed. The second-level interconnect M2 and plug (connecting portion) P2 will next be formed while the tungsten film CM1 is exposed from the bottom of the contact hole C2. Steps on and after the formation of the second-level interconnect M2 and plug P2 are similar to those of Embodiment 1, so that only their outline will be described.

As in Embodiment 1, a barrier film PM2a is formed over the TEOS film 26c, including the insides of the wiring trench HM2 and contact hole C2, from which the tungsten film CM1 is exposed. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, selective growth or preferential growth of tungsten (W) is effected over the second-level interconnect M2, whereby a tungsten film CM2 is formed.

Over the TEOS film 26c and tungsten film CM2, a TEOS film 28a is then deposited to serve as an insulating film, as illustrated in FIG. 31.

In this Embodiment, the barrier film PM2a between the first-level interconnect M1 and the plug P2 is removed, so that the contact resistance therebetween can be reduced. The reducing effect may be a little small, because the tungsten film CM1 exists between the first-level interconnect M1 and plug P2, but effects as described for Embodiment 1, such as improvement in electromigration resistances are available.

On the bottom of the contact hole C2, which is a joint portion of the first-level interconnect M1 and plug (connecting portion) P2, the tungsten film CM1 exists but the barrier film PM2a is not formed on the bottom of the contact hole C2. This means that the number of the fabrication steps can be reduced compared with those of Embodiment 1, because only the barrier film PM2a must be removed from the bottom of the contact hole C2, and the step of removing the tungsten film CM1 from the bottom of the contact hole C2 can be omitted.

Figure 38:
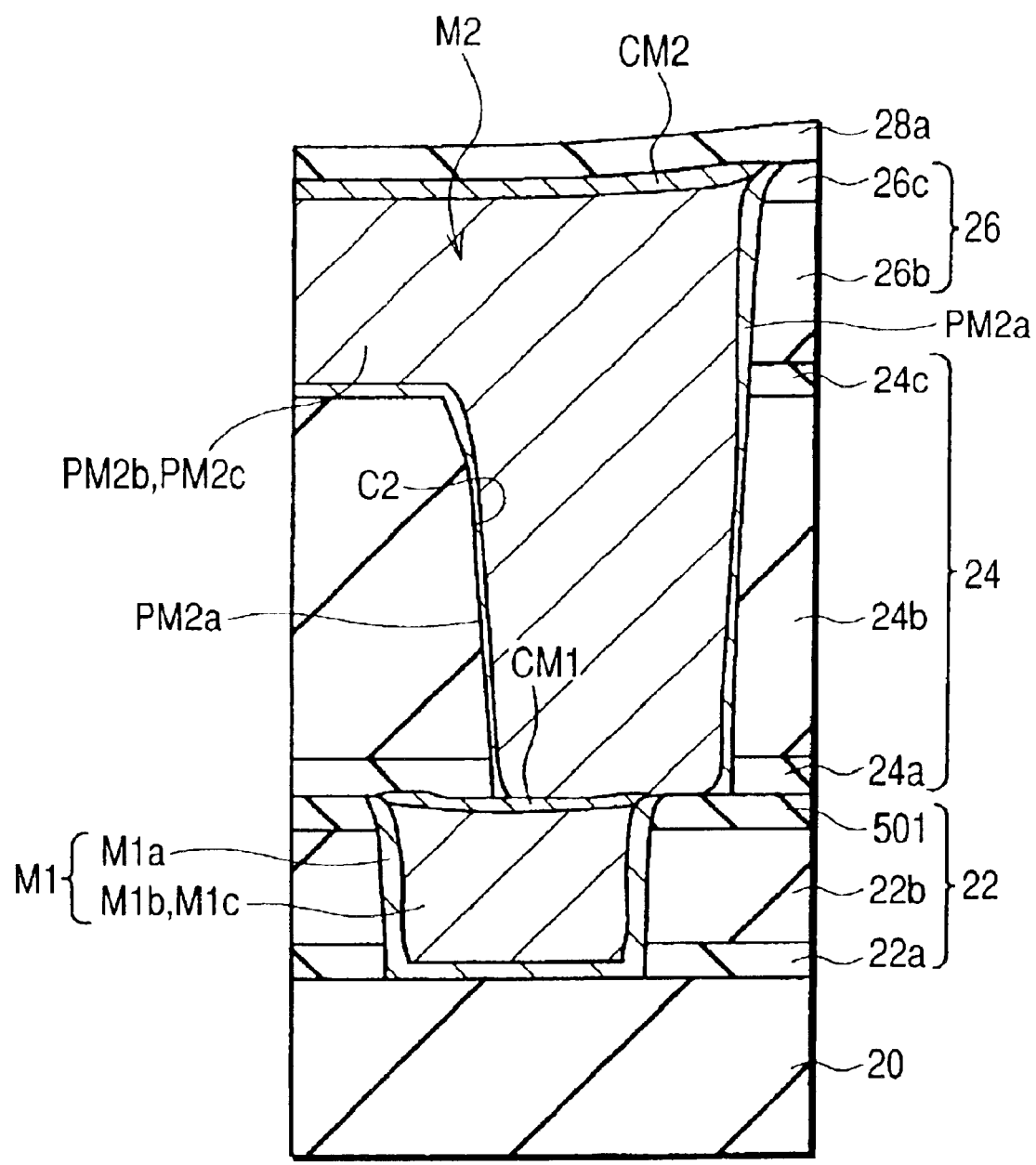
FIG. 38 is a fragmentary cross-sectional view of a substrate illustrating a step in the manufacturing method for production of a semiconductor device according to Embodiment 7 of the present invention.

FIG. 38 is directed to an example of the application of this Embodiment 7 to a case in which the interconnect width of the first-level interconnect M1 and the diameter of the contact hole C2 are designed to be equal for the purpose of increasing the density and the degree of integration of the interconnects. As illustrated in FIG. 38, an insulating film 22 has a constitution similar to that of Embodiment 5. More specifically, as illustrated in FIG. 38, after formation of an insulating film, such as TEOS film 22a as in Embodiment 5, over the silicon oxide film 20 and plug P1, a low dielectric constant insulating film 22b is formed by application onto the TEOS film 22a, followed by heat treatment. Alternatively, the low dielectric constant insulating film may be formed by CVD.

Then, over the low dielectric constant insulating film 22b, a barrier insulating film 501, such as a silicon nitride film, SiON film, TMS film, SiC film or SiCN film, is formed by CVD to serve as a copper diffusion preventive film or anti-oxidant film.

Steps on and after the above-described step are similar to those of Embodiment 7, as described above with reference to FIG. 31, so that description on them is omitted.

In this Embodiment, the barrier insulating film 501 is employed as the uppermost insulating film in which the interconnect M1 is to be embedded. So, even if mask misalignment occurs upon formation of the contact hole C2 and the pattern of the contact hole C2 invades the first-level interconnect M1 and even reaches the barrier insulating film 501, this barrier insulating film 501 on the bottom of the contact hole C2 can prevent diffusion of copper from the copper film constituting the plug P2 toward the insulating film 22b; and, moreover, it can prevent oxidation of the copper film due to the contact between the copper film and silicon oxide film (low dielectric constant insulating film 22b). A barrier insulating film having a thickness as thin as possible is preferred in order to reduce the effective dielectric constant of the insulating film existing between the interconnects.

Even if misalignment occurs, the barrier properties against copper diffusion can thus be maintained on the bottom of the contact hole C2 so that the interconnect width of the first-level interconnect M1 and the diameter of the contact hole C2 can be designed to be equal, and the density and degree of integration of the interconnects can be increased without losing the reliability of them. In addition, a step of removing the tungsten film CM1 from the bottom of the contact hole C2 can be omitted so that the number of fabrication steps can be reduced compared with that of Embodiment 1.

(Embodiment 8)

Figure 32:
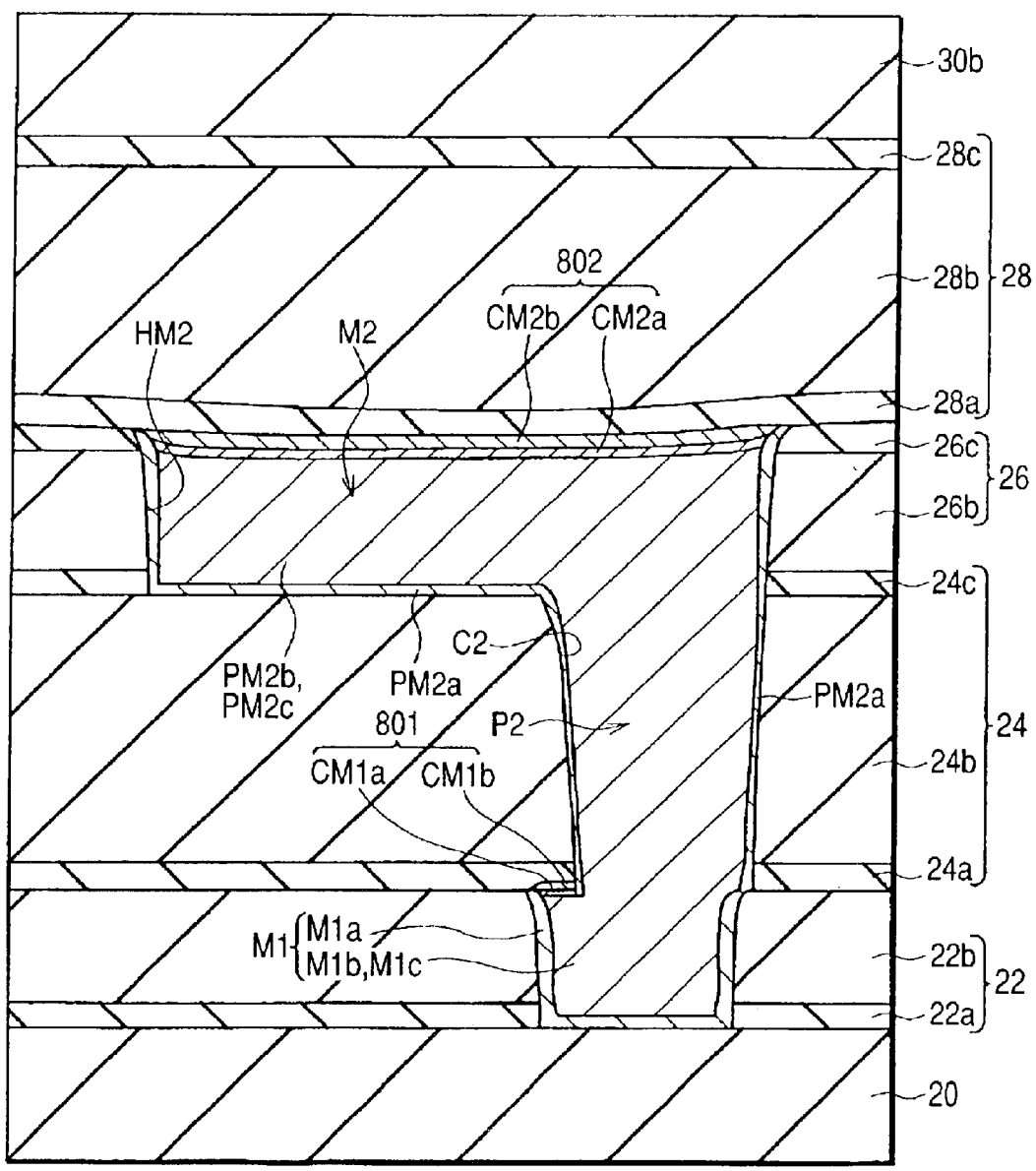
FIG. 32 is a fragmentary cross-sectional view of a substrate illustrating a step in the manufacturing method for production of a semiconductor device according to Embodiment 8 of the present invention.

In Embodiment 1, single-layer tungsten films CM1,CM2 are formed over the interconnects M1,M2 to serve as the capping conductive film. This capping conductive film may be replaced by a laminate film. FIG. 32 is a fragmentary cross-sectional view of a substrate illustrating the manufacturing method for production of a semiconductor device according to Embodiment 8 of the present invention.

The semiconductor device of this Embodiment of the present invention will be described in accordance with its manufacturing method. Steps up to the formation of the first-level interconnect M1 and the tungsten film CM1 thereover are similar to those described above for Embodiment 1 with reference to FIGS. 1 to 6, so that their description is omitted.

As illustrated in FIG. 32, the tungsten film CM1 is converted into a tungsten nitride film CM1a by treatment in a nitrogen atmosphere, followed by selective growth or preferential growth of tungsten (W) over the tungsten nitride film CM1a, as in Embodiment 1, whereby a tungsten film CM1b is formed. The resulting tungsten nitride film CM1a and tungsten film CM1b constitute a capping conductive film 801.

Over the substrate (tungsten film CM1b), a TEOS film 24a, an SiOC film 24b and another TEOS film 24c are successively deposited by CVD as an insulating film. Then, over the TEOS film 24c, a low dielectric constant insulating film 26b using an aromatic polymer material and a TEOS film 26c are successively formed to serve as an insulating film. The properties or shape of these five films (24a, 24b, 24c, 26b, 26c) are as described for detail in Embodiment 1.

In the SiOC film 24b and TEOS film 24a, among these five films (24a, 24b, 24c, 26b, 26c), a contact hole C2 for the formation of a plug (connecting portion) P2 for connecting the first-level interconnect M1 with the second-level interconnect M2 is formed; while, in the TEOS films 24c and 26c, and in the low dielectric constant insulating film 26b, a wiring trench HM2 is formed.

As in Embodiment 1, a hard mask (not illustrated) having an opening in a second-level interconnect formation region is formed over the TEOS film 26c, followed by the formation, over the hard mask, of a resist film (not illustrated) having an opening in a connecting region of the first-level interconnect and the second-level interconnect.

Using the resist film as a mask, the TEOS film 26c, the low dielectric constant insulating film 26b, the TEOS films 24c and 24a and the SiOC film 24b are removed to form the contact hole C2. After removal of the resist film, the TEOS films 26c,24c and the low dielectric constant insulating film 26b are removed using the hard mask as a mask, whereby the wiring trench HM2 is formed. The contact hole C2 may be formed after the formation of the wiring trench HM2.

The tungsten film CM1b exposed from the bottom of the contact hole C2 and the tungsten nitride film CM1a lying thereunder are removed, for example, by dry etching to expose a copper film M1c.

Steps on and after the formation of the second-level interconnect M2 and plug (connecting portion) P2 are similar to those of Embodiment 1, so that only their outline will be described.

As in Embodiment 1, a barrier film PM2a is formed over the TEOS film 26c, including the insides of the wiring trench HM2 and contact hole C2. It is deposited to a thickness of about 5 nm on the side walls of the wiring trench HM2, about 30 nm on the bottom of the wiring trench HM2, about 3 nm on the side walls of the contact hole C2 and about 20 nm on the bottom of the contact hole C2.

As in Embodiment 1, the barrier film PM2a is removed from the bottom of the contact hole C2. After deposition of a thin copper film PM2b to serve as a seed film for electroplating, a copper film PM2c is formed over the copper film PM2b by electroplating. In a reducing atmosphere, the substrate 1 is annealed (heat treated), followed by removal of the copper films PM2c and PM2b and barrier film PM2a outside the wiring trench HM2 and contact hole C2 by CMP or etchback, whereby a second-level interconnect M2 and a plug (connecting portion) P2 for connecting the first-level interconnect M1 with the second-level interconnect, each made of the copper films PM2b, PM2c and barrier film PM2a, are formed.

As in Embodiment 1, a tungsten nitride film CM2 and a tungsten film CM2b are formed over the second-level interconnect M2 in a similar manner to that employed for the formation of the tungsten nitride film CM1a and tungsten film CM1b.

As illustrated in FIG. 32, a TEOS film 28a, an SIOC film 28b and a TEOS film 28c are then deposited successively as an insulating film by CVD over the TEOS film 26c and tungsten film CM2b. Over the TEOS film 28c, a low dielectric constant insulating film 30b using an aromatic polymer material and a TEOS film (not illustrated) are formed successively to serve as an insulating film.

In the above-described five-layer insulating film, a wiring trench and a contact hole are formed in a similar manner to that employed for the formation of the wiring trench HM2 and contact hole C2, but illustration of this step is omitted.

In the above-described manner, the capping conductive films 801,802 over the interconnects can be formed as a laminate film.

Also in this Embodiment, since the tungsten film CM1a, tungsten film CM1b and the barrier film PM2a between the first-level interconnect M1 and the plug P2 are removed, the contact resistance therebetween can be reduced. In addition, effects as described for Embodiment 1, such as improvement of electromigration resistance, are available.

(Embodiment 9)

In Embodiment 1, the diameter of the contact hole was formed substantially equal to the width of the interconnect which lies thereunder. The width of the interconnect under the contact hole may be formed greater than the diameter thereof, or a joint region having a larger diameter than the contact hole may be disposed partially in the interconnect.

Figure 33:
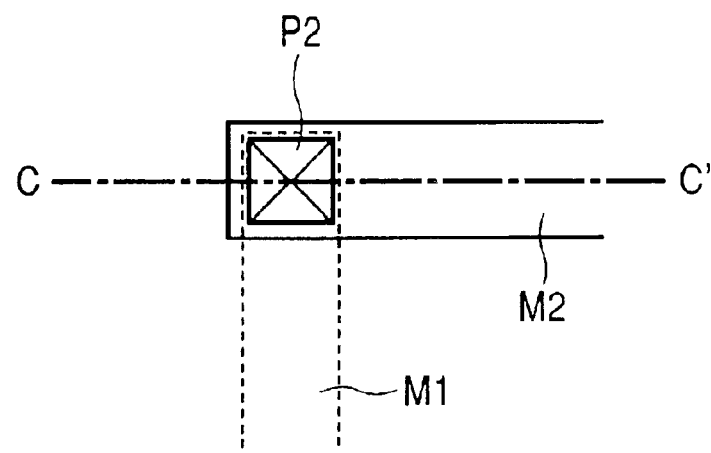
FIG. 33 is a fragmentary plane view of a substrate illustrating a step in the manufacturing method for production of a semiconductor device according to Embodiment of the present invention.
Figure 34:
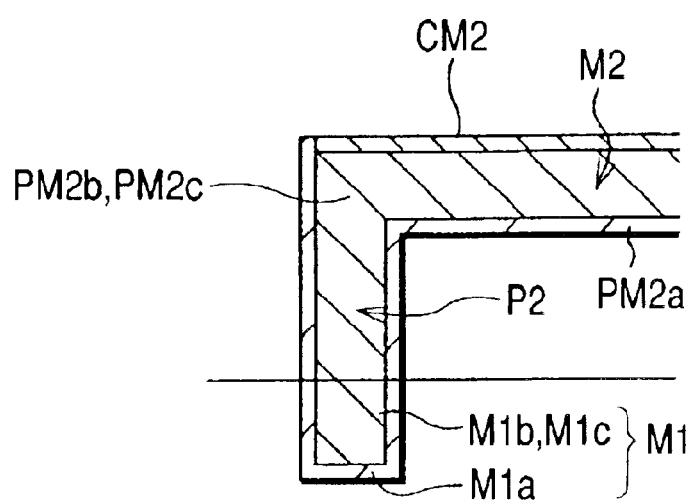
FIG. 34 is a fragmentary cross-sectional view of a substrate illustrating a step in the manufacturing method for production of a semiconductor device according to Embodiment of the present invention.

For example, in Embodiment 1, the diameter of the contact hole (such as C2) is almost equal to the width of the interconnect therebelow (for example, the width of M1), as illustrated in FIG. 22. FIG. 33 illustrates the patterns of the first-level interconnect M1, the second-level interconnect M2 and the plug P2 for connecting them. FIG. 34 is a cross-sectional view taken along a line C—C' of FIG. 33. As illustrated in FIG. 34, a barrier film PM2a is formed on the side walls or bottom of the contact hole (C2) in which the plug P2 is to be formed and the wiring trench (HM2) in which the second-level interconnect is to be formed. Although not illustrated in the cross-section of FIG. 34, a tungsten film CM1 is formed as a capping conductive film on the surface of the first-level interconnect M1. The barrier film PM2a and tungsten film CM1 between the plug P2 and interconnect M1 are removed so that the contact resistance therebetween can be reduced and the effects described for Embodiment 1, such as improvement in the electromigration resistance, are available.

Figure 35:
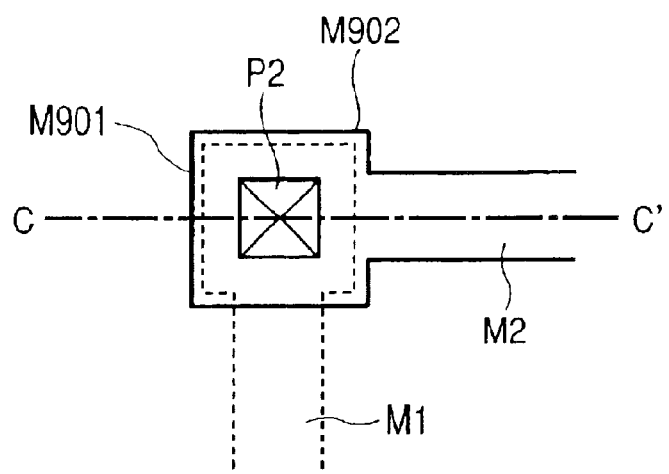
FIG. 35 is a fragmentary plane view of a substrate illustrating a step in the manufacturing method for production of a semiconductor device according to Embodiment 9 of the present invention.
Figure 36:
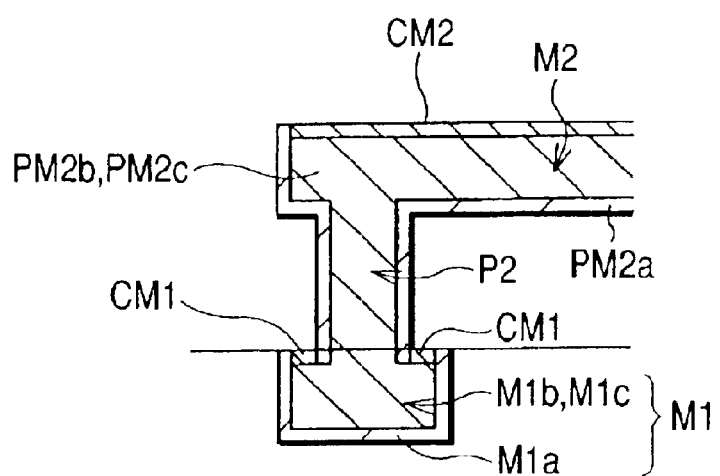
FIG. 36 is a fragmentary cross-sectional view of a substrate illustrating a step in the manufacturing method for production of the semiconductor device according to Embodiment 9 of the present invention.

As illustrated in FIG. 35, a joint region M901 may be disposed at the end of the first-level interconnect M1. This joint region M901 is formed to have a greater width than the first-level interconnect M1. At the end of the second-level interconnect M2, a joint region M902 is disposed. FIG. 35 illustrates the patterns of the first-level interconnect M1, the second-level interconnect M2 and the plug P2 for connecting them. FIG. 36 is a cross-sectional view taken along a line C—C' of FIG. 35. As illustrated in FIG. 36, the barrier film PM2a is formed on the side walls or bottom of the contact hole (C2) in which the plug P2 is to be formed and the wiring trench (HM2) in which the second-level interconnect is to be formed. The tungsten film CM1 is formed as a capping conductive film on the surface of the first-level interconnect M1. On the peripheral surface of the joint region M901, the tungsten film CM1 remains as a capping conductive film.

Also in this case, the barrier film PM2a and tungsten film CM1 between the plug P2 and interconnect M1 are removed, so that contact resistance therebetween can be reduced and the effects described for Embodiment 1, such as improvement in electromigration resistance, are available.

Thus, when wide joint regions M901,M902 are disposed in the interconnect, the alignment margin of the plug or interconnect patterns to be formed thereover can be maintained.

The present invention made by the present inventors has been described in detail based on various Embodiments. It should however be borne in mind that the present invention is not limited to or by them. It can be modified to an extent not departing from the scope of the invention.

Particularly in Embodiments 1 to 9, the second-level interconnect M2 and connecting portion (plug) P2 were formed using the dual damascene method. They may be formed in respective steps by using the single damascene method. In this case, by removing the capping conductive film on the surface of the first-level interconnect M1 lying under the plug P2 and the barrier film on the bottom of the plug P2, the contact resistance can be reduced and the electromigration resistance can be improved.

The insulating film 22 having the barrier insulating film 501 as shown in Embodiment 5 may be applied to Embodiments 2 to 4 and 6 to 9. Even if misalignment occurs, the barrier property against copper diffusion can be maintained on the bottom of the contact hole C2, making it possible to design the width of the first-level interconnect M1 to be equal to the diameter of the contact hole C2, thereby heightening the density and integration degree of interconnects while maintaining the reliability of the interconnects.

The insulating films 22,24,26 used in Embodiments 2 to 4 may be applied to Embodiments 6 to 9.

In Embodiment 1, etc., an MISFETQn is given as an example of a semiconductor element, but not only a MISFET, but also another element, such as bipolar transistor, may be formed.

In Embodiment 6, the barrier film PM2a is disclosed as a barrier material formed as a discontinuous film on the bottom of the contact hole, which is a joint portion between the first-level interconnect M1 and plug (connecting portion) P2. The barrier material constituted as a discontinuous film may be formed of not only the above-described barrier film PM2a, but also the tungsten film CM1 or both of the barrier film PM2a and tungsten film CM1.

In Embodiment 1, etc, the planarization of the interlevel insulating film is achieved by using a coating type material, but CMP may be employed for it instead. In Embodiment 1, etc., a difference in the etching selectivity ratio of the interlevel insulating films that are stacked is utilized upon processing of a trench. Alternatively, the trench processing may be terminated before it reaches the bottom of the interlevel insulating film, by controlling the dry etching time or monitoring the etching depth.

Advantages available by the typical features of the invention, of aspects of the invention disclosed in the present application, will be described briefly.

In a semiconductor device having a wiring portion having on the surface thereof a capping barrier metal film and a connecting portion formed thereover and having, as the periphery thereof, a conductor layer covered with a barrier metal layer, at least either one of the barrier metal layer or capping barrier metal film is removed from a joint between the wiring portion and the connecting portion so that contact resistance therebetween can be reduced. In addition, the frequency of generation of voids or a disconnection due to electromigration can be reduced. Moreover, the characteristics of the semiconductor device can be improved.

What is claimed:

1. A method of manufacturing a semiconductor device, comprising the steps of:

forming a first interlayer insulating film over a semiconductor substrate;

forming a wiring trench in said first interlayer insulating film;

forming a first barrier metal layer over side walls and a bottom surface of said wiring trench;

forming a wiring layer by forming a first conductor layer over said first barrier metal layer so as to embed said wiring trench with said first conductor layer;

forming a capping barrier metal film over a surface of said first conductor layer;

forming a second interlayer insulating film over said first interlayer insulating film;

forming a connecting hole in said second interlayer insulating film, said connecting hole being formed so as to expose at least a part of said capping barrier metal film;

forming a second barrier metal layer over side walls and a bottom surface of said connecting hole; and forming a plug by forming a second conductor layer over said second barrier metal layer so as to embed said connecting hole with said second conductor layer, wherein said capping barrier metal film is removed in said step of forming said connecting hole, and is removed only at an overlapping portion of said connecting hole with said wiring trench in the step of forming said connecting hole, and wherein the method further comprises at least one of the steps of:

heat treating, in an atmosphere containing hydrogen or ammonia, the surface of said first conductor layer exposed after the step of forming said connecting hole;

generating plasma in an atmosphere containing either one of hydrogen or ammonia and a rare gas, and irradiating said surface of said first conductor layer that is exposed, with the plasma; and sputter etching with a rare gas, said surface of said first conductor layer exposed.

2. A method of manufacturing a semiconductor device according to claim 1, wherein, at the overlapping portion of said wiring trench and said connecting hole, said wiring trench is formed to be greater in area than said connecting hole.

3. A method of manufacturing a semiconductor device according to claim 1, wherein said barrier metal layer is formed from a single layer film of any one of Ta, TaN, TaSiN, W, WN, WSiN, Ti, TiN and TiSiN, or a laminate film obtained by stacking a plurality of any two or greater of Ta, TaN, TaSiN, W, WN, WSiN, Ti, TiN and TiSiN.

4. A method of manufacturing a semiconductor device according to claim 1, wherein said capping barrier metal film is formed from a metal layer comprised mainly of W, WN, WsiN and W, a metal layer comprised mainly of CoWP, CoWB or Co, a single layer film of any one of TiN, TiSiN, Ta, TaN and TaSiN, or a laminate film obtained by stacking any two of said metal layers and single layer films.

5. A method of manufacturing a semiconductor device according to claim 1, wherein said conductor layer is formed from any one of Cu, a metal layer comprised mainly of Cu, Al, a metal layer comprised mainly of Al, Ag and a metal layer comprised mainly of Ag.

6. A method of manufacturing a semiconductor device according to claim 1, wherein said capping barrier metal film is removed so as to expose said first conductor layer.

7. A method of manufacturing a semiconductor device according to claim 1, wherein said second conductor layer is formed in direct contact with said first conductor layer.

8. A method of manufacturing a semiconductor device according to claim 1, wherein said capping barrier metal film is formed by selective growth or preferential growth.

9. A method of manufacturing a semiconductor device, comprising the steps of:

(a) forming a first insulating film over a semiconductor substrate;

(b) forming a first wiring layer in said first insulating film;

(c) forming a conductive capping layer over a surface of said first wiring layer by selective growth or preferential growth;

(d) forming a second insulating film over said conductive capping layer and first insulating film;

(e) selectively removing said second insulating film to form a wiring trench and a connecting hole in said second insulating firm, wherein said connecting hole extends from the bottom of said wiring trench toward said conductive capping layer (f) removing said conductive capping layer formed over the bottom of said connecting hole;

(g) forming a barrier metal film over side walls and the bottom of said wiring trench and side walls and the bottom of said connecting hole; and (h) forming a conductor layer in said wiring trench and said connecting hole, and wherein the method further comprises at least one of the steps of:

heat treating, in an atmosphere containing hydrogen or ammonia, the surface of said first wiring layer exposed after the step of forming said connecting hole;

generating plasma in an atmosphere containing either one of hydrogen or ammonia and a rare gas, and irradiating said surface of said first wiring layer, that is exposed, with the plasma; and sputter etching with a rare gas, said surface of said first wiring layer exposed.

10. A method of manufacturing a semiconductor device according to claim 9, further comprising, between said steps (g) and (h), removing said barrier metal film from the bottom of said connecting hole.

11. A method of manufacturing a semiconductor device according to claim 10, wherein in said barrier metal film formation step, said barrier metal film is formed to be thicker at the bottom of said wiring trench than at the bottom of said connecting hole.

12. A method of manufacturing a semiconductor device according to claim 10, wherein anisotropic etching is employed for the removal of said barrier metal film from the bottom of said connecting hole.

13. A method of manufacturing a semiconductor device according to claim 9, wherein said barrier metal layer is formed from a single layer film of any one of Ta, TaN, TaSiN, W, WN, WSiN, Ti, TiN and TiSiN, or a laminate film obtained by stacking a plurality of any two or greater of Ta, TaN, TaSiN, W, WN, WSiN, Ti, TiN and TiSiN.

14. A method of manufacturing a semiconductor device according to claim 9, wherein said first wiring layer and said conductor layer are formed of a metal layer comprised mainly of copper.

15. A method of manufacturing a semiconductor device according to claim 9, wherein said conductive capping layer is formed from a metal layer comprised mainly of W, WN, WSiN, and W, a metal layer comprised mainly of CoWP, CoWB or Co, a single layer film of any one of TiN, TiSiN, Ta, TaN and TaSiN, or a laminate film obtained by stacking any two of said metal layers and single layer films.

16. A method of manufacturing a semiconductor device according to claim 9, wherein said first and second insulating films are formed of Si and C; Si, C and O; Si, O and F; C and H; or Si, O, C and H, or, in addition, is porous.

17. A method of manufacturing a semiconductor device, comprising the steps of:

forming a first interlayer insulating film over a semiconductor substrate;

forming a wiring trench in said interlayer insulating film;

forming a first barrier metal layer over side walls and a bottom surface of said wiring trench;

forming a wiring layer by forming a first conductor layer over said first barrier metal layer so as to embed said wiring trench with said first conductor layer, forming a capping barrier metal film over a surface of said first conductor layer;

forming a second interlayer insulating film over said first interlayer insulating film;

forming a connecting hole in said second interlayer insulating film, said connecting hole being formed so as to expose at least a part of said capping barrier metal film;

forming a second barrier metal layer over side walls and a bottom surface of said connecting hole;

removing said second barrier metal layer from the bottom surface of said connecting hole; and forming a plug by forming a second conductor layer over said second barrier metal layer so as to embed said connecting hole with said second conductor layer, wherein said capping barrier metal film is removed in said step of forming said connecting hole, and is removed only at an overlapping portion of said connecting hole with said wiring trench in the step of forming said connecting hole, and wherein the method further comprises at least one of the steps of:

heat treating, In an atmosphere containing hydrogen or ammonia, the surface of said first conductor layer exposed after the step of removing said second barrier metal layer;

generating plasma in an atmosphere containing either hydrogen or ammonia and a rare gas, and irradiating said exposed surface of said first conductor layer with the plasma; and cleaning said exposed surface of said first conductor layer with a hydrogen-fluoride-containing solution.

* * * * *